US011251188B2

(12) United States Patent
Kim et al.

(10) Patent No.: US 11,251,188 B2
(45) Date of Patent: Feb. 15, 2022

(54) SEMICONDUCTOR MEMORY DEVICE AND A METHOD OF FABRICATING THE SAME

(71) Applicant: SAMSUNG ELECTRONICS CO., LTD., Suwon-si (KR)

(72) Inventors: Seok-Hyun Kim, Incheon (KR); Joon Young Kang, Suwon-si (KR); Youngjun Kim, Osan-si (KR); Jinhyung Park, Bucheon-si (KR); Ho-Ju Song, Seongnam-si (KR); Sang-Jun Lee, Incheon (KR); Hyeran Lee, Hwaseong-si (KR); Bong-Soo Kim, Yongin-si (KR); Sungwoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/990,305

(22) Filed: Aug. 11, 2020

(65) Prior Publication Data

US 2021/0125998 A1    Apr. 29, 2021

(30) Foreign Application Priority Data

Oct. 24, 2019  (KR) .......................... 10-2019-0133002

(51) Int. Cl.
*H01L 27/088*    (2006.01)
*H01L 21/00*    (2006.01)
*H01L 27/108*    (2006.01)

(52) U.S. Cl.
CPC .. *H01L 27/10897* (2013.01); *H01L 27/10814* (2013.01); *H01L 27/10823* (2013.01); *H01L 27/10885* (2013.01); *H01L 27/10888* (2013.01); *H01L 27/10894* (2013.01)

(58) Field of Classification Search
CPC ................................... H01L 27/10888
USPC ................. 257/395–397; 438/421, 424
See application file for complete search history.

(56) References Cited

U.S. PATENT DOCUMENTS

| 6,743,693 | B2 | 6/2004 | Fujiishi |
| 8,324,049 | B2 | 12/2012 | Kim et al. |
| 8,637,364 | B2 * | 1/2014 | Ueda ................. H01L 21/31116 438/241 |

(Continued)

FOREIGN PATENT DOCUMENTS

| KR | 10-2008-0088679 | 10/2008 |
| KR | 10-2018-0112898 | 10/2018 |

*Primary Examiner* — Calvin Lee
(74) *Attorney, Agent, or Firm* — F. Chau & Associates, LLC

(57) ABSTRACT

A semiconductor memory device including: a substrate including a cell array region and a boundary region; a first recess region at an upper portion of the substrate in the cell array region; a first bit line extending onto the boundary region and crossing the first recess region; a bit line contact in the first recess region and contacting the first bit line; a second bit line spaced apart from the first recess region and adjacent to the first bit line, the second bit line crossing the cell array region and the boundary region; a cell buried insulation pattern between a side surface of the first bit line contact and an inner wall of the first recess region; and a boundary buried insulation pattern covering sidewalls of the first bit line and the second bit line in the boundary region and including a same material as the cell buried insulation pattern.

20 Claims, 53 Drawing Sheets

(56) References Cited

U.S. PATENT DOCUMENTS

| | | | |
|---|---|---|---|
| 9,117,696 B2* | 8/2015 | Kim | G11C 11/4099 |
| 9,171,889 B2 | 10/2015 | Yi et al. | |
| 9,184,091 B2* | 11/2015 | Song | H01L 27/10885 |
| 9,263,452 B2 | 2/2016 | Jin | |
| 9,337,203 B2* | 5/2016 | Hwang | H01L 27/10897 |
| | | | 438/381 |
| 9,349,633 B2* | 5/2016 | Kim | H01L 27/10823 |
| 9,373,625 B2* | 6/2016 | Kim | H01L 27/10876 |
| | | | 257/330 |
| 9,520,348 B2* | 12/2016 | Choi | H01L 21/76897 |
| | | | 257/774 |
| 9,543,202 B2* | 1/2017 | Koo | H01L 21/76895 |
| 9,824,726 B2* | 11/2017 | Han | H01L 21/764 |
| 10,103,101 B2 | 10/2018 | Park et al. | |
| 10,373,960 B2* | 8/2019 | Kim | H01L 27/10876 |
| 2011/0309435 A1 | 12/2011 | Hwang et al. | |
| 2018/0286870 A1 | 10/2018 | Kim et al. | |

\* cited by examiner

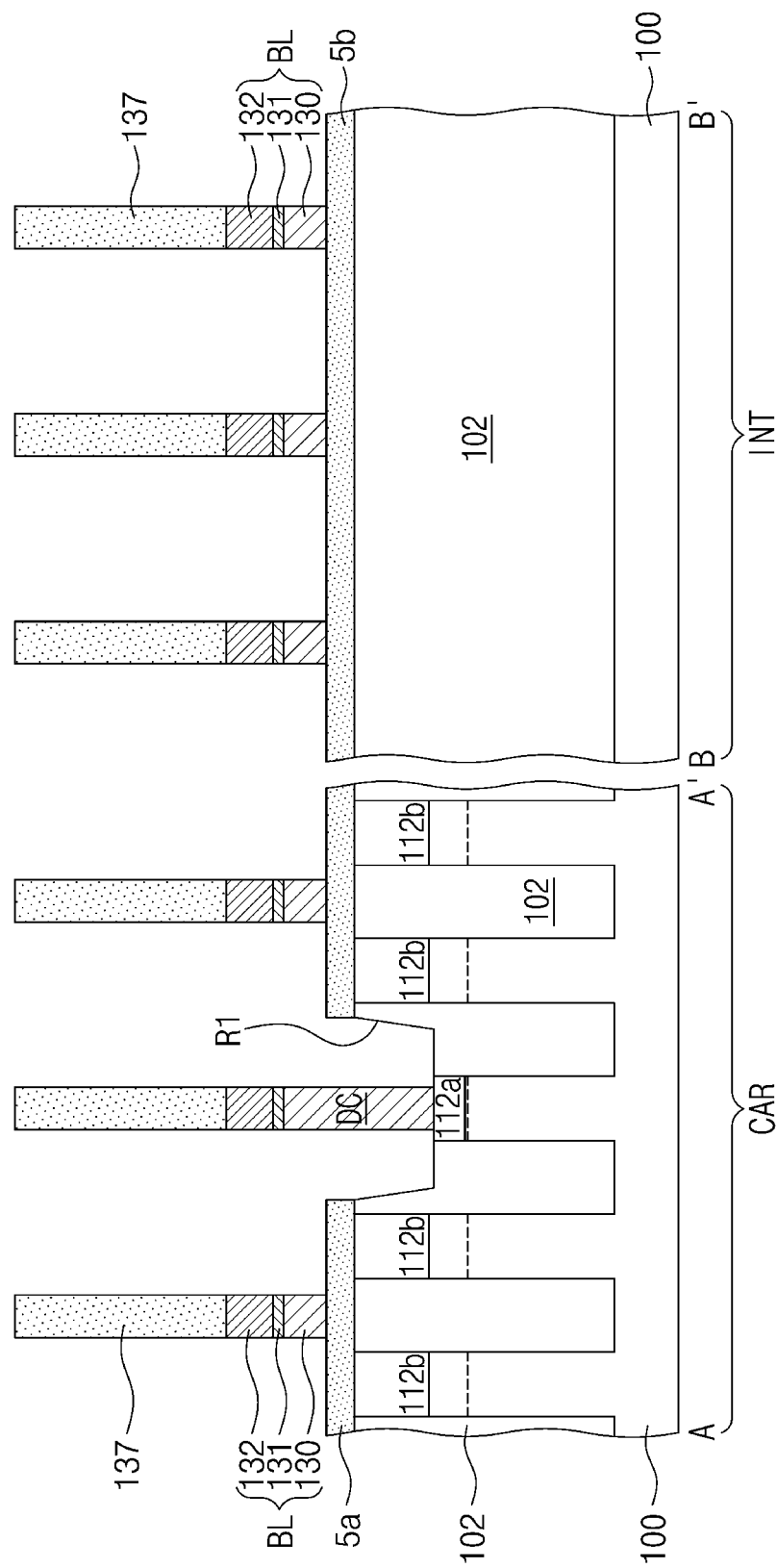

SEMICONDUCTOR MEMORY DEVICE AND A METHOD OF FABRICATING THE SAME

CROSS-REFERENCE TO RELATED APPLICATION

This U.S. non-provisional patent application claims priority under 35 U.S.C. § 119 to Korean. Patent Application No. 10-2019-0133002, filed on. Oct. 24, 2019, the disclosure of which is incorporated by reference herein in its entirety.

Technical Field

The present inventive concept relates to a semiconductor memory device and a method of fabricating the same.

Discussion of Related Art

A semiconductor memory device is widely used in various electronic industries as a key component due to its characteristics such as miniaturization, multi-functionality, and/or low manufacturing costs. However, as the electronic industry continues to develop, highly integrated semiconductor memory devices are being manufacture. In a highly integrated semiconductor memory device, a line width of each of its patterns is miniaturized. However, forming highly integrated semiconductor memory devices with miniaturized patterns requires a novel exposure technique and/or an expensive exposure technique. Thus, research is being conducted on novel integration techniques.

SUMMARY

In an exemplary embodiment of the inventive concept, a semiconductor memory device includes a substrate including a cell array region and a boundary region; a first recess region disposed at an upper portion of the substrate in the cell array region; a first bit line extending onto the boundary region and crossing the first recess region; a bit line contact disposed in the first recess region and contacting the first bit line; a second bit line spaced apart from the first recess region and adjacent to the first bit line, the second bit line crossing the cell array region and the boundary region; a cell buried insulation pattern interposed between a side surface of the bit line contract and an inner wall of the first recess region; and a boundary buried insulation pattern covering sidewalls of the first bit line and the second bit line in the boundary region and including a same material as the cell buried insulation pattern.

In an exemplary embodiment of the inventive concept, a semiconductor memory device includes: a substrate including a cell array region and a boundary region; a first recess region disposed at an upper portion of the substrate in the cell array region; a first bit line extending onto the boundary region and crossing the first recess region; a bit line contact disposed in the first recess region and contacting the first bit line; a second bit line spaced apart from the first recess region and adjacent to the first bit line, the second bit line crossing the cell array region and the boundary region; a cell buried insulation pattern interposed between a side surface of the bit line contact and an inner wall of the first recess region; and a bit line spacer covering a sidewall of the first bit line in the cell array region; a boundary buried insulation pattern covering sidewalls of the first bit line and the second bit line in the boundary region, including a second recess region, and including a same material as the cell buried insulation pattern; and a residual spacer pattern filling the second recess region, wherein a top surface of the residual spacer pattern is coplanar with a top surface of the boundary buried insulation pattern.

In an exemplary embodiment of the inventive concept, a semiconductor memory device including: a substrate including a cell array region and a boundary region; a first recess region disposed at an upper portion of the substrate in the cell array region; a first bit line extending onto the boundary region and crossing the first recess region; a second bit line spaced apart from the first recess region and adjacent to the first bit line, the second bit line crossing the cell array region and the boundary region; a cell buried insulation pattern interposed between a lower side surface of the first bit line and an inner wall of the first recess region; first, second and third spacers sequentially covering a sidewall of the first bit line in the cell array region, the third spacer including a material different from the second spacer; a boundary buried insulation pattern covering sidewalls of the first bit line and the second bit line in the boundary region, including a second recess region, and including a same material as the cell buried insulation pattern; and a first residual spacer pattern disposed in the second recess region and including a same material as the third spacer.

In an exemplary embodiment of the inventive concept, a method of fabricating a semiconductor memory device includes: receiving a substrate including a cell array region and a boundary region; forming a first recess region on the substrate in the cell array region; forming a bit line contact in the first recess region, a first bit line contacting the bit line contact, and a second bit line spaced apart from the first bit line and the first recess region, wherein each of the first bit line and the second bit line extends onto the boundary region; filling the first recess region with a cell buried insulation pattern; forming a boundary buried insulation pattern including a second recess region, wherein the boundary buried insulation patter contacts sidewalls of the first bit line and the second bit line in the boundary region; covering a sidewall of the first bit line in the cell array region with a bit line spacer; and filling the second recess region with a residual spacer pattern, wherein the residual spacer pattern is formed of a portion of the bit line spacer.

BRIEF DESCRIPTION OF THE FIGURES

The above and other features of the inventive concept will become more apparent by describing in detail exemplary embodiments of the inventive concept together with the accompanying drawings. In the drawings:

FIGS. 2B, 3B, 4B, 5B, 6B, 7B, 8B, 9B, 10B, 11B, 12B, 13B, 14B and 15B are cross-sectional views taken along line A-A' and line B-B' of FIGS. 2A to 15A according to exemplary embodiments of the inventive concept;

DETAILED DESCRIPTION OF THE EMBODIMENTS

Hereinafter, exemplary embodiments of the inventive concept will be described in more detail with reference to the accompanying drawings.

Figure 1A:
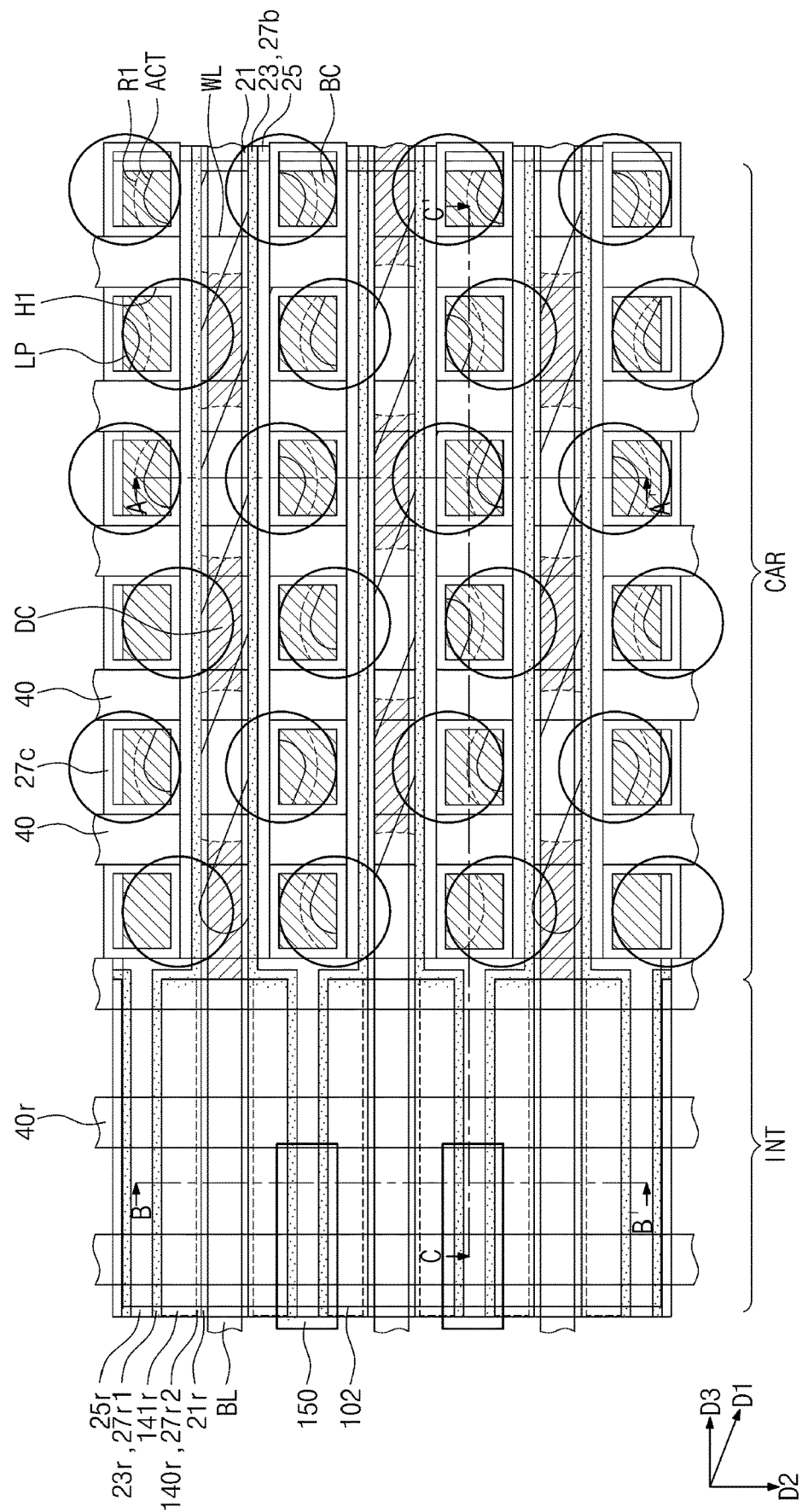
FIG. 1 is a plan view illustrating a semiconductor memory device according to exemplary embodiments of the inventive concept.
FIG. 1B is a cross-sectional view taken along line A-A' and line B-B' of FIG. 1A according to exemplary embodiments of the inventive concept.
FIG. 1C is a cross-sectional view taken along line C-C' of FIG. 1A according to exemplary embodiments of the inventive concept.
Figure 1B:
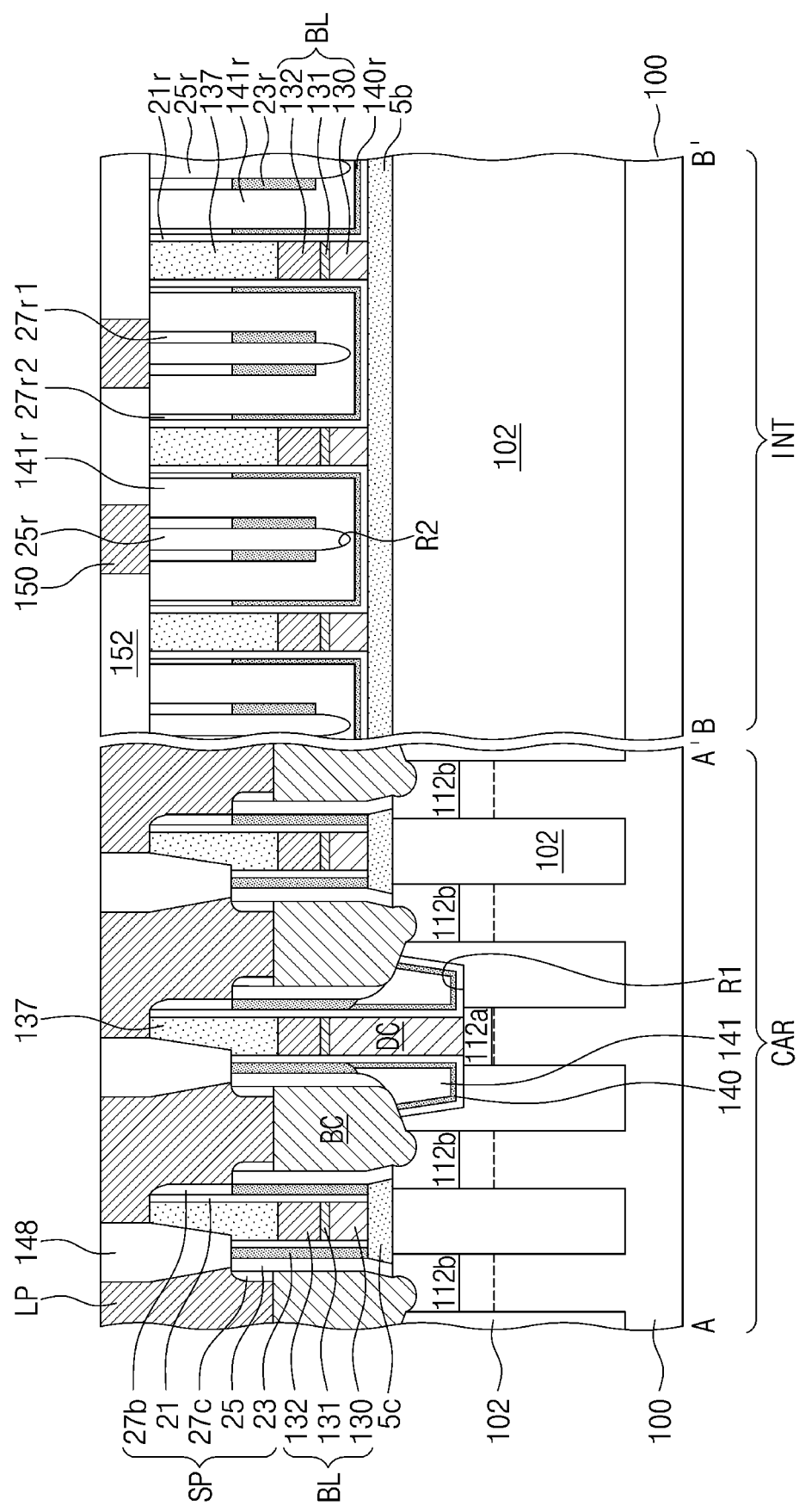
Figure 1C:
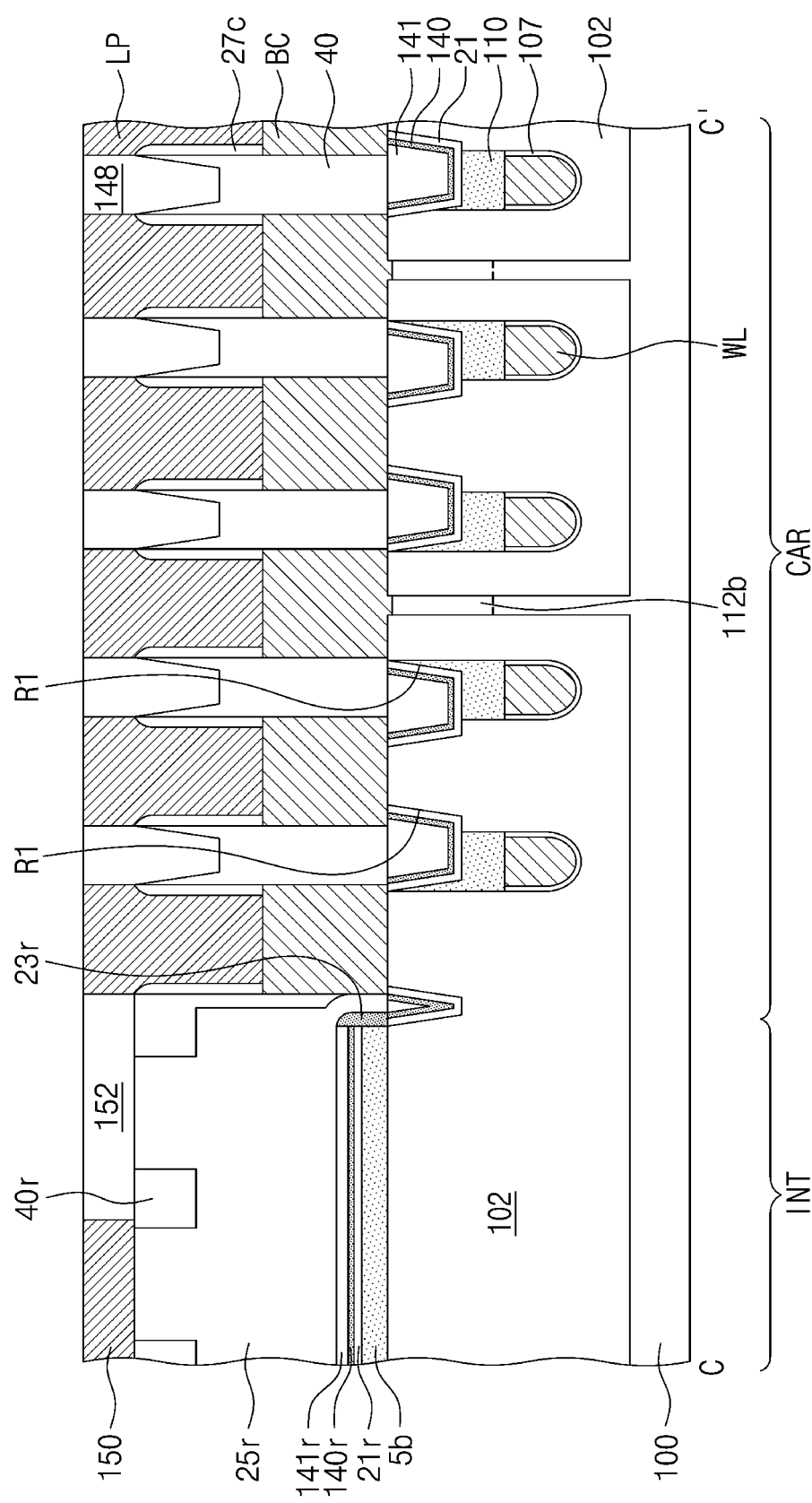

FIG. 1A is a plan view illustrating a semiconductor memory device according to exemplary embodiments of the inventive concept. FIG. 1B is a cross-sectional view taken along line A-A' and line B-B' of FIG. 1 A according to exemplary embodiments of the inventive concept. FIG. 1C is a cross-sectional view taken along line C-C' of FIG. 1A according to exemplary embodiments of the inventive concept.

Referring to FIGS. A to 1C, a semiconductor substrate 100 (hereinafter, referred to as a substrate) is provided. The substrate 100 may include a cell array region CAR and a boundary region INT adjacent thereto. The boundary region INT may be disposed between the cell array region CAR and a peripheral circuit region. As device separation patterns 102 are disposed on the substrate 100 in the cell array region CAR, activation parts ACT may be defined. Each of the activation parts ACT may have an isolated shape. Each of the activation parts ACT may have a bar shape that is elongated in a first direction D1 in a plan view. In a plan view, the activation parts ACT may correspond to portions of the substrate 100, which are surrounded by the device separation patterns 102, respectively. The device separation patterns 102 may be disposed in the boundary region INT.

The substrate 100 may include a semiconductor material. For example, the substrate 100 may be a silicon substrate, a germanium substrate, or a silicon-germanium substrate. Each of the device, separation, patterns 102 may include an oxide (e.g., a silicon oxide), a nitride (e.g., a silicon nitride), and/or an oxynitride (e.g., a silicon oxynitride). The activation parts ACT may be arranged in parallel to each other in the first direction D1, and an end of each of the activation parts ACT may be arranged adjacent to a center of another activation part adjacent thereto.

In the cell array region CAR, word lines WL may cross the activation parts ACT. The word lines WL may be disposed in grooves defined in the device separation patterns 102 and the activation parts ACT. For example, the word lines WL may be located close to the substrate 100. The word lines WL may be parallel to a second direction D2 crossing the first direction D1. The word lines WL may be made of a conductive material. A gate dielectric layer 107 may be disposed between each of the word lines WL and an inner surface of each of the grooves. In other words, the gate dielectric layer 107 may be disposed between each of the word lines WL and the device separation pattern 102. Each of the grooves may have a bottom that is relatively deep in the device separation patterns 102 and relatively shallow in the activation parts ACT. The gate dielectric layer 107 may include at least one of a thermal oxide, a silicon nitride, a silicon oxynitride, and a high K dielectric material. Each of the word lines WL may have a curved bottom surface. The bottom surface of the word line WL on the device separation pattern 102 may be lower than that of the word line WL on the activation part ACT.

A first doped region 112a may be disposed in each of the activation parts ACT between one pair of word lines WL, and one pair of second doped regions 112b may be disposed in both edge regions of the activation parts ACT, respectively. The first and second doped regions 112a and 112b may be doped with, an n-type impurity. The first doped region 112a may correspond to a common drain region, and the second doped regions 112b may correspond to a source region. Each of the word lines WL and the first and second doped regions 112a and 112b adjacent thereto may provide a transistor. As the word lines WL are disposed in the grooves, a channel depth of a channel region below the word lines WL may increase in a restricted flat area. Thus, for example, a short-channel effect may be minimized.

Each of the word lines WL may have a top surface lower than that of each of the activation parts ACT. A word line capping pattern 110 may be disposed on each of the word lines WL. Each of the word line capping patterns 110 may have a line shape extending in a longitudinal direction of the word lines WL and cover the entire top surface of each of the word lines WL. The word line capping patterns 110 may fill the grooves above the word lines WL. The word line capping patterns 110 may be provided as, e.g., a silicon nitride layer.

A lower interlayer insulation pattern 5c may be disposed on the substrate 100. The lower interlayer insulation pattern 5c may be provided as at least one single layer or multi-layer selected from the group consisting of a silicon oxide layer, a silicon nitride layer, and a silicon oxynitride layer.

An upper portion of each of the substrate 100, the device separation pattern 102, and the word line capping pattern 110 may be partially recessed to provide a first recess region R1. The first recess region R1 may have a mesh shape on a plan view.

Bit lines BL may be disposed on the lower interlayer insulation pattern 5c. The bit lines BL may cross over the word line capping pattern 110 and the word lines WL. As illustrated in FIG. 1A, the bit lines BL may be parallel to a third direction D3 crossing the first and second directions D1 and D2. For example, the bit lines BL may extend along the third direction D3 and be spaced apart from one another in the second direction D2. The bit lines BL may include a bit line polysilicon pattern 130, a bit line ohmic pattern 131, and a bit line metal containing pattern 132, which are sequentially laminated. The bit line polysilicon pattern 130 may include polysilicon into which impurities are doped or not doped. The bit line ohmic pattern 131 may include a metal silicide layer. The bit line metal containing pattern 132 may include at least one of metal (e.g., tungsten, titanium, tantalum etc.) and a conductive metal nitride (e.g., a titanium nitride, a tantalum nitride, and a tungsten nitride). A bit line capping pattern 137 may be disposed on each of the bit lines BL. The bit line capping patterns 137 may be made of an insulating material. For example, the bit line capping patterns 137 may include a nitride (e.g., silicon nitride) and/or an oxynitride (e.g., silicon oxynitride).

Bit line contacts DC may be disposed in the first recess regions R1 crossing below the bit lines BL, respectively. The bit line contacts DC may include polysilicon into which impurities are doped. The bit line contact DC may electrically connect the first doped region 112a and the bit line BL. For example, the bit line contact DC may be an extended bit line polysilicon pattern 130.

A cell buried insulation pattern 141 may be disposed in the first recess region R1 in which the bit line contact DC is not disposed. The cell buried insulation pattern 141 may be provided as at least one single layer or multi-layer selected from the group consisting of a silicon oxide layer, a silicon nitride layer, and a silicon oxynitride layer. A cell insulation liner 140 may be disposed between the cell buried insulation pattern 141 and an inner wall of the first recess region R1 and between the cell buried insulation pattern 141 and the bit line contact DC. The cell insulation liner 140 may have an upper end positioned equal to or higher than an upper end of the cell buried insulation pattern 141. The cell insulation liner 140 may be made of an insulating material having an etch selectivity with the cell buried insulation pattern 141. For example, the cell buried insulation pattern 141 may be provided as a silicon nitride layer, and the cell insulation liner 140 may be provided as a silicon oxide layer.

Storage node contacts BC may be disposed between one pair of bit lines BL, which are adjacent to each other. The storage node contacts BC may be spaced apart from each other. The storage node contacts BC may include a polysilicon into which impurities are doped or not doped. An insulation fence 40 may be disposed between the storage node contacts BC between the bit lines BL. The insulation fence 40 may be provided as an insulation layer such as, e.g., a silicon nitride layer, a silicon oxide layer, or a silicon oxynitride layer. The storage node contacts BC and the insulation fence 40 may be alternately and repeatedly arranged along the bit line BL at one side of one bit line BL. The insulation fence 40 may have an upper end height greater than that of each of the storage node contacts BC. In other words, the insulation fence 40 may protrude above the storage node contacts BC.

A landing pad LP is disposed on the storage node contact BC. The landing pad LP may be made of a metal containing material such as tungsten. The landing pad LP may have an upper portion covering a top surface of the bit line capping pattern 137 and having a width greater than that of the storage node contact BC. The landing pad LP may have a center that is shifted in the second direction D2 from a center of the storage node contact BC. The bit line BL may have a portion that vertically overlaps the land pad LP.

A storage node ohmic layer and a diffusion prevention pattern may be disposed between the storage node contact BC and the landing pad LP. The storage node ohmic layer may include metal silicide. The diffusion prevention pattern may include a metal nitride such as a titanium nitride layer and a tantalum nitride layer.

A first spacer 21, a second spacer 23, and a third spacer 25 may be disposed between the bit line BL and the storage node contact BC. The first spacer 21 may cover a sidewall of the bit line BL and a sidewall of the bit line capping pattern 137. The first spacer 21 may extend to be disposed between the cell insulation liner 140 and the bit line contact DC, between the cell insulation liner 140 and the inner wall of the first recess region R1, and between the cell insulation liner 140 and a bottom surface of the first recess region R1. The second spacer 23 may be disposed between the first spacer 21 and the third spacer 25. The second spacer 23 may have a lower end contacting a top surface of the lower interlayer insulation pattern 5c, an upper end of the cell insulation liner 140, and an upper end of the cell buried insulation pattern 141. The third spacer 25 may have a lower end covering a side surface of the lower interlayer insulation pattern 5c and contacting a top surface of the cell buried insulation pattern 141. The second spacer 23 may include an insulating material having an etch selectivity with respect to the first spacer 21 and the third spacer 25. For example, the second spacer 23 may be provided as a silicon oxide layer, and each of the first and third spacers 21 and 25 may be provided as a silicon oxide layer. Alternatively, the second spacer 23 may be an air-gap region.

Each of the second and third spacers 23 and 25 may have a top surface lower than that of the first spacer 21 to expose a sidewall of the first spacer 21. A fourth spacer 27b may be disposed between an upper sidewall of the first spacer 21 and the landing pad LP. The fourth spacer 27b may contact the top surface of the second spacer 23. The storage node contact BC may have a top surface lower than that of the third spacer 25 to expose an upper sidewall of the third spacer 25. A fifth spacer 27c may be disposed between an upper sidewall of the third spacer 25 and the landing pad LP. The fifth spacer 27c may have a square shape as shown in FIG. 1A. The fourth spacer 27b and the fifth spacer 27c may include the same material. The first to fifth spacers 21 23, 25, 27b. and 27c may constitute a bit line spacer SP.

The landing pads LP may be spaced apart from each other by a landing pad separation pattern 148. The landing pad separation pattern 148 may extend into the bit line capping pattern 137 and contact the top surface of the second spacer 23. The landing pad separation pattern 148 may include at least one of, e.g., a silicon nitride layer, a silicon oxide layer, and a silicon oxynitride layer. The landing pad separation pattern 148 may extend into the insulation fence 40. For example, when the landing pad separation pattern 148 is disposed in the insulation fence 40, a bottom of the landing pad separation pattern 148 may be disposed above the storage node contact BC.

The device separation pattern 102 in the boundary region INT may be covered by a boundary etch stop pattern 5b. The boundary etch stop pattern 5b may have the same material and the same structure as the lower interlayer insulation pattern 5c. The bit lines BL may have ends extending onto the boundary region INT to contact the boundary etch stop pattern 5b. In the boundary region INT, a side surface of the bit line BL, a side surface of the bit line capping pattern 137, and a top surface of the boundary etch stop pattern 5b may be covered by a first residual spacer pattern 21r. The first residual spacer pattern 21r and the first spacer 21 may be connected to each other in a plan view and include the same material.

The first residual spacer pattern 21r may contact a boundary insulation liner 140r. The boundary insulation liner 140r may include the same material as the cell insulation liner 140. The boundary insulation liner 140r may contact a boundary buried insulation pattern 141r. The boundary buried insulation pattern 141r may include the same material as the cell buried insulation pattern 141. The boundary insulation liner 140r and the boundary buried insulation pattern 141r may be adjacent to sidewalls of the neighboring bit lines BL and sidewalls of the neighboring bit line capping patterns 137 and cover the boundary etch stop pattern 5b disposed therebetween. As shown in FIG. 1C, the boundary etch stop pattern 5b, the first residual spacer pattern 21a, the boundary insulation liner 140r and the boundary buried insulation pattern 141r may be thrilled in sequence. A second recess region R2 is provided at a center of the boundary insulation liner 140r. A third residual spacer pattern 25r may be disposed in the second recess region R2. A second residual spacer pattern 23r may be disposed between the third residual spacer pattern 25r and the boundary buried insulation pattern 141r. The second residual spacer pattern 23r may include the same material as the second spacer 23. The third residual spacer pattern 25r may include the same material as the third spacer 25.

Each of the first residual spacer pattern 21r, the boundary buried insulation pattern 141r, and the third residual spacer pattern 25r may have a top surface having the same height as that of the bit line capping pattern 137. Each of the boundary insulation liner 140r and the second residual spacer pattern 23r may have a top surface positioned lower than that of the bit line capping pattern 137. The boundary insulation liner 140r may expose upper sidewalk of the first residual spacer pattern 21r and the boundary buried insulation pattern 141r, which are adjacent thereto. The second residual spacer pattern 23r may directly contact edges of the boundary etch stop pattern 5b, the first residual spacer pattern 21a, the boundary insulation liner 140r and the boundary buried insulation pattern 141r, as shown in FIG. 1C. A fourth residual spacer pattern 27r1 may be, disposed between the third residual spacer pattern 25r and the boundary buried insulation pattern 141r.

The second residual spacer pattern 23r may expose upper sidewalls of the third residual spacer pattern 25r and the boundary buried insulation pattern 141r, which are adjacent to the second residual spacer pattern 23r. A fifth residual spacer pattern 27r2 may be disposed between upper sidewalls of the boundary buried insulation pattern 141r and the first residual spacer pattern 21r. The fourth and fifth residual spacer patterns 27r1 and 27r2 may include the same material as the fourth and fifth spacers 27b and 27c. The fourth and fifth residual spacer patterns 27r1 and 27r2 may have upper surfaces coplanar with the top surface of the bit line capping pattern 137.

In a cross-sectional view of FIG. 1C, the second residual spacer pattern 23r may cover sidewalls of the boundary etch stop pattern 5b, the first residual spacer pattern 21r, the boundary insulation liner 140r, and the boundary buried insulation pattern 141r. The third residual spacer pattern 25r may have a portion covering a sidewall of the second residual spacer pattern 23r. For example, the portion of the third residual spacer pattern 25r covering the sidewall of the second residual spacer pattern 23r may contact the cell buried insulation pattern 141 adjacent to the second residual spacer pattern 23r. A boundary insulation fence 40r may be disposed on the third residual spacer pattern 25r. The boundary insulation fence 40r may include the same material as the insulation fence 40. The boundary insulation fence 40r may be disposed in the third residual spacer pattern 25r and have a top surface coplanar with a top surface of the third residual spacer pattern 25r.

In a plan view, the first spacer 21 and the first residual spacer pattern 21r may be connected in an integrated (or unified) form. The second spacer 23 and the second residual spacer pattern 23r may be connected in an integrated manner. The third spacer 25 and the third residual spacer pattern 25r may be connected in an integrated manner. The fourth and fifth spacers 27b and 27c may be connected to the fourth residual spacer pattern 27r1 in an integrated manner.

An upper interlayer insulation pattern 152 may be disposed on the bit line capping patterns 137 in the boundary region INT. The upper interlayer insulation pattern 152 may also be disposed on the third residual spacer pattern 25r and the boundary insulation fence 40 in the boundary region INT. A boundary line 150 may be disposed in the upper interlayer insulation pattern 152. The boundary line 150 may be connected to ends of the bit lines BL or circuits disposed at a peripheral circuit. The boundary lines 150 may include the same material as the landing pad LP.

In an exemplary embodiment of the inventive concept, spaces between the bit lines BL are buried by the boundary buried insulation pattern 141r, the first to fifth residual spacer patterns 21r, 23r, 25r, 27r1, and 27r2, etc. The first to fifth residual spacer patterns 21r, 23r, 25r, 27r1, and 27r2 may constitute a portion of the bit line spacer SP. Thus, a bridge between the boundary line 150 and the storage node contact BC or the bit line contact DC, which is adjacent thereto, may be prevented. Thus, a malfunction of a semiconductor memory device may be prevented to enhance reliability.

FIGS. 2A to 15A are plan views sequentially illustrating a process of fabricating a semiconductor memory device having the plan view of FIG. 1A according to exemplary embodiments of the inventive concept. FIGS. 2B to 15B are cross-sectional views taken along line A-A' and line B-B' of FIGS. 2A to 15A according to exemplary embodiments of the inventive concept. FIGS. 2C to 15C are cross-sectional views taken along line C-C' of FIGS. 2A to 15A according to exemplary embodiments of the inventive concept.

Figure 2A:
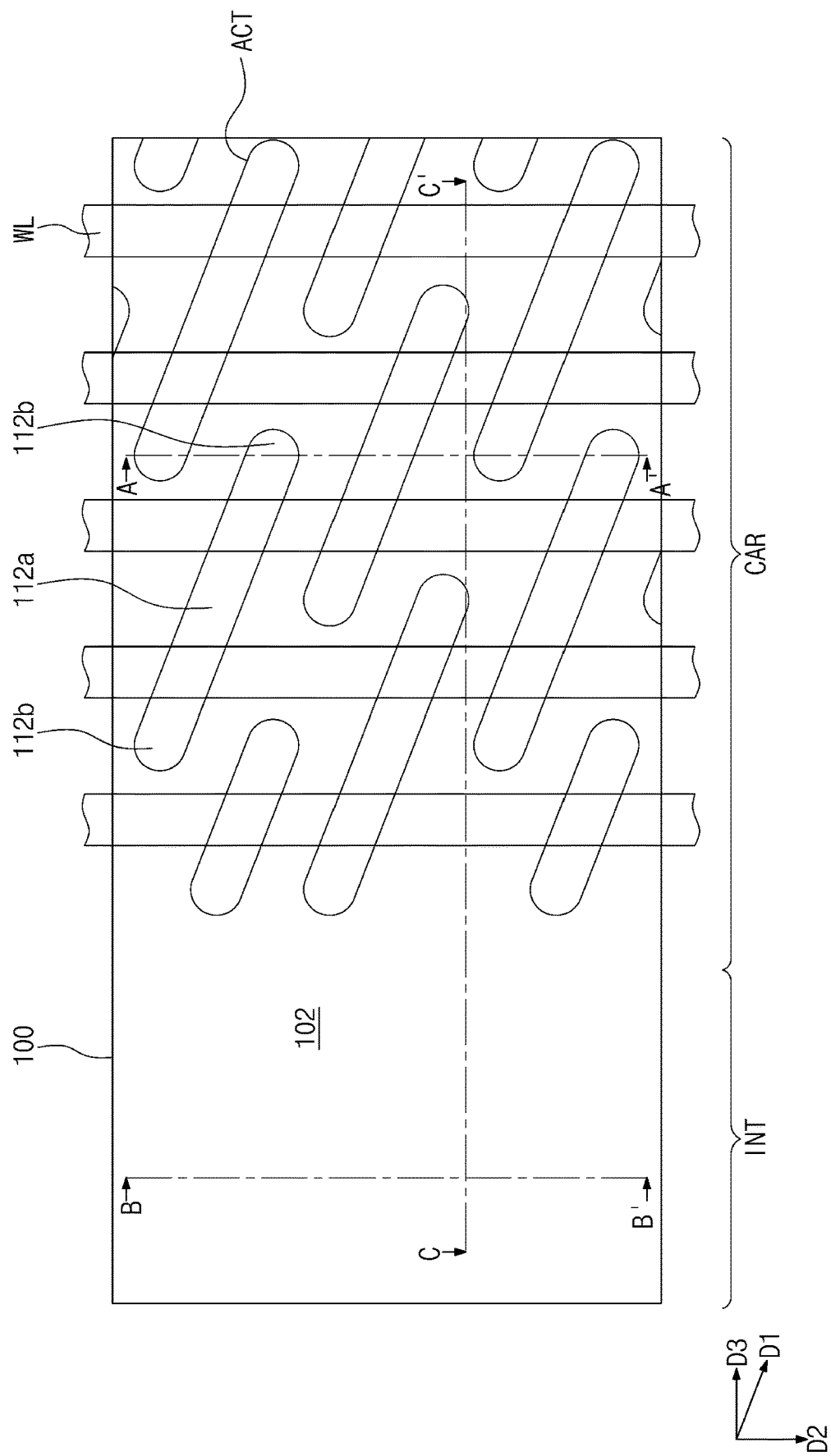
FIGS. 2A, 3A, 4A, 5A, 6A, 7A, 8A, 9A, 10A, 11A, 12A, 13A, 14A and 15A are plan views sequentially illustrating a process of fabricating a semiconductor memory device having the plan view of FIG. 1A according to exemplary embodiments of the inventive concept.
Figure 2B:
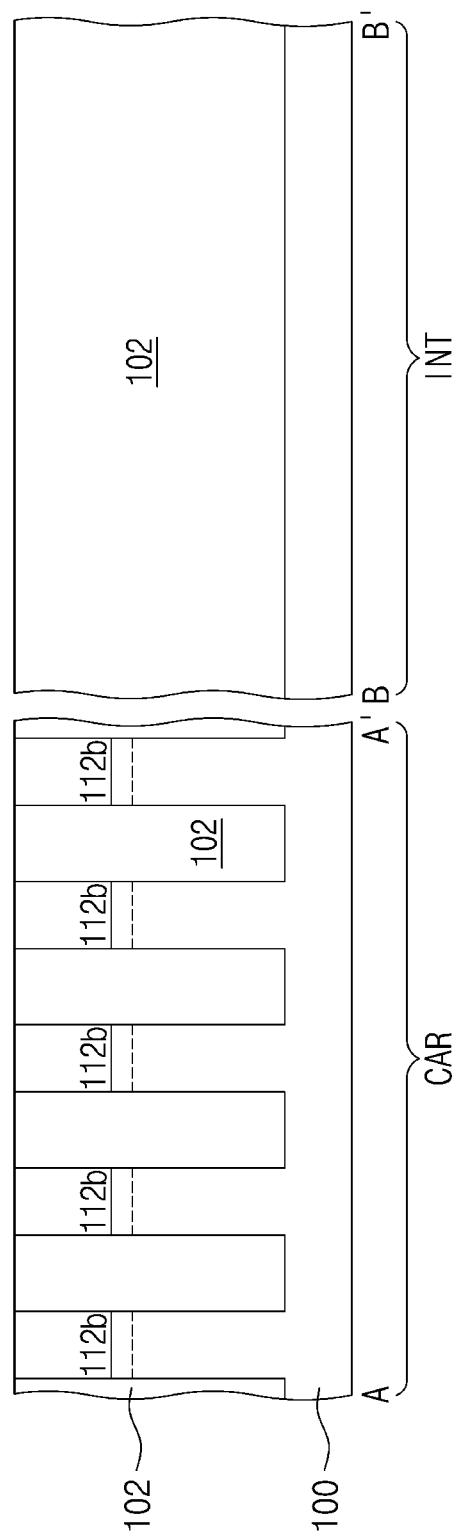
Figure 2C:
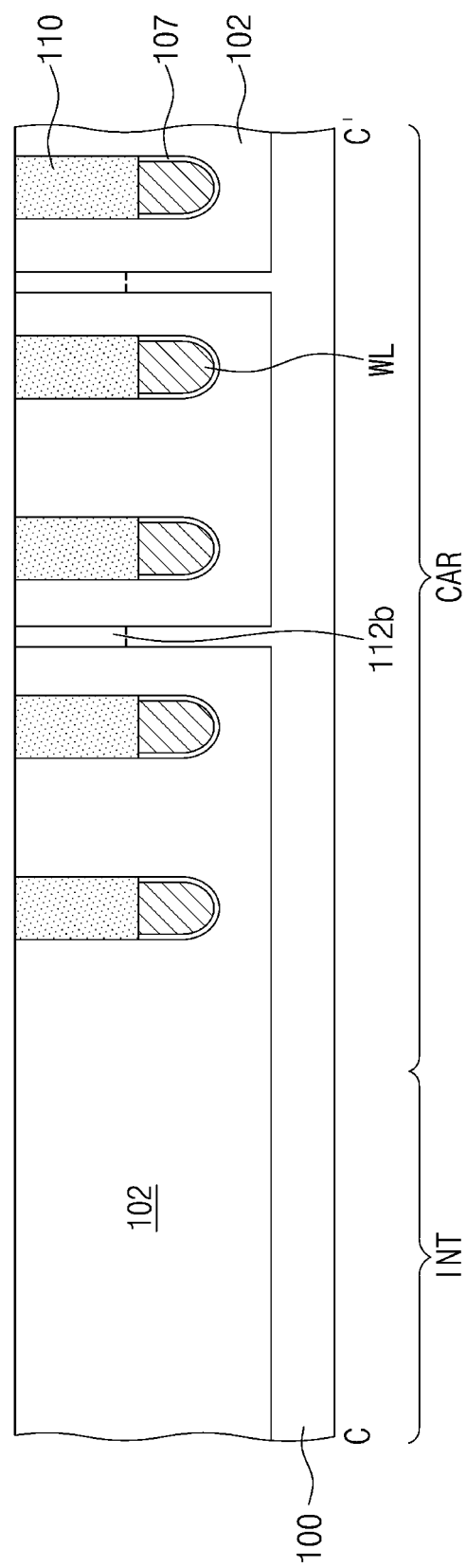
FIGS. 2C, 3C, 4C, 5C, 6C, 7C, 8C, 9C, 10C, 11C, 12C, 13C, 14C and 15C are cross-sectional views taken along line C-C of FIGS. 2A to 15A according to exemplary embodiments of the inventive concept.

Referring to FIGS. 2A to 2C, a substrate 100 having a cell array region CAR and a boundary region INT is provided. Device separation patterns 102 may be formed on the substrate 100 to define activation parts ACT. The device separation patterns 102 may cover the entire boundary region INT. The activation parts ACT may not be formed in the boundary region INT. A device separation trench may be formed in the substrate 100, and the device separation patterns 102 may fill the device separation trench. The device separation patterns 102 may include at least one material of, e.g., a silicon nitride layer, a silicon oxide layer, and a silicon oxynitride layer. In a plan view, the activation parts ACT may be parallel to each other in a first direction D1. For example, the activation parts ACT may have a diagonal shape as shown in FIG. 2A. Grooves may be formed by patterning the activation parts ACT and the device separation patterns 102. Here, the device separation patterns 102 may be etched further than the substrate 100 by adjusting an etch condition with respect to the substrate 100 and the device separation patterns 102. Thus, each of the grooves may have a curved bottom surface. In other words, the bottom surface of each of the grooves may be deeper in the device separation patterns 102 than the substrate 100.

Word lines WL may be formed in the grooves, respectively. One pair of word lines WL may cross each of the activation parts ACT. A gate dielectric layer 107 may be formed on an inner surface of each of the grooves before the word lines WL are formed. The gate dielectric layer 107 may be formed through a thermal oxidation process, a chemical vapor deposition process, and/or an atomic layer deposition process. The gate dielectric layer 107 may be formed of, e.g., a silicon oxide layer, a silicon nitride layer, and/or a metal oxide layer. Thereafter, the word lines WL may be formed such that the grooves are filled by laminating gate conductive layers and then etched back. Each of the gate conductive layers may be formed of, e.g., polysilicon, a metal nitride layer, and/or metal, which are doped with impurities. Top surfaces of the word lines WL may be recessed to be lower than those of the activation parts ACT. The word lines WL may extend in a second direction D2 crossing the first direction D1. A word line capping pattern 110 may be formed on each of the word lines WL such that the grooves are filled by laminating insulation layers such as a silicon nitride layer on the substrate 100 and then etched back. First and second doped regions 112*a* and 112*b* may be formed by injecting dopants to the activation parts ACT by using the word line capping patterns 110 and the device separation pattern 102 as a mask.

Figure 3A:
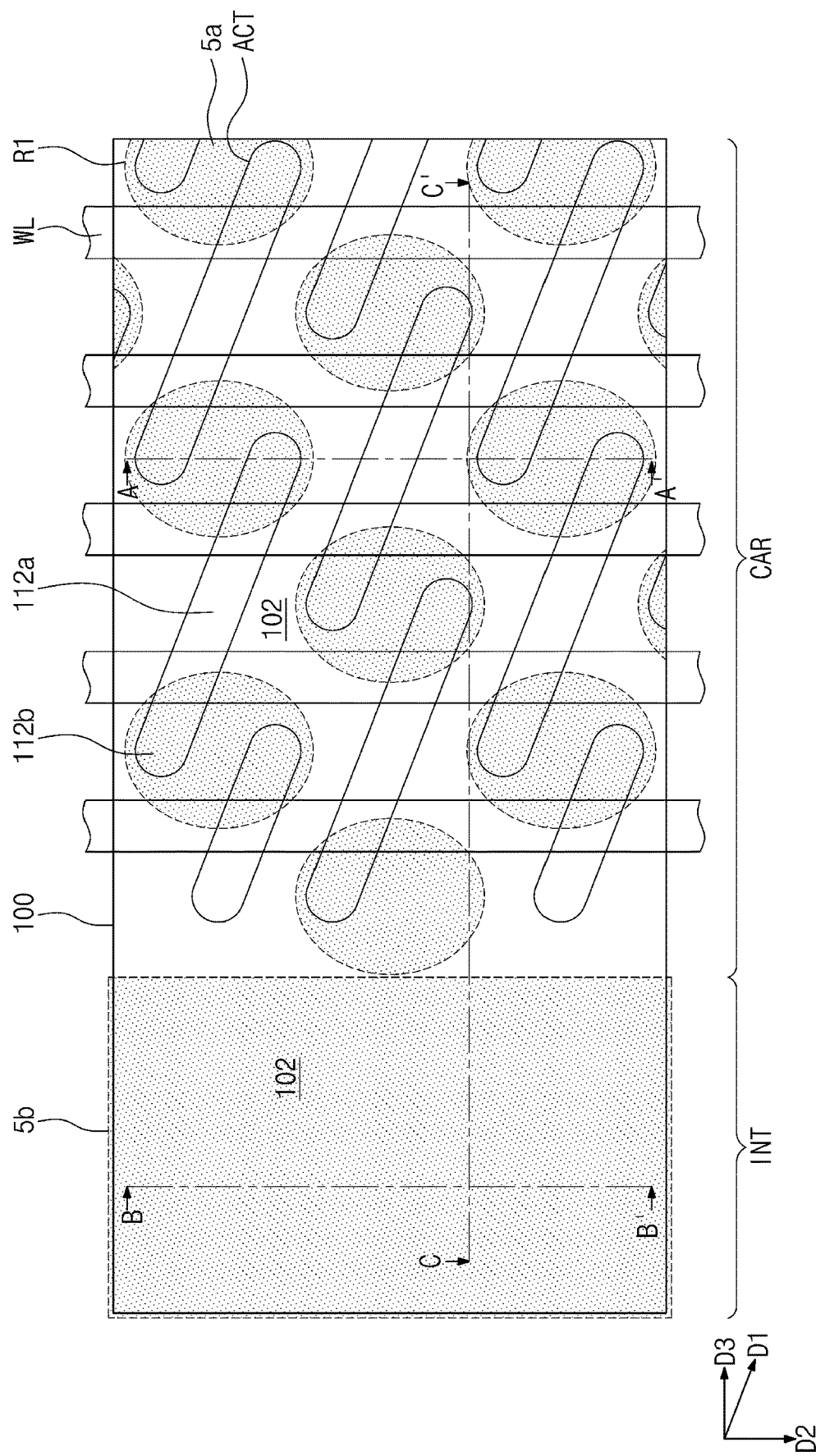
Figure 3B:
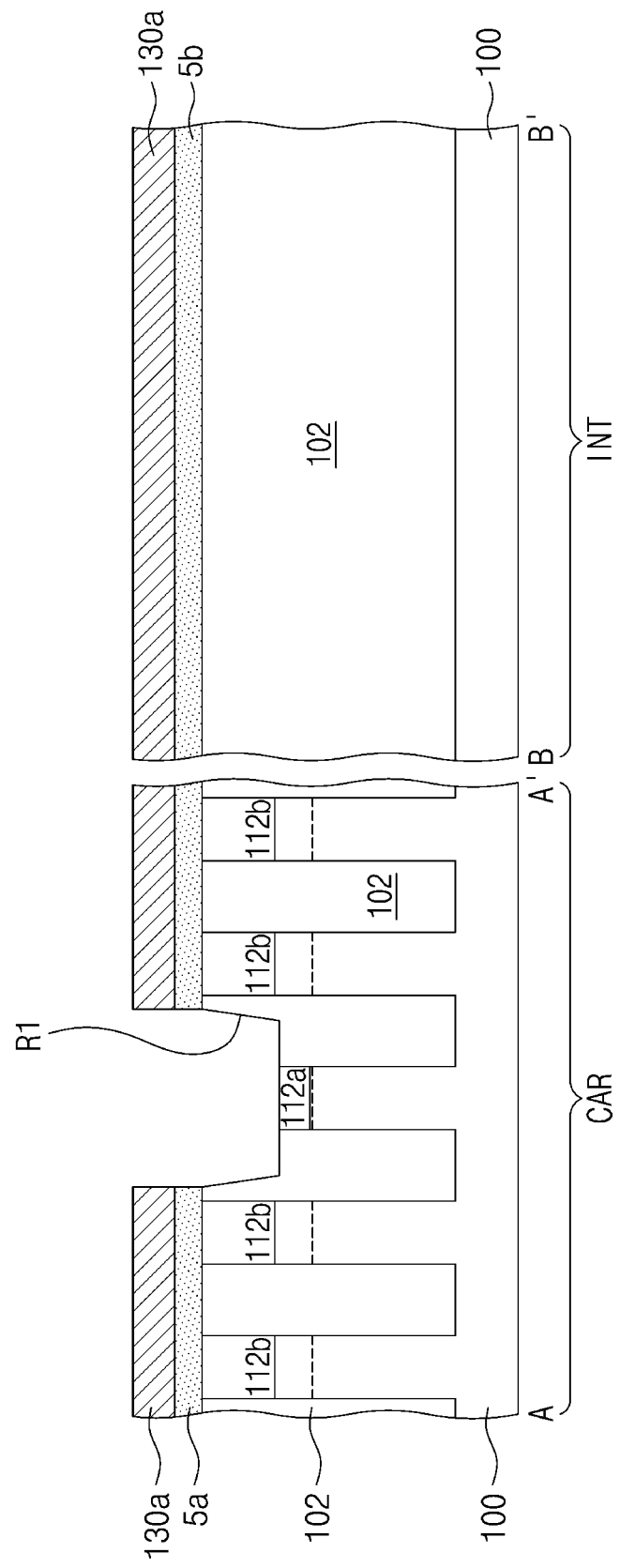
Figure 3C:
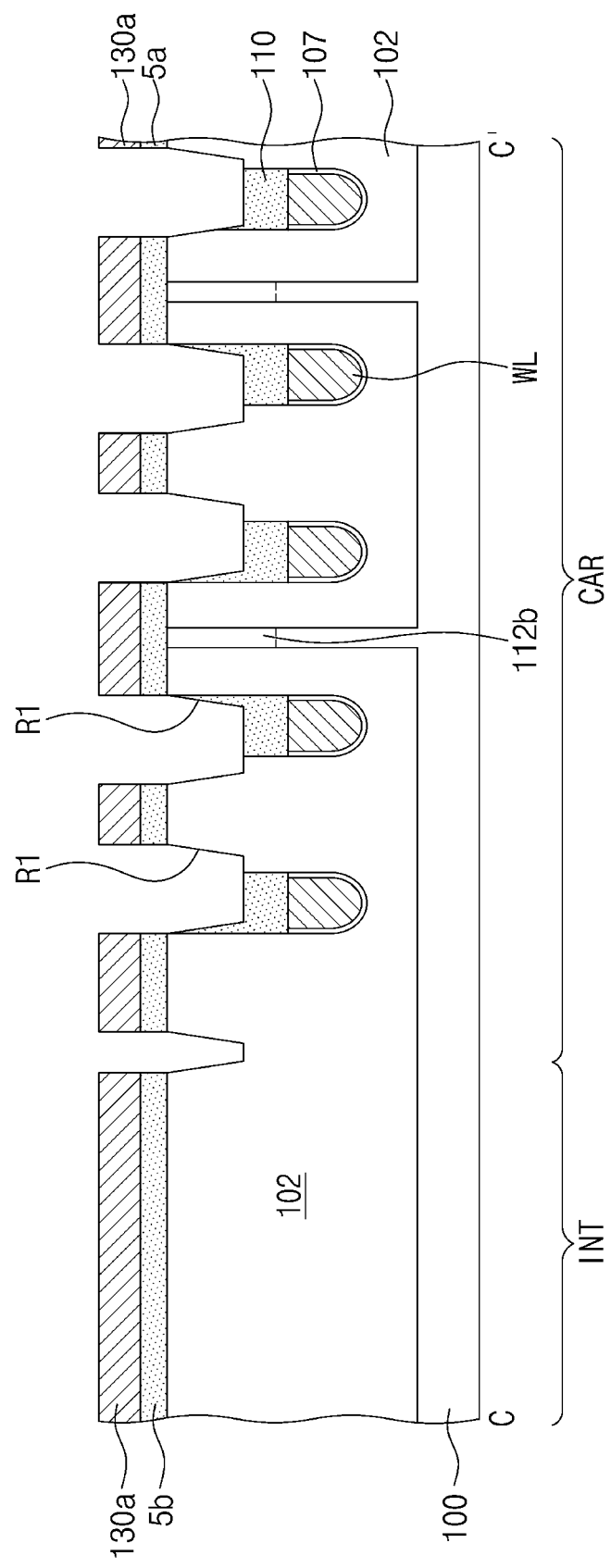

Referring to FIGS. 3A to 3C, an etch stop layer and a first polysilicon layer may be sequentially laminated on a front surface of the substrate 100. A polysilicon mask pattern 130*a* may be formed by patterning the first polysilicon layer. The etch stop layer, the device separation pattern 102, the substrate 100, and the word line capping pattern 110 may be etched by using the polysilicon mask pattern 130*a* as an etch mask to form a cell etch stop pattern 5*a* in the cell array region CAR while a first recess region R1 is formed in the cell array region CAR at the same time. Here, an etch stop pattern 5*b* may be formed in the boundary region INT.

The cell etch stop patterns 5*a* and the boundary etch stop pattern 5*b* may be formed as at least one single layer or multi-layer of a silicon oxide layer, a silicon nitride layer, and a silicon oxynitride layer. The cell etch stop pattern 5*a* may be formed by a plurality of islands that are spaced apart from each other. The cell etch stop pattern 5*a* may simultaneously cover ends of two neighboring activation parts ACT. Ends of a single activation part ACT may be covered by the cell etch stop pattern 5*a*, for example. The first recess region R1 may have a net shape in a plan view. The first recess region R1 may expose the first doped regions 112*a*.

Figure 4A:
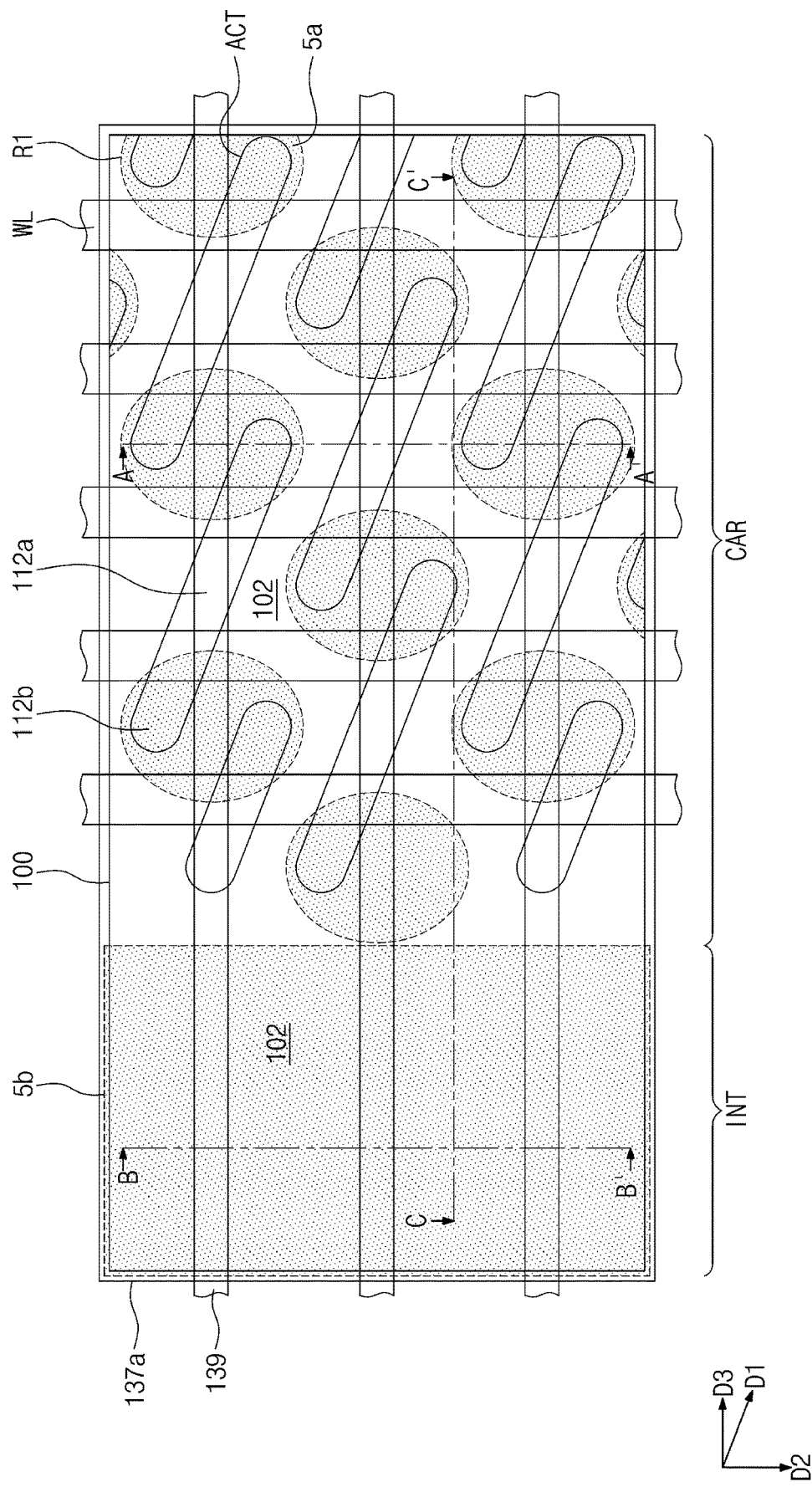
Figure 4B:
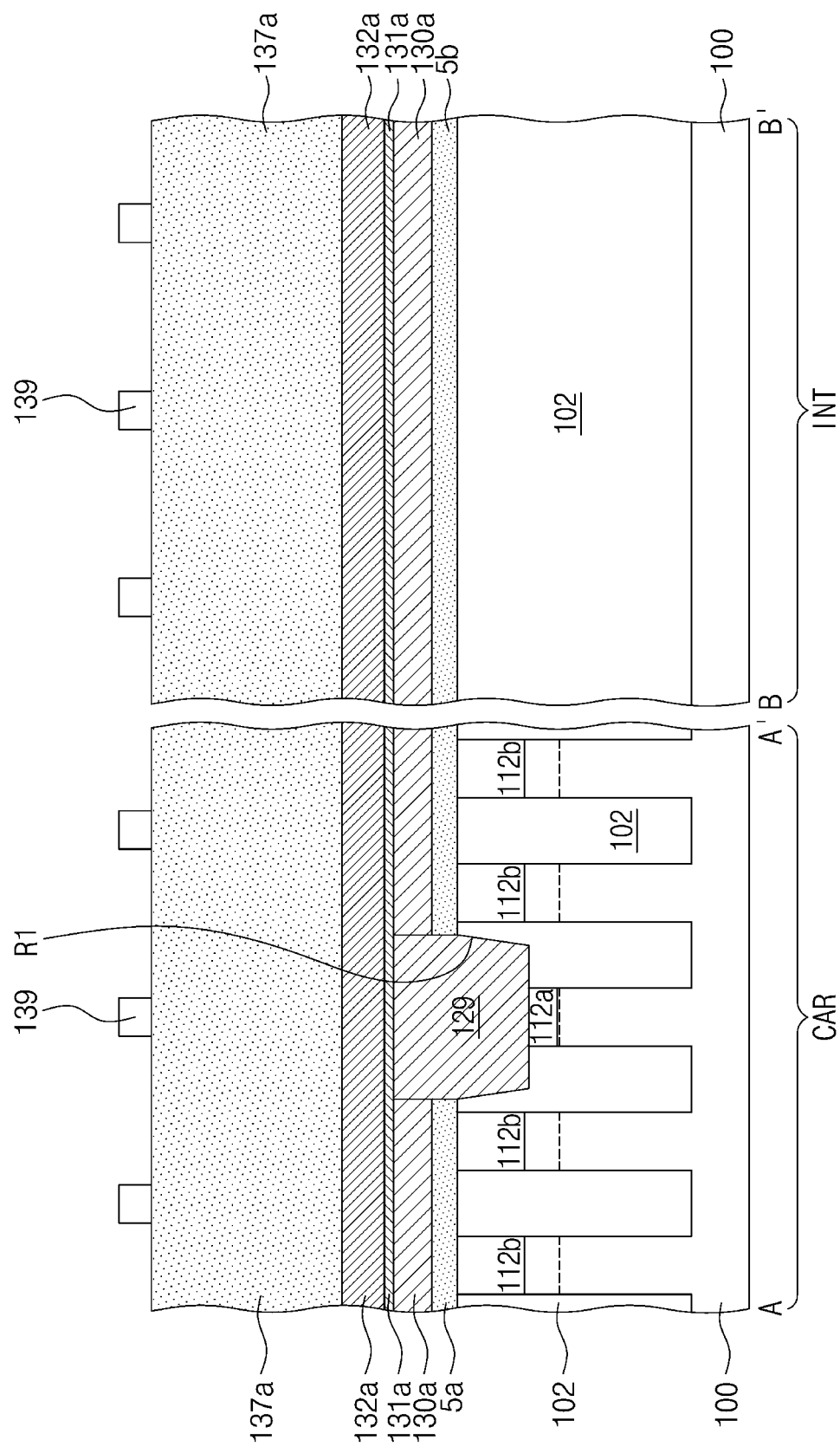
Figure 4C:
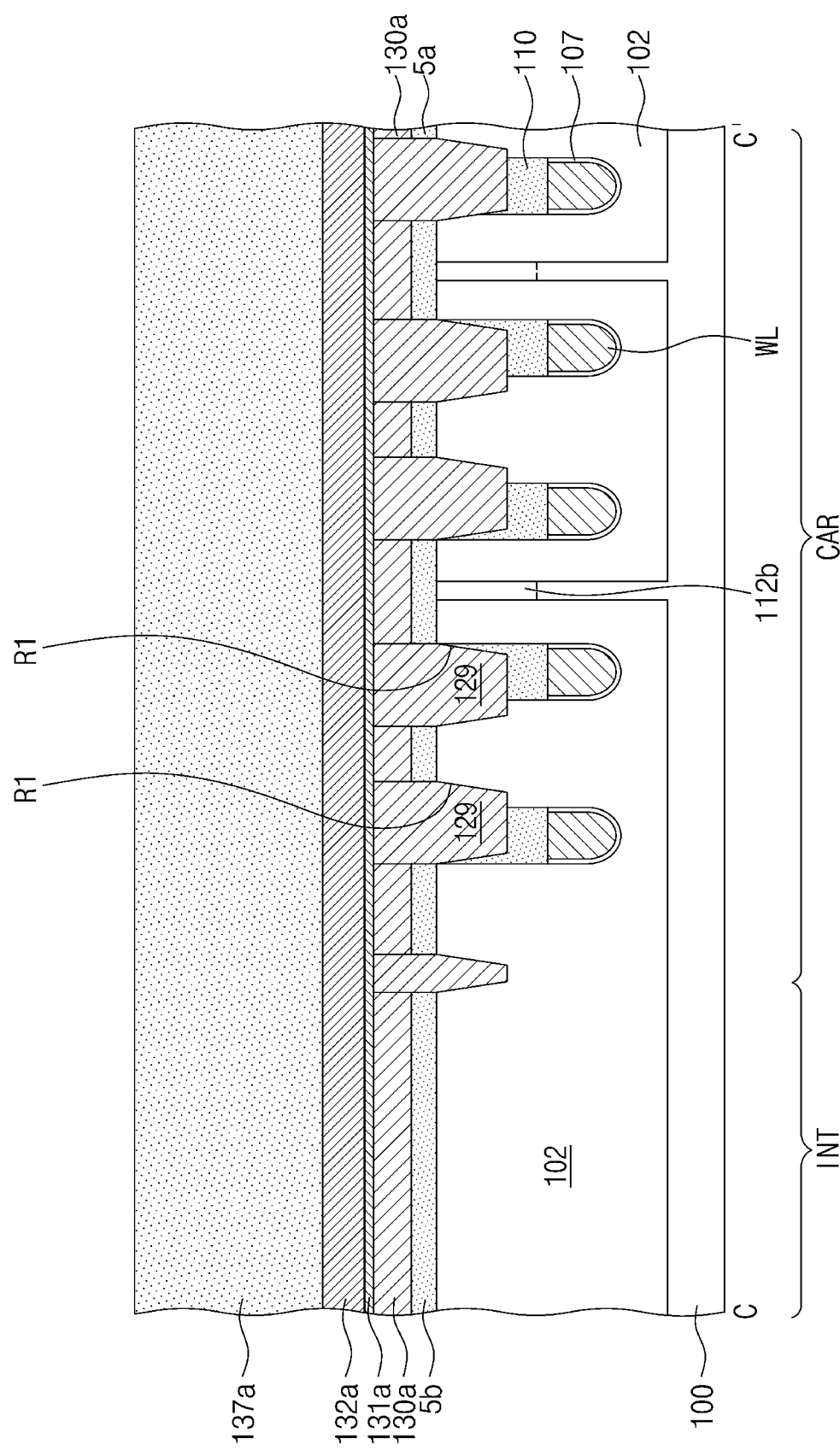

Referring to FIGS. 4A to 4C, the first recess region R1 may be filled by laminating a second polysilicon layer 129 on the front surface of the substrate 100. In addition, the second polysilicon layer 129 on the polysilicon mask pattern 130*a* may be removed by performing a planarization etch process on the second polysilicon layer 129 to expose a top surface of the polysilicon mask pattern 130*a*. A bit line ohmic layer 131*a*, a bit line metal containing layer 132*a*, and a bit line capping layer 137*a* may be sequentially laminated on the polysilicon mask pattern 130*a* and the second polysilicon layer 129. The bit line ohmic layer 131*a* may be formed of metal silicide such as cobalt silicide. The bit line ohmic layer 131*a* may be formed such that a metal layer is deposited on the polysilicon mask pattern 130*a* and the second polysilicon layer 129 and then a thermal treatment process is performed, polysilicon of the second polysilicon layer 129 and the polysilicon mask pattern 130*a* reacts with the metal layer to form metal silicide, and then an unreacted metal layer is removed. The bit line metal containing layer 132*a* may include, e.g., tungsten. The bit line capping layer 137*a* may be formed of, e.g., a silicon nitride layer.

First mask patterns 139, which define a planar shape of the bit line BL, may be formed on the bit line capping layer 137*a*. The first mask patterns 139 may be made of a material having an etch selectivity with the bit line capping layer 137*a*, e.g., an amorphous carbon layer (ACL), a silicon oxide layer, a spin on hardmask (SOH), or a photoresist pattern. The first mask patterns 39 may extend in a third direction D3 crossing all of the first and second directions D1 and D2.

Figure 5A:
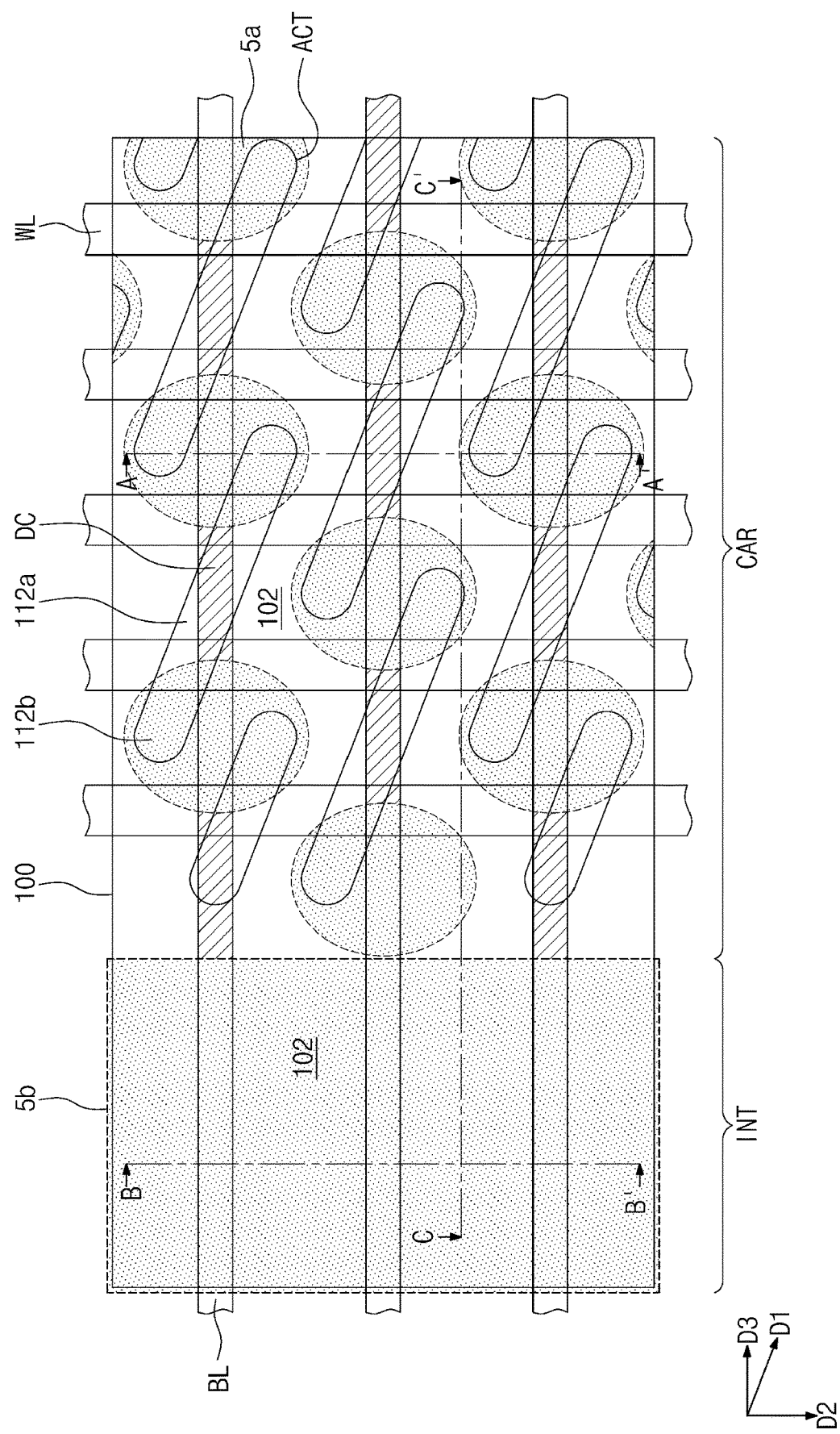
Figure 5C:
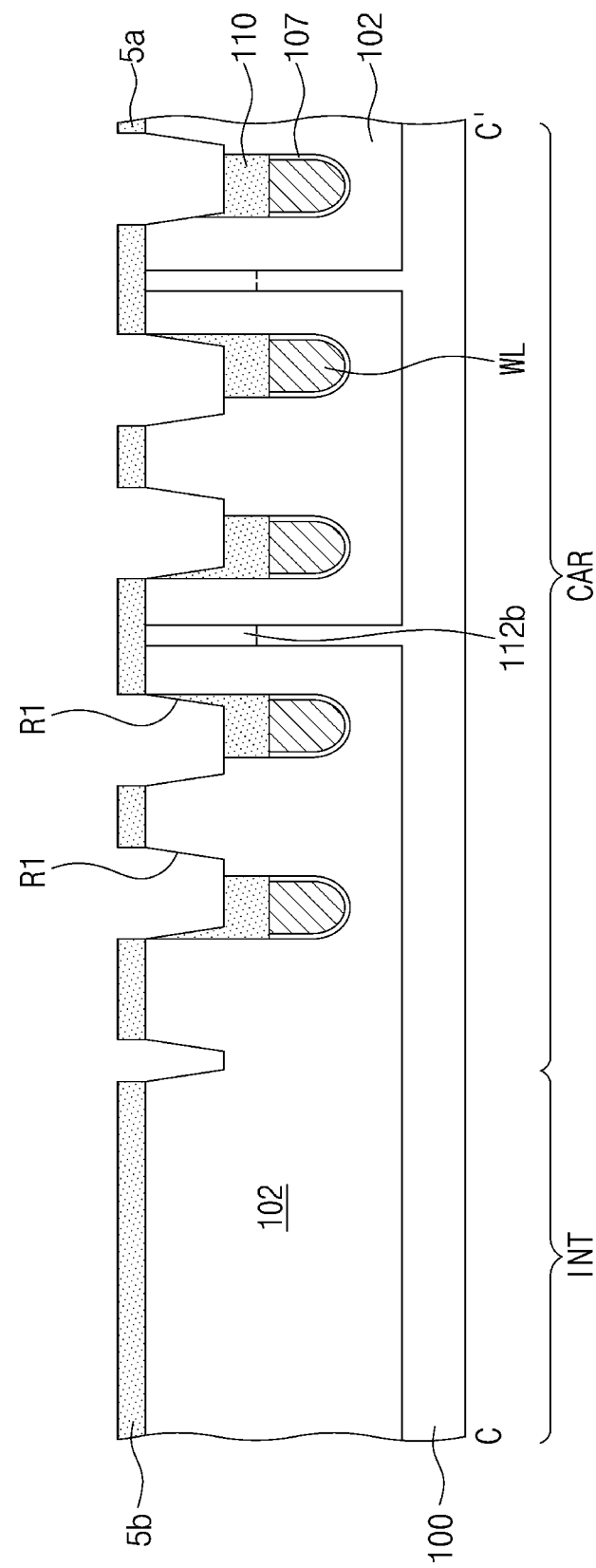

Referring to FIGS. 5A to 5C, a bit line BL including a bit line polysilicon pattern 130, a bit line ohmic pattern 131, and a bit line metal, containing pattern 132, a bit line contact DC, and a bit line capping pattern 137 may be formed by sequentially etching the bit line capping layer 137*a*, the bit line metal containing layer 132*a*, the bit line ohmic layer 131*a*, the polysilicon mask pattern 130*a*, and the second polysilicon layer 129 using the first mask patterns 139 as an etch mask. In addition, top surfaces of the etch stop patterns 5*a* and 5*b* and an inner wall and a bottom surface of the first recess region R1 may be partially exposed. The first mask patterns 139 may be removed.

Figure 6A:
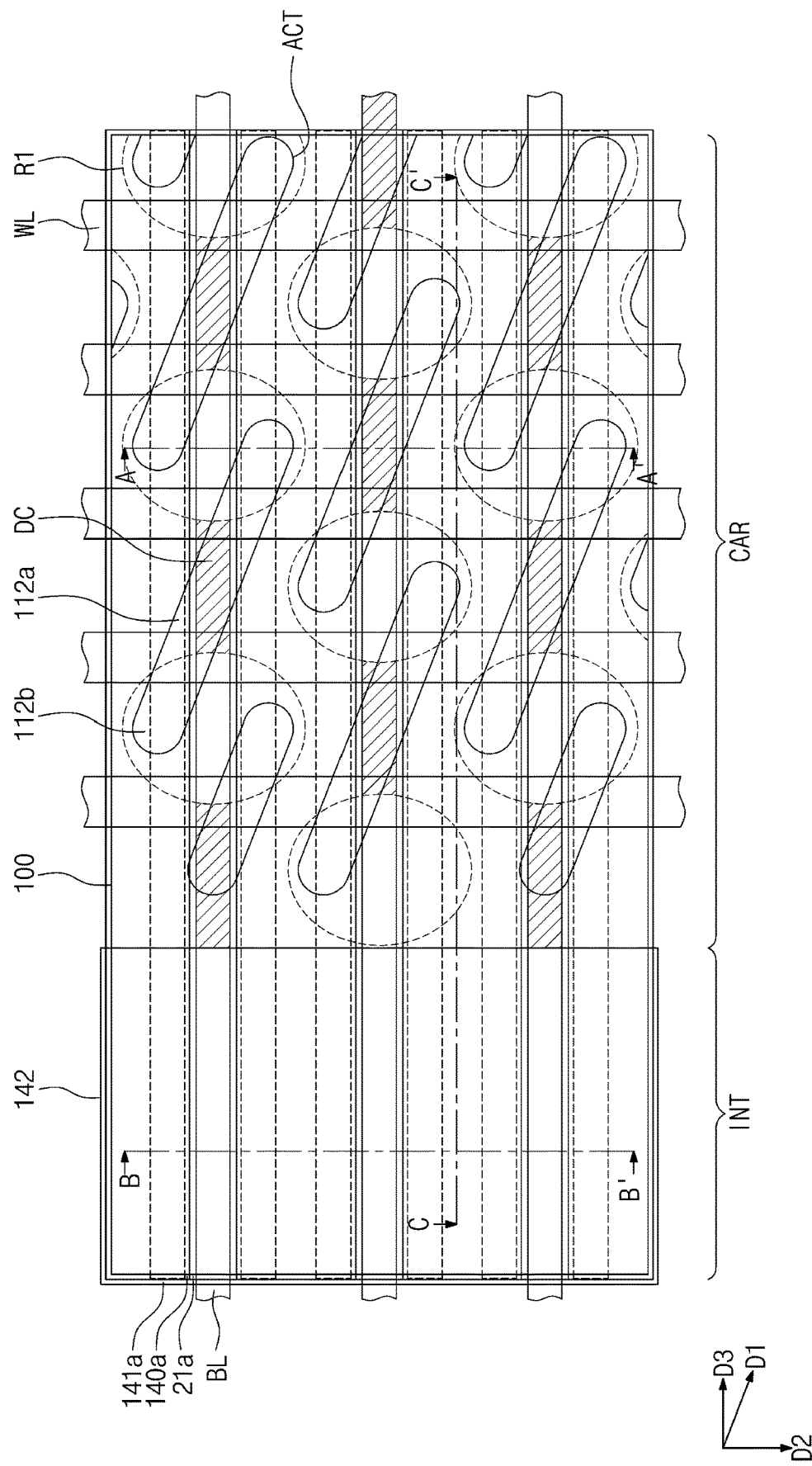
Figure 6B:
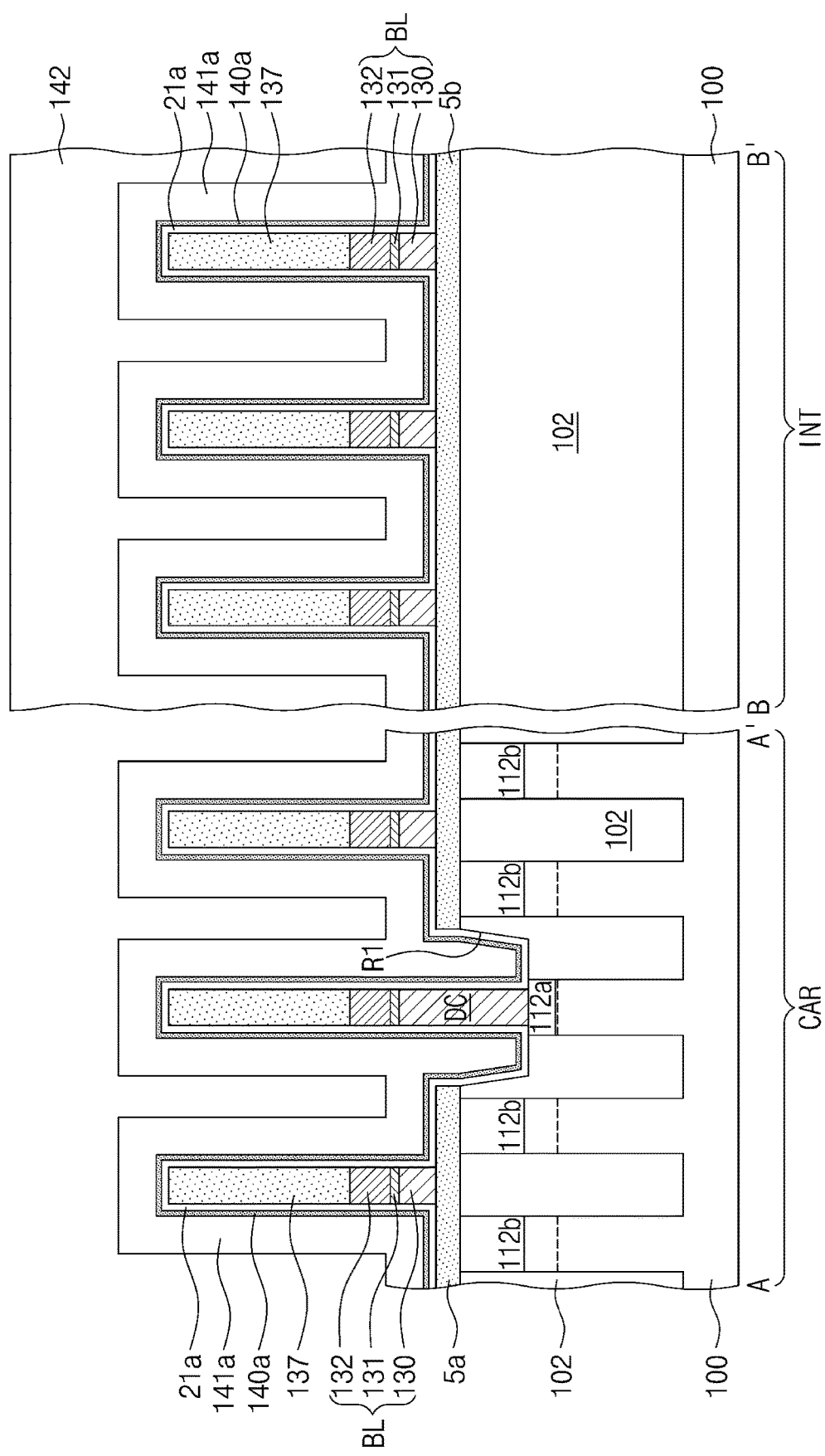
Figure 6C:
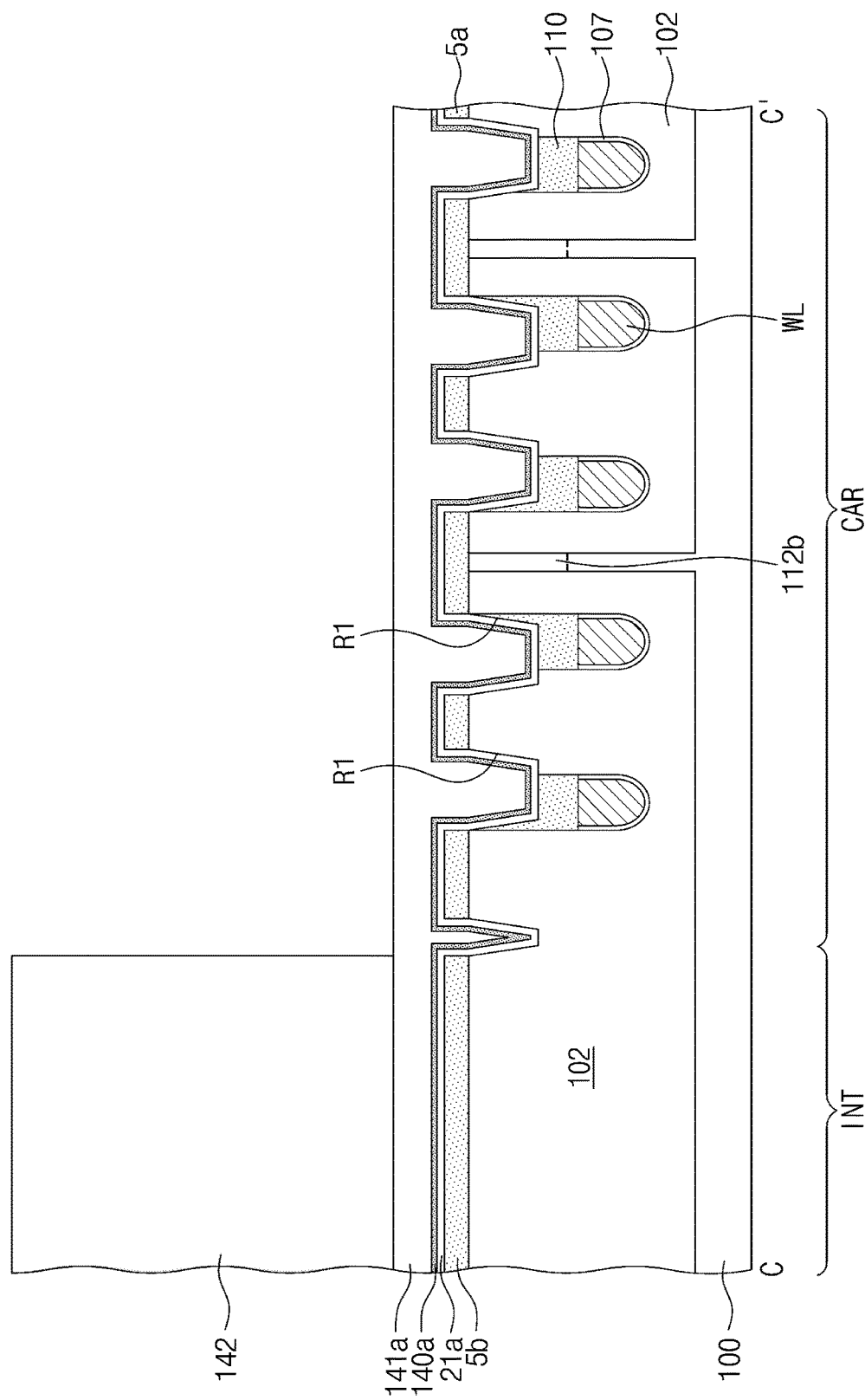

Referring to FIGS. 6A to 6C, a first spacer layer 21*a*, an insulation liner layer 140*a*, and a buried insulation layer 141*a* may be conformity formed on the front surface of the substrate 100. The buried insulation layer 141*a* may have a thickness enough to fill the first recess region R1. The first spacer layer 21*a* and the buried insulation layer 141*a* may include, e.g., a silicon nitride layer. The insulation liner layer 140*a* may include, e.g., a silicon oxide layer. In addition, a second mask pattern 142 exposing the cell array region CAR while covering the boundary region INT may be formed on the buried insulation layer 141*a*. The second mask patterns 142 may include at least one single layer or multi-layer of, e.g., an amorphous carbon layer (ACL), a silicon oxide layer, a spin on hardmask (SOH), or a photoresist pattern.

Figure 7A:
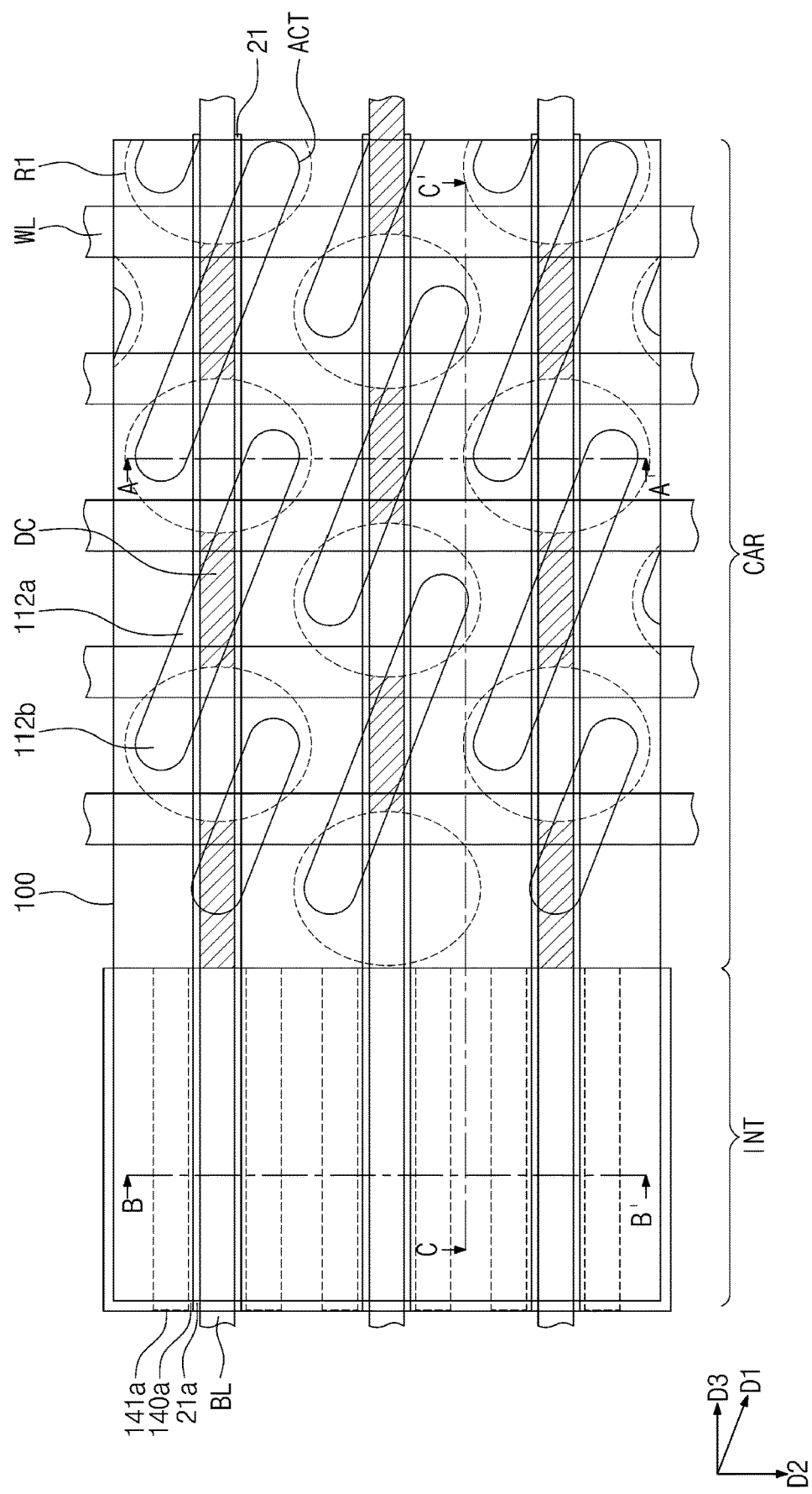
Figure 7B:
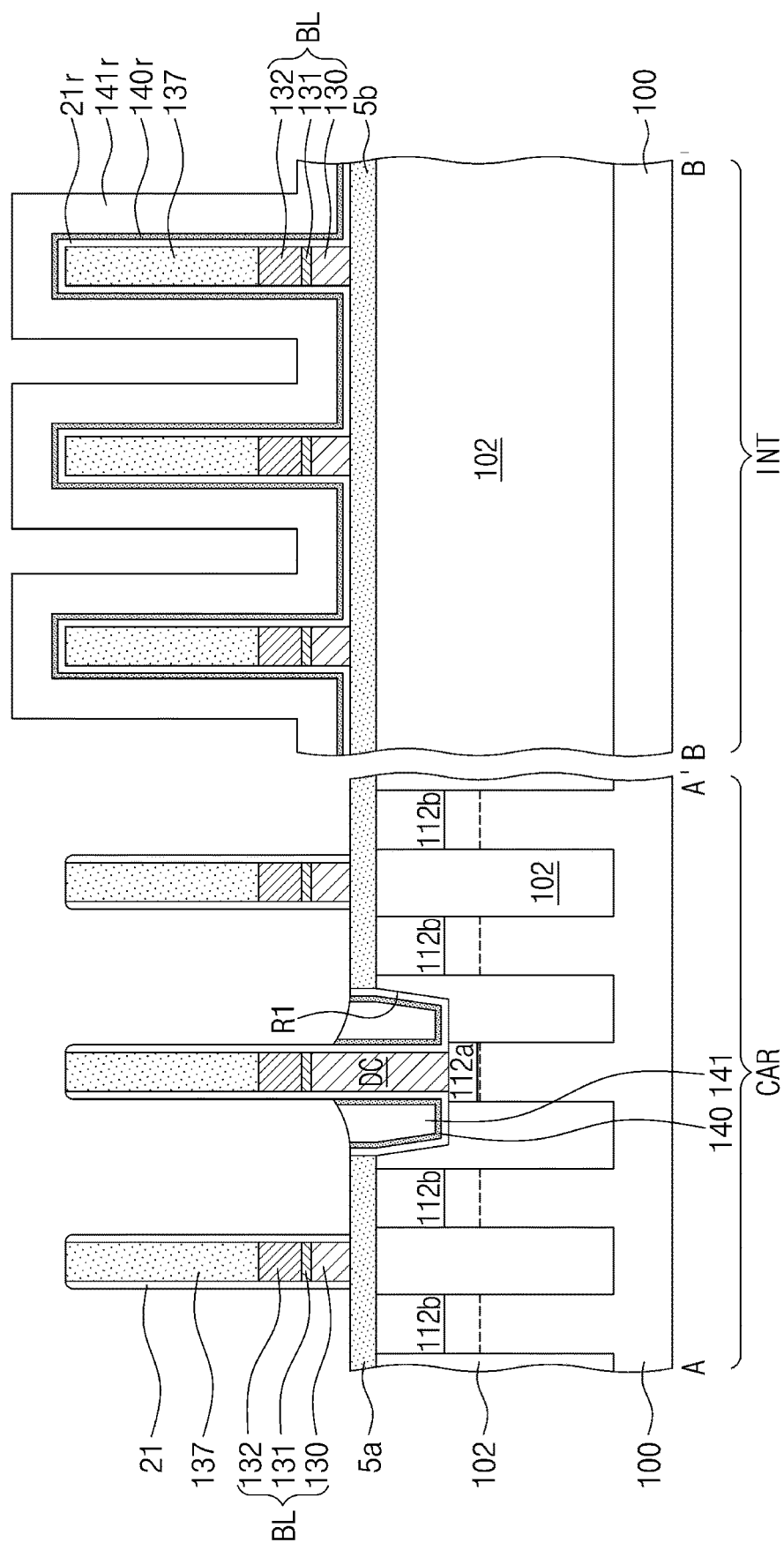
Figure 7C:
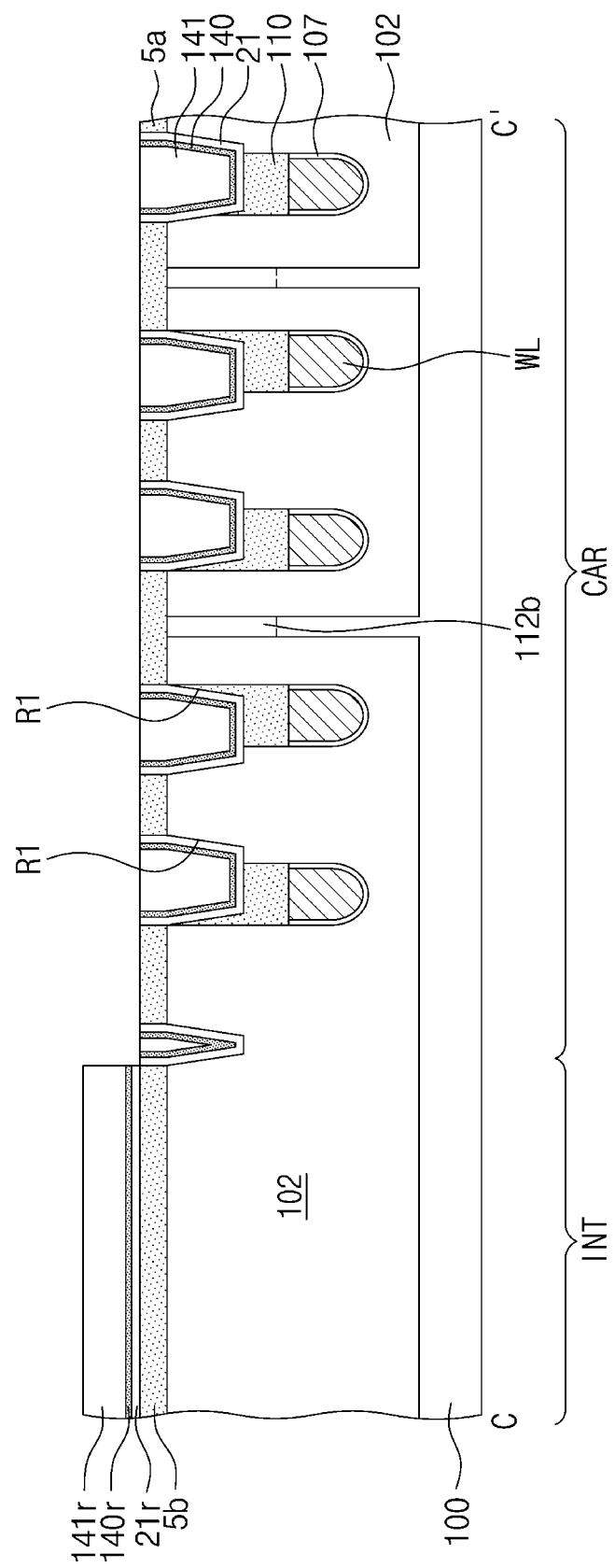
Figure 8A:
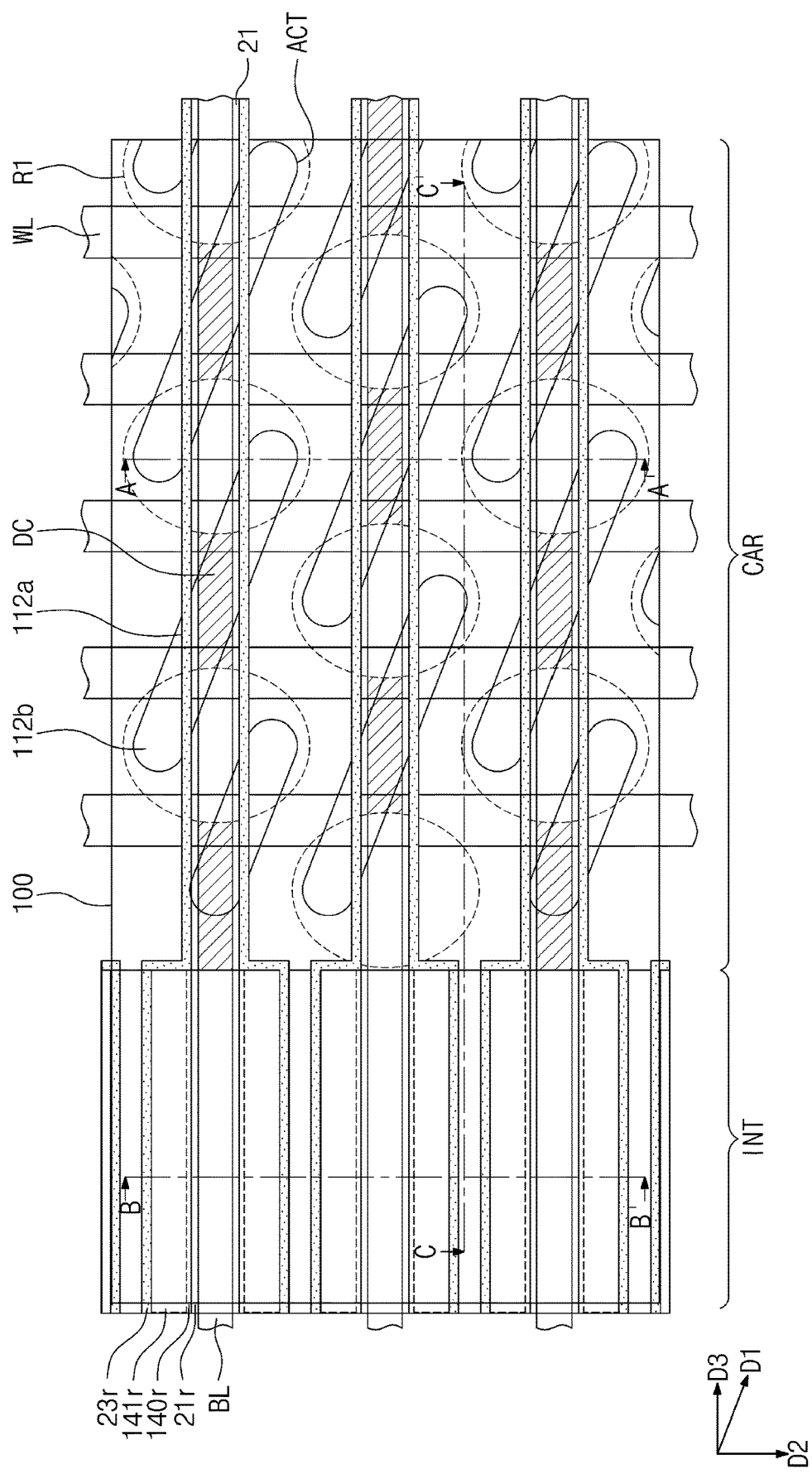
Figure 8B:
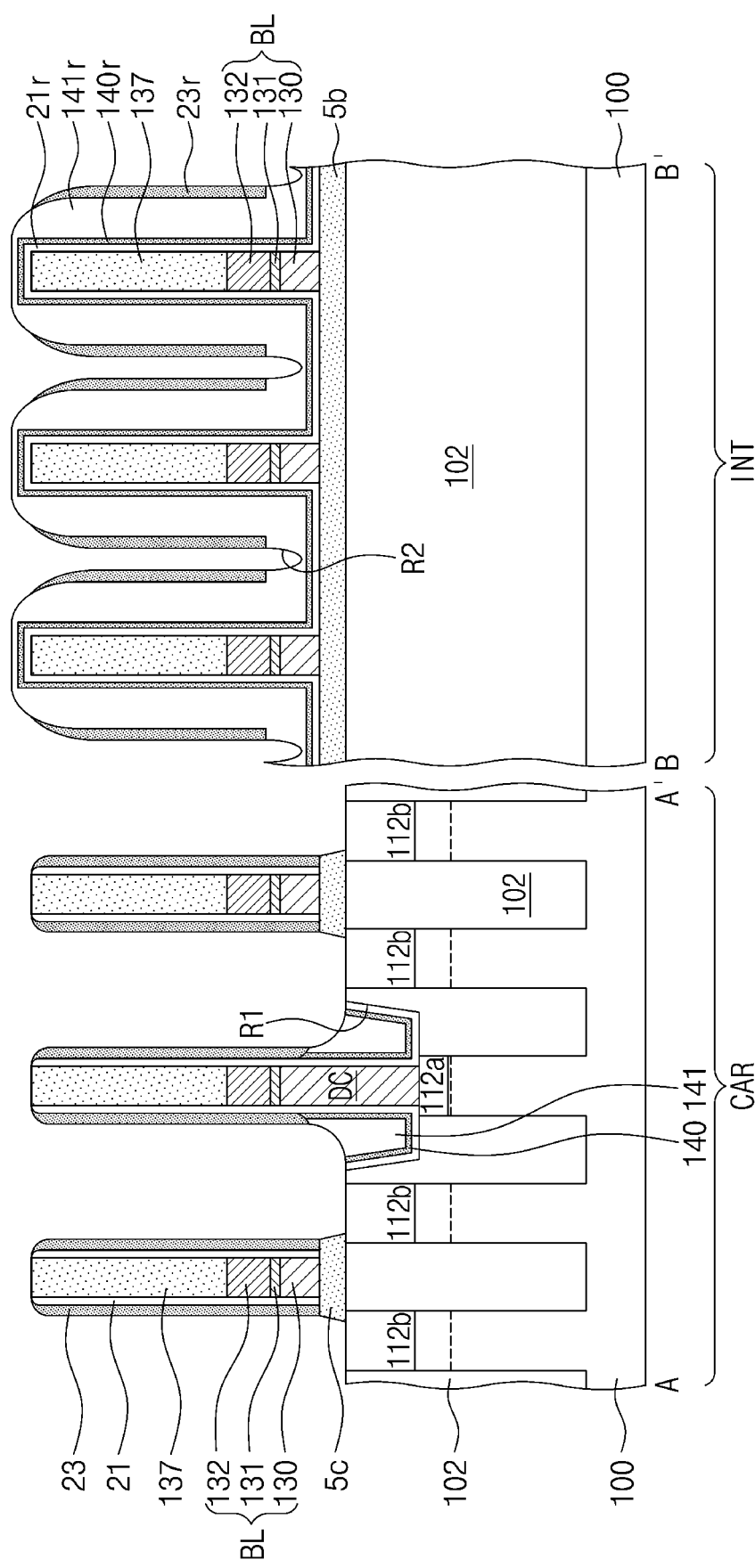
Figure 8C:
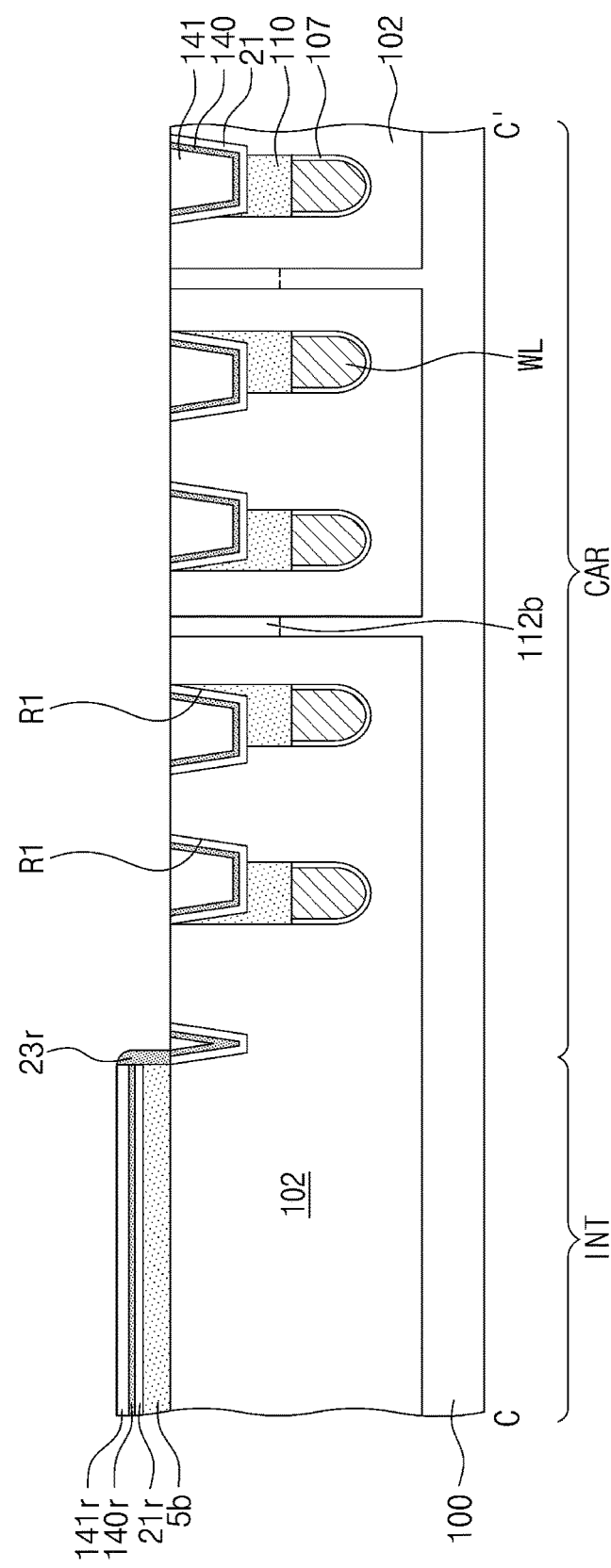

Referring to FIGS. 7A to 7C, a cell insulation liner 140 and a cell buried insulation pattern 141 may be formed in the first recess region R1 while exposing a top surface of the cell etch stop pattern 5*a* at the same time by performing an anisotropic etch process on a buried insulation layer 141*a*, an insulation liner layer 140*a*, and a first spacer layer 21*a* in the cell array region CAR using the second mask pattern 142 as an etch mask. In addition, a first spacer 21 may be formed. A first residual spacer pattern 21*r*, a boundary insulation liner 140*r*, and a boundary buried insulation pattern 141*r* may remain in the boundary region INT. In addition, the boundary buried insulation pattern 141*r* may be exposed by removing the second mask pattern 142. The cell buried insulation pattern 141 and the boundary buried insulation pattern 141 may be formed as a portion of the buried insulation layer 141*a*. The cell insulation liner 140 and the boundary insulation liner 140*r* may be formed as a portion of the insulation liner layer 140*a*. The first spacer 21 and the first residual spacer pattern 21*r* may be formed as a portion of the first spacer layer 21*a*.

Referring to 8A to 8C, a second spacer 23 covering a sidewall of the first spacer 21 in the cell array region CAR is formed by conformally laminating a second spacer layer on the front surface of the substrate 100 and anisotropic-etching the same. The second spacer layer may include, e.g., a silicon oxide layer. In addition, an anisotropic etching process may be performed on the lower interlayer insulation pattern 5*c* to expose the top surface of the substrate 100 while keeping the lower interlayer insulation patterns below the second spacer 23 and the bit line BL at the same time. Here, an upper portion of the boundary buried insulation pattern 141*r* may be removed from the boundary region INT. In addition, a second residual spacer pattern 23*r* covering a sidewall of the boundary buried insulation pattern 141*r* may be formed. The second spacer 23 and the second residual spacer pattern 23*r* may be formed as a portion of the second spacer layer. Here, as a central portion of the boundary buried insulation pattern 141r between neighboring bit lines BL is etched, a second recess region R2 may be formed. On a cross-section of FIG. 8C, the second residual spacer pattern 23r may cover sidewalls of the boundary etch stop pattern 5b, the first residual spacer pattern 21r, the boundary insulation liner 140r, and the boundary buried insulation pattern 141r.

Figure 9A:
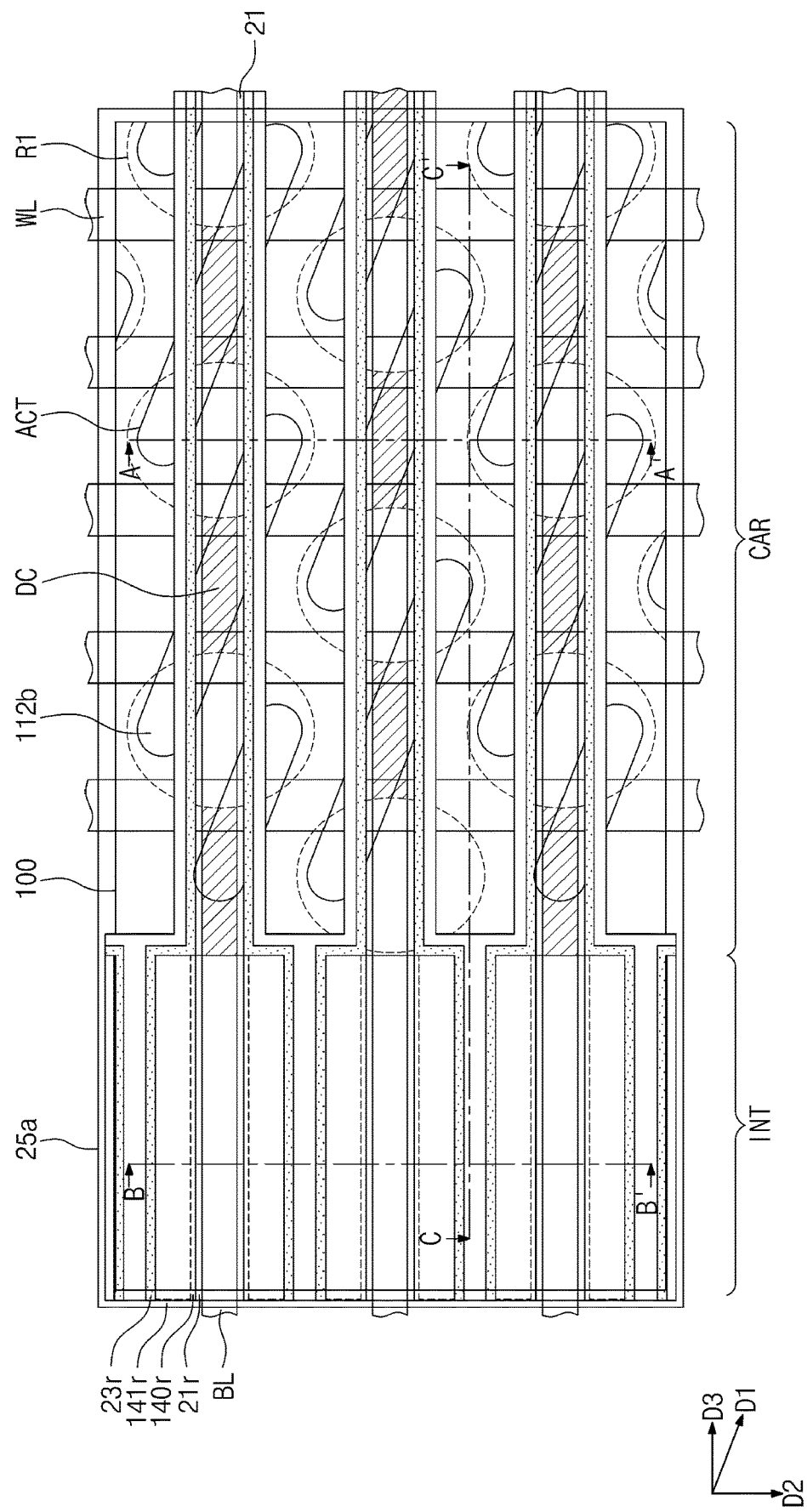
Figure 9B:
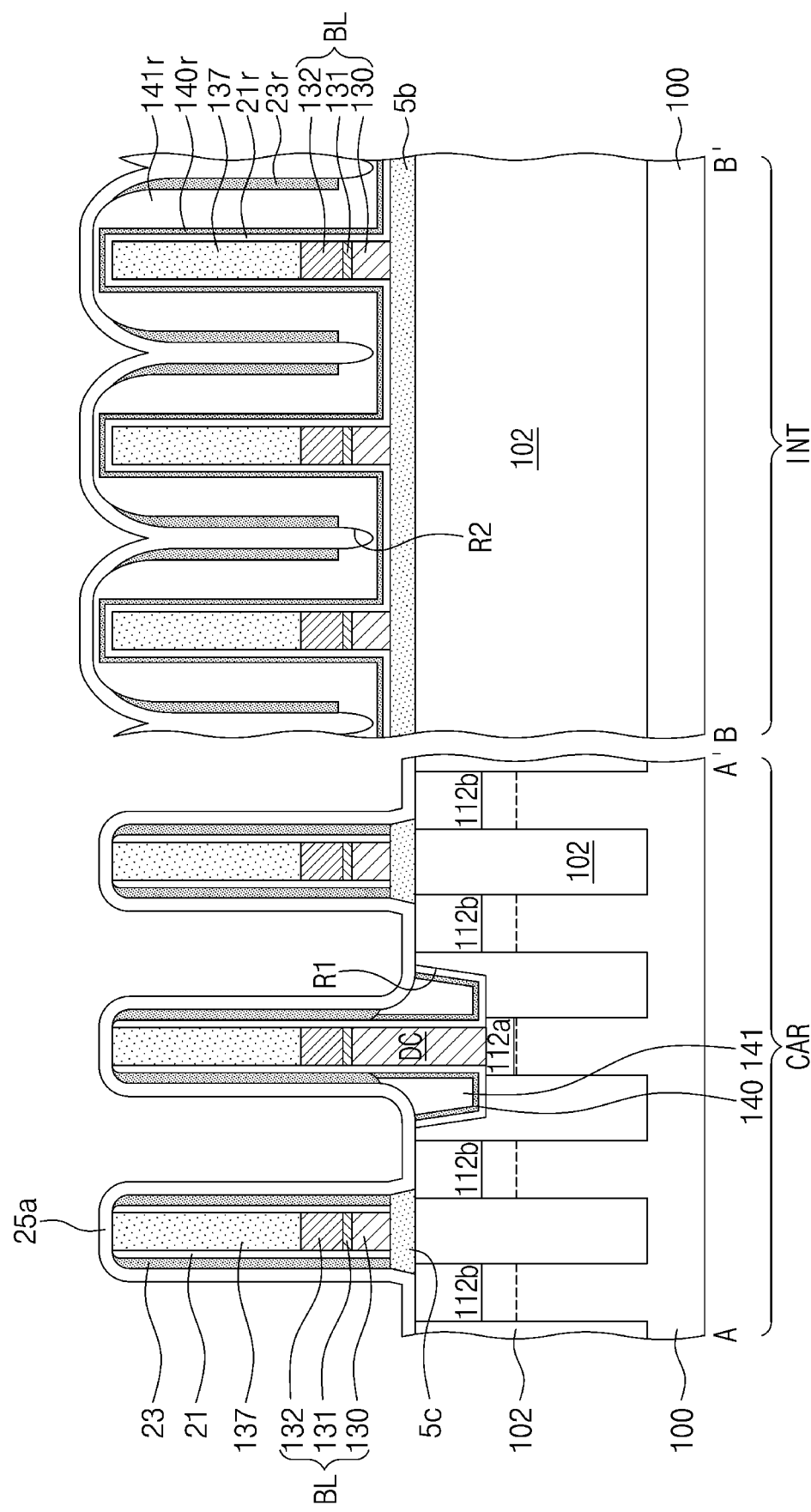
Figure 9C:
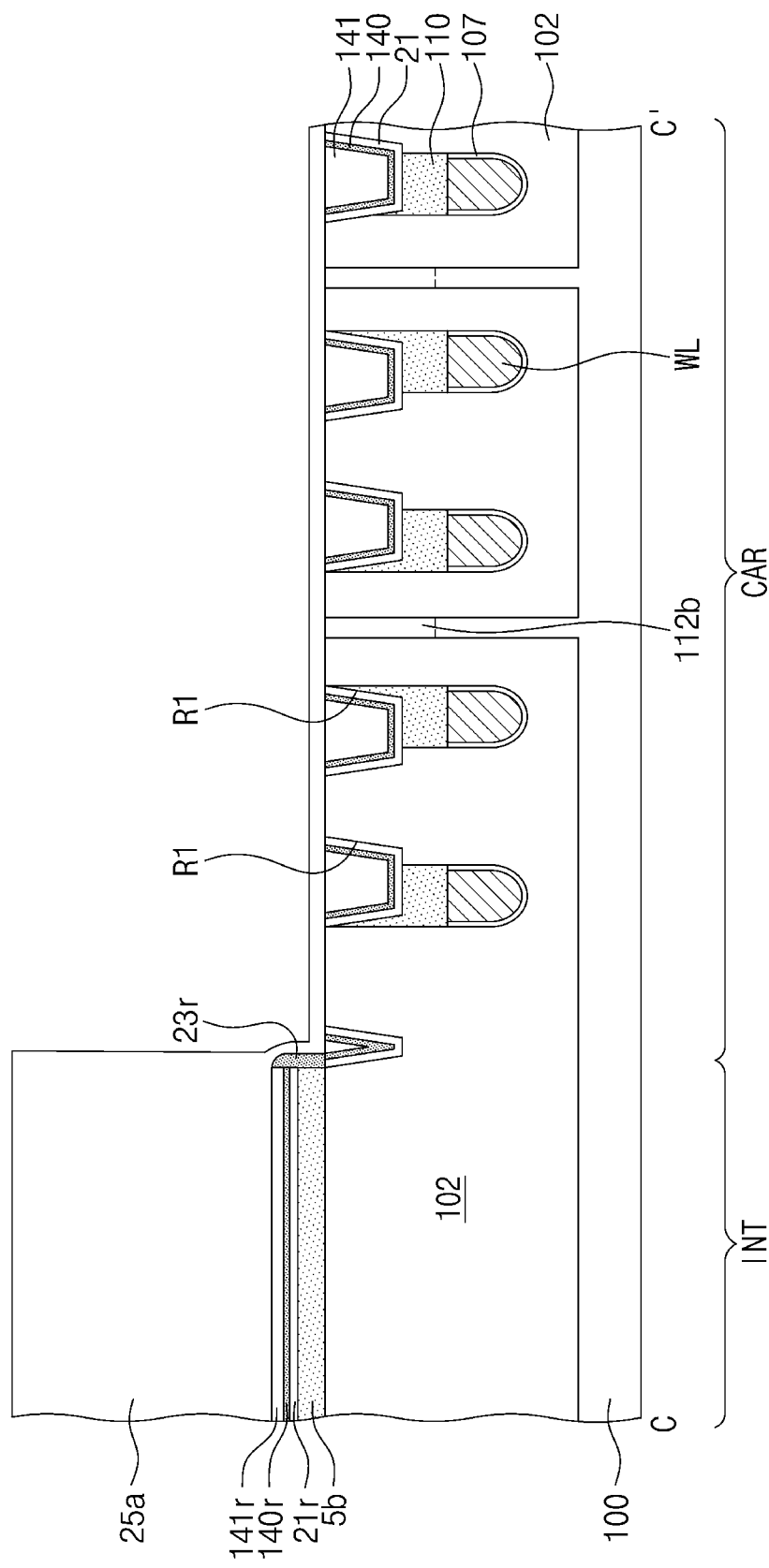

Referring to FIGS. 9A to 9C, a third spacer layer 25a may be conformally formed on the front surface of the substrate 100. The third spacer layer 25a may fill a space between the second recess region R2 and second residual spacer patterns 23r, which are adjacent thereto, in the boundary region INT. On a cross-section of FIG. 9C, the third spacer layer 25a may cover a top surface of the boundary buried insulation pattern 141r and a sidewall of the second residual spacer pattern 23r. In addition, the third spacer layer 25a may extend from the boundary region INT to the cell array region CAR. The third spacer layer 25a may include, e.g., a silicon nitride layer.

Figure 10A:
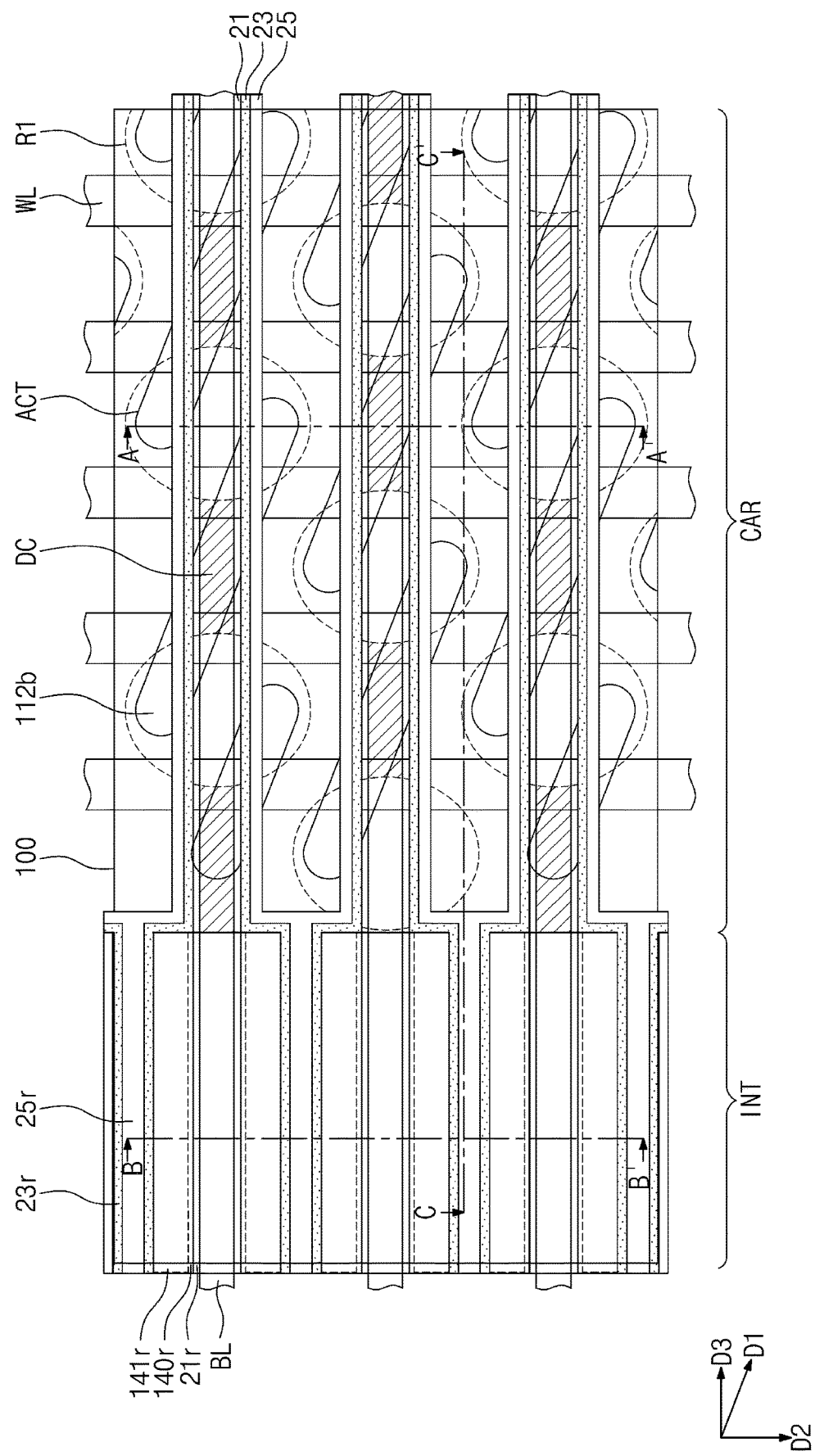
Figure 10B:
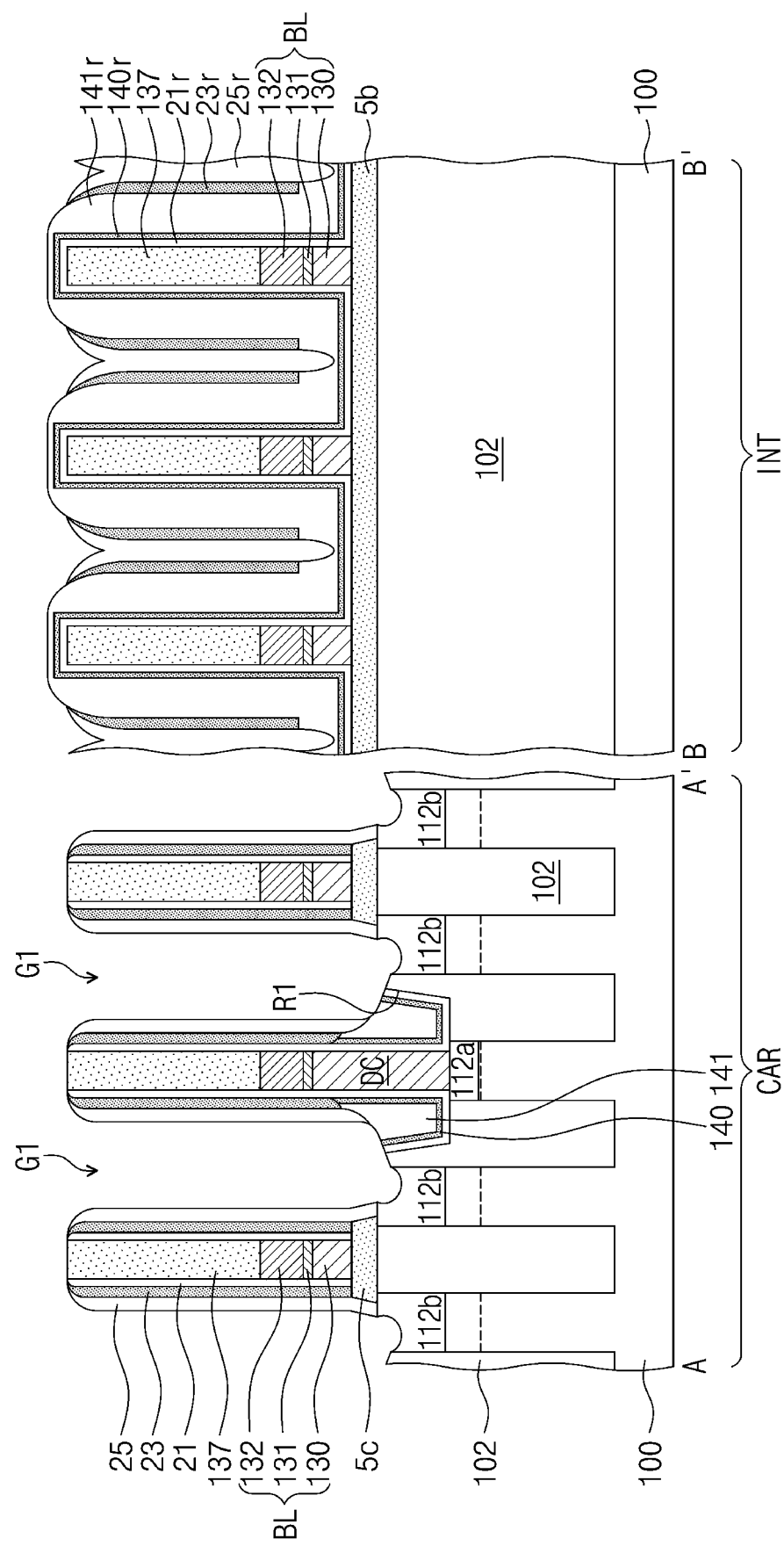
Figure 10C:
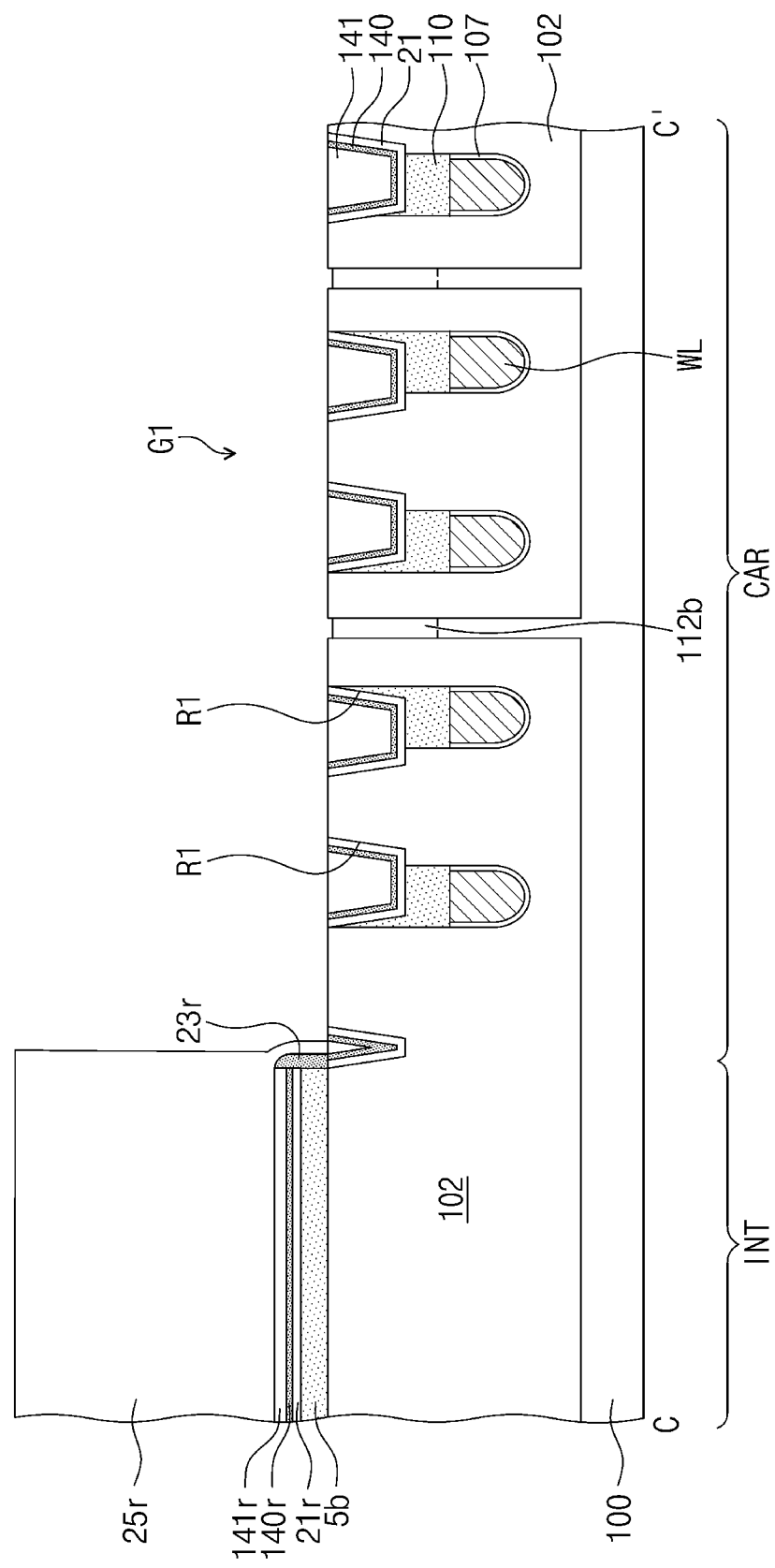

Referring to FIGS. 10A to 10C, first grooves G1 exposing the second doped regions 112b of the substrate 100 in the cell array region CAR may be formed, while forming a third spacer 25 covering a sidewall of a second spacer 23 by performing an anisotropic etching process on the third spacer layer 25a. Here, a third residual spacer pattern 25r may remain between neighboring second residual spacer patterns 23r in the boundary region INT. The third spacer 25 and the third residual spacer pattern 25r may be formed as a portion of the third spacer layer 25a. The third spacer 25 may reinforce an upper portion of the first spacer 21 and cover an upper portion of the second spacer 23 to prevent a cleaning solution used in a follow-up cleaning process from being permeated to the bit line BL. Thus, the bit line BL may be prevented from being damaged. An exposed upper portion of the substrate 100, which is disposed next to the bit lines BL in the cell array region CAR, may be partially etched by the anisotropic etching process.

Figure 11A:
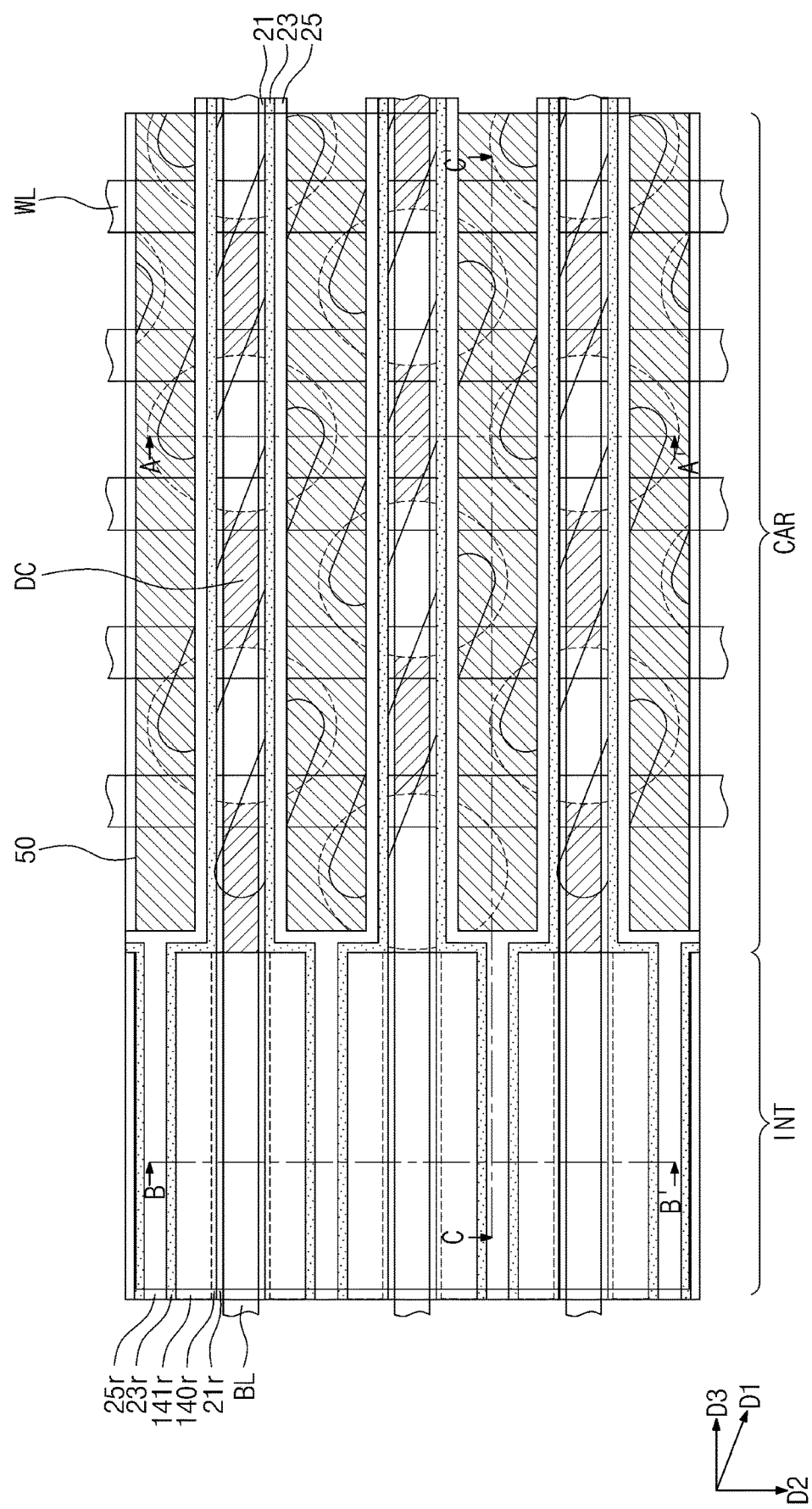
Figure 11B:
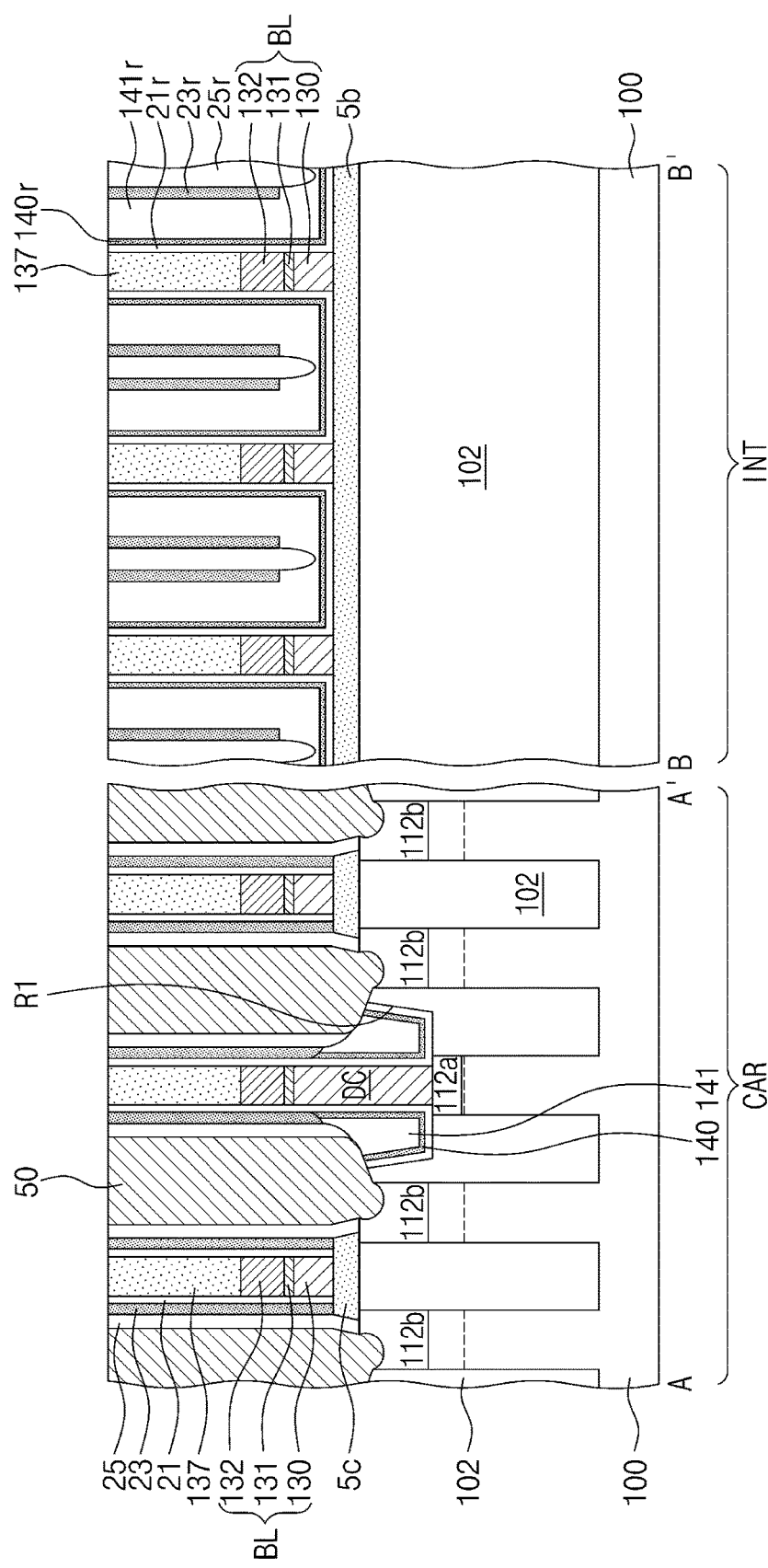
Figure 11C:
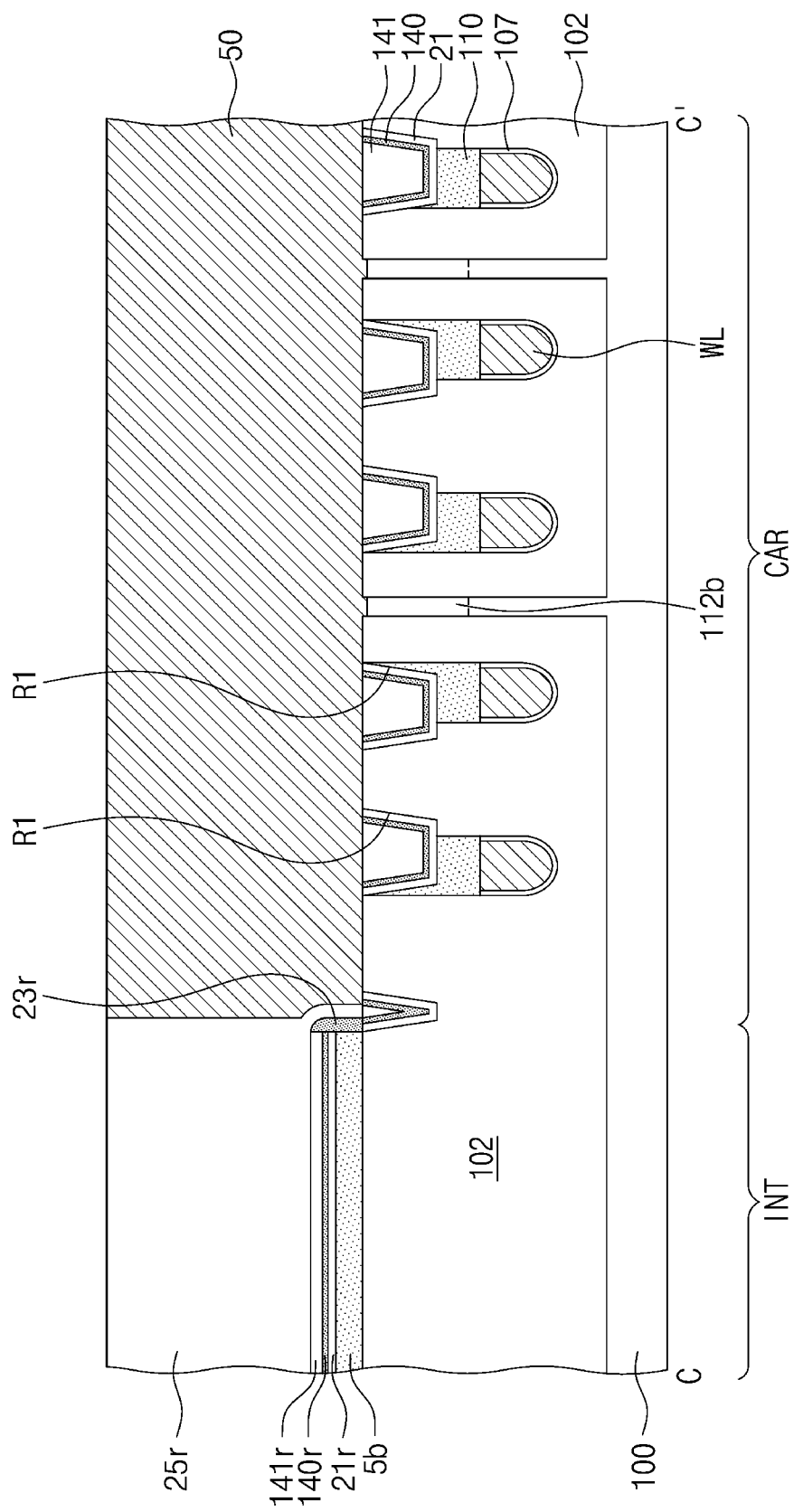

Referring to FIGS. 11A to 11C, the first grooves G1 are filled by laminating a polysilicon layer doped with impurities on the front surface of the substrate 100. A chemical mechanical polishing (CMP) process may be performed to expose a top surface of the bit line capping pattern 137 and form a conductive pattern 50 in the first grooves GI at the same time. Through the CMP process, the bit line capping pattern 137, the first to third spacers 21, 23, 25, the first to third residual spacer patterns 21r, 23r, 25r, the boundary buried insulation pattern 141r, and the boundary insulation liner 140r may have flat top surfaces having the same height by partially removing upper portions thereof. Thus, the boundary buried insulation pattern 141r may have a IT shaped cross-section. The conductive pattern 50 is not formed in the boundary region INT.

Figure 12A:
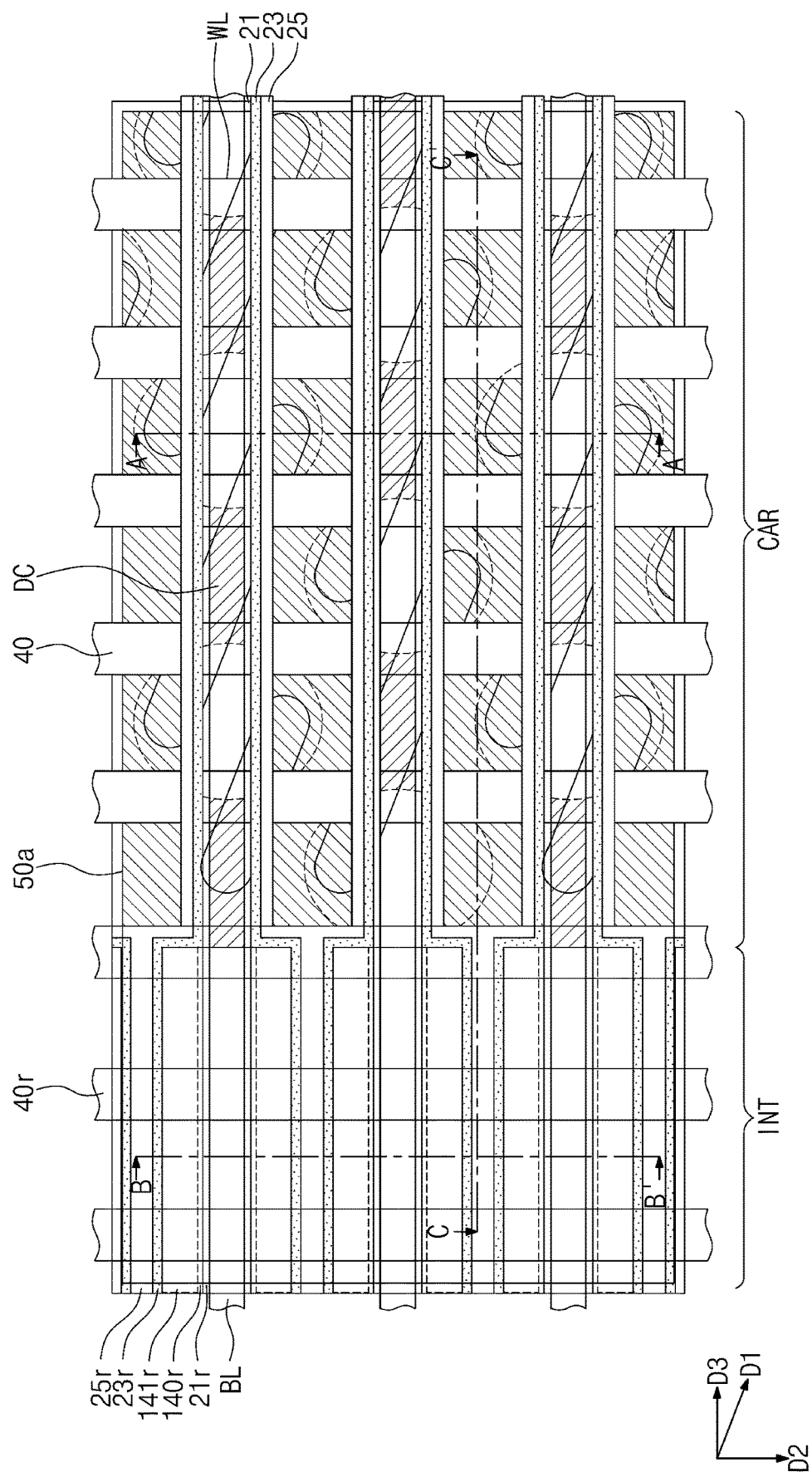
Figure 12B:
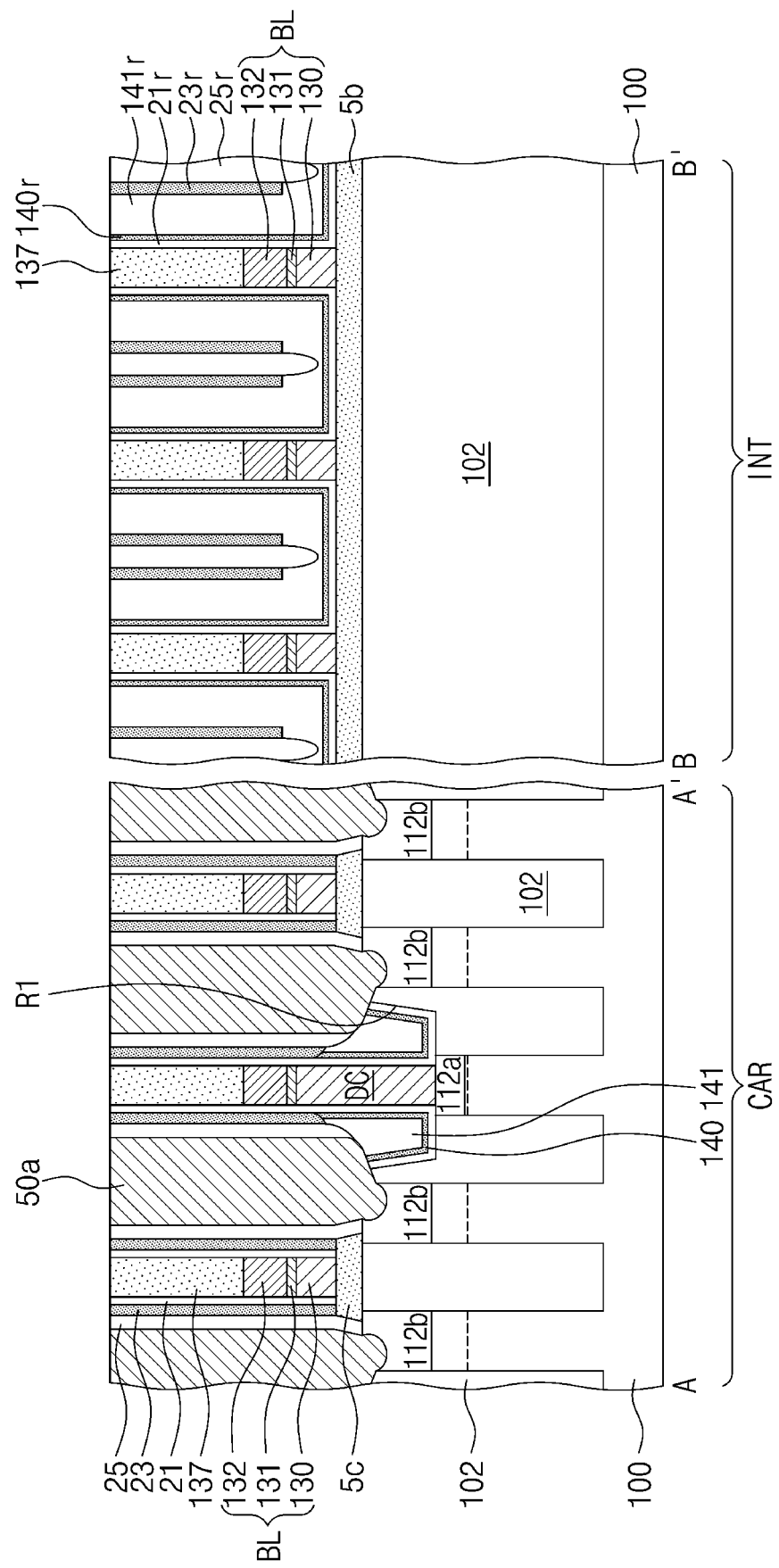
Figure 12C:
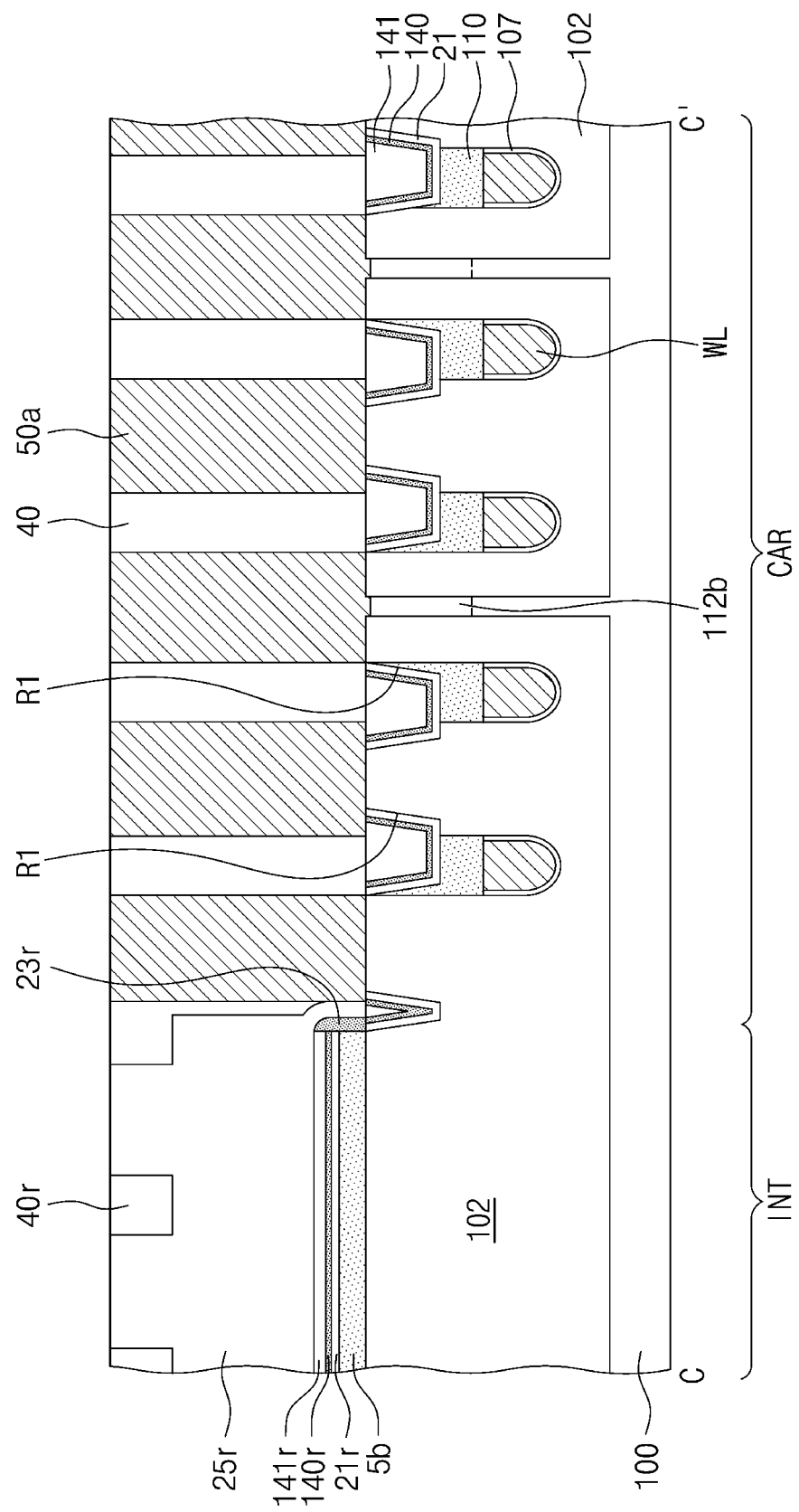

Referring to FIGS. 12A to 12C, preliminary storage node contacts 50a, which are spaced apart from each other, may be formed by etching the conductive pattern 50. In addition, an insulation fence 40 may be formed between the preliminary storage node contacts 50a by filling a space between the preliminary storage node contacts 50a with an insulating material and performing an etch-back process. Here, a boundary insulation fence 40r may be formed in the boundary region INT. The boundary insulation fence 40r may have a bottom surface higher than that of the insulation fence 40. For example, the bottom surface of the boundary insulation fence 40r may be in contact with an upper portion of the third residual spacer pattern 25r. Each of the insulation fence 40 and the boundary insulation fence 40r may have at least one single layer or multi-layer of a silicon oxide layer, a silicon nitride layer, and a silicon oxynitride layer.

Figure 13A:
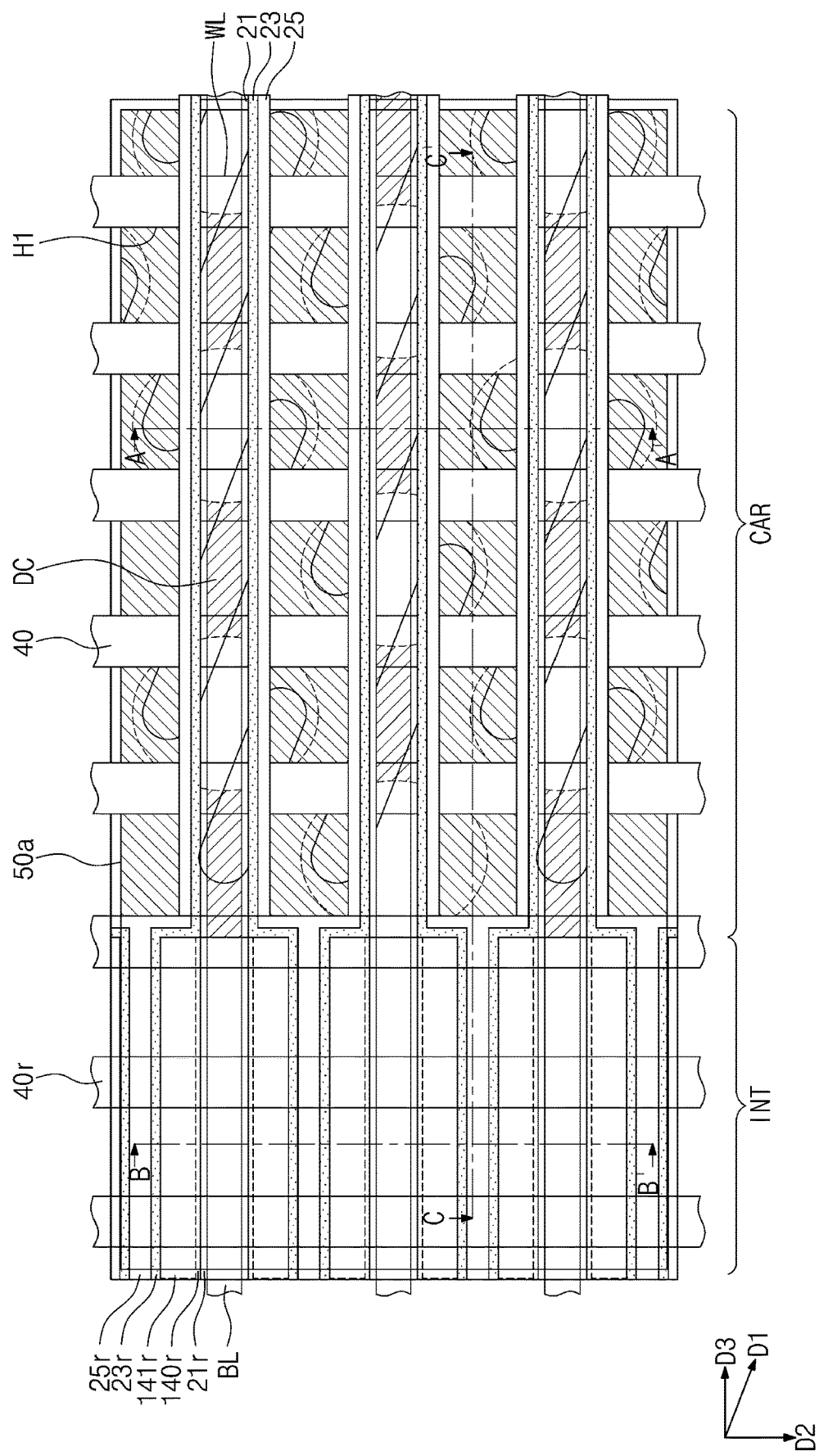
Figure 13B:
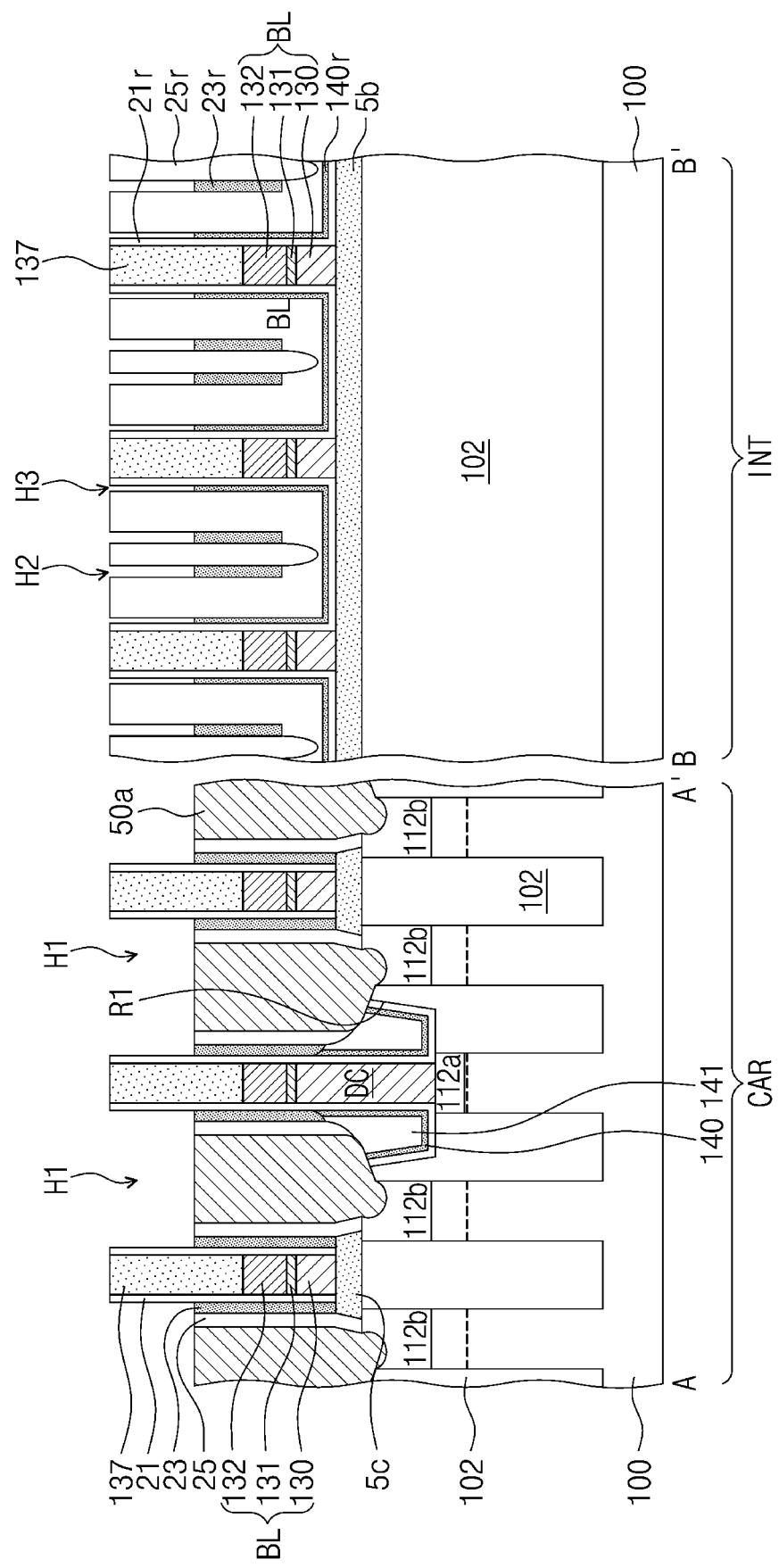
Figure 13C:
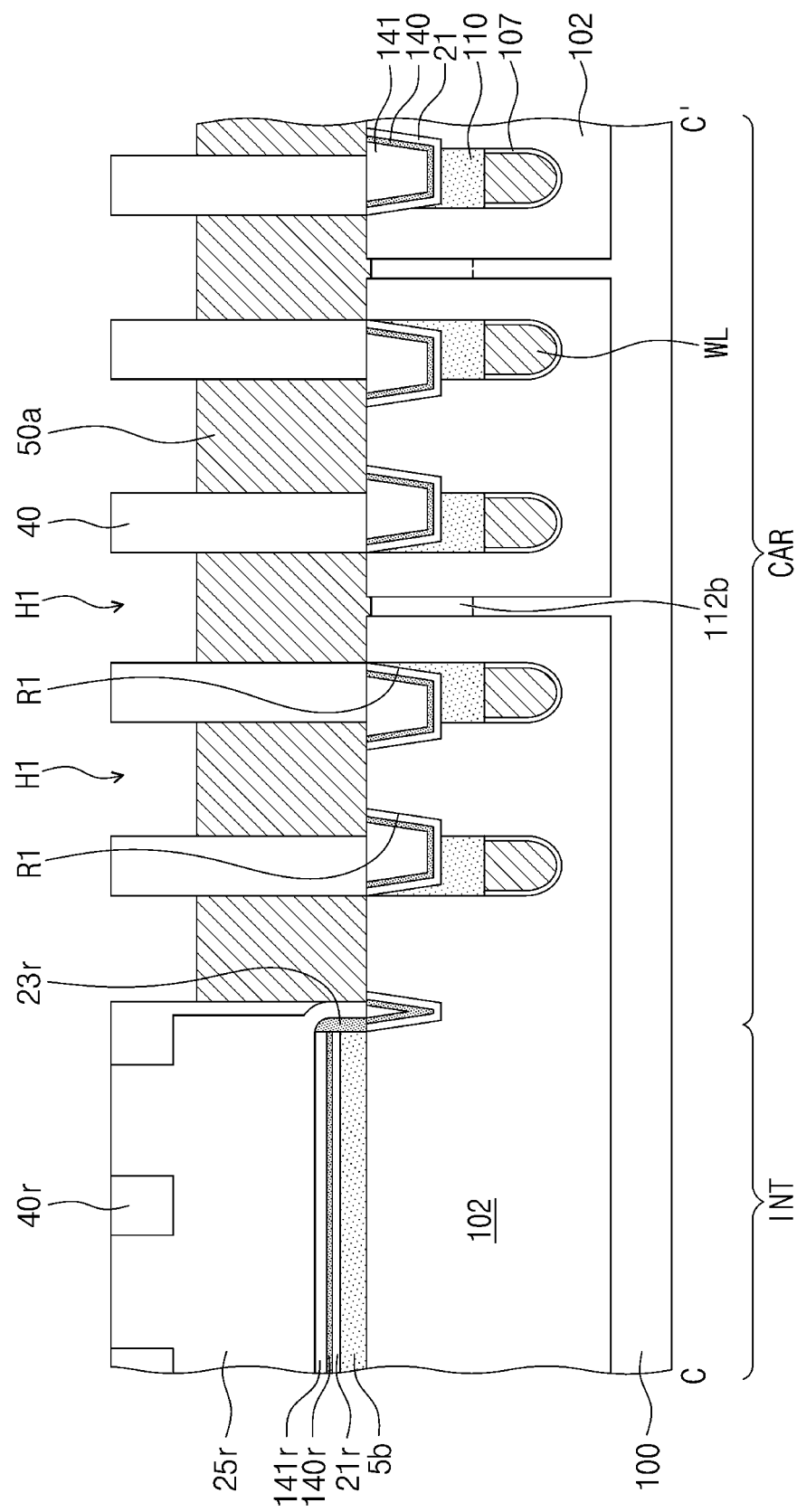

Referring to FIGS. 13A to 13C, an upper portion of the preliminary storage node contacts 50a may be partially removed in the cell array region CAR to expose an upper sidewall of the third spacer 25. A first hole H1 exposing an upper sidewall of the first spacer 21 may be formed by partially removing upper portions of the second and third spacers 23 and 25. Here, each of top surfaces of the second and third spacers 23 and 25 may have a height equal or similar to that of a top surface of the, preliminary storage node contact 50a. When the second spacer 23 is partially removed, the second residual spacer pattern 23r and the boundary insulation liner 140r may be partially removed in the boundary region INT to form a second hole H2 and a third hole H3, respectively.

Figure 14A:
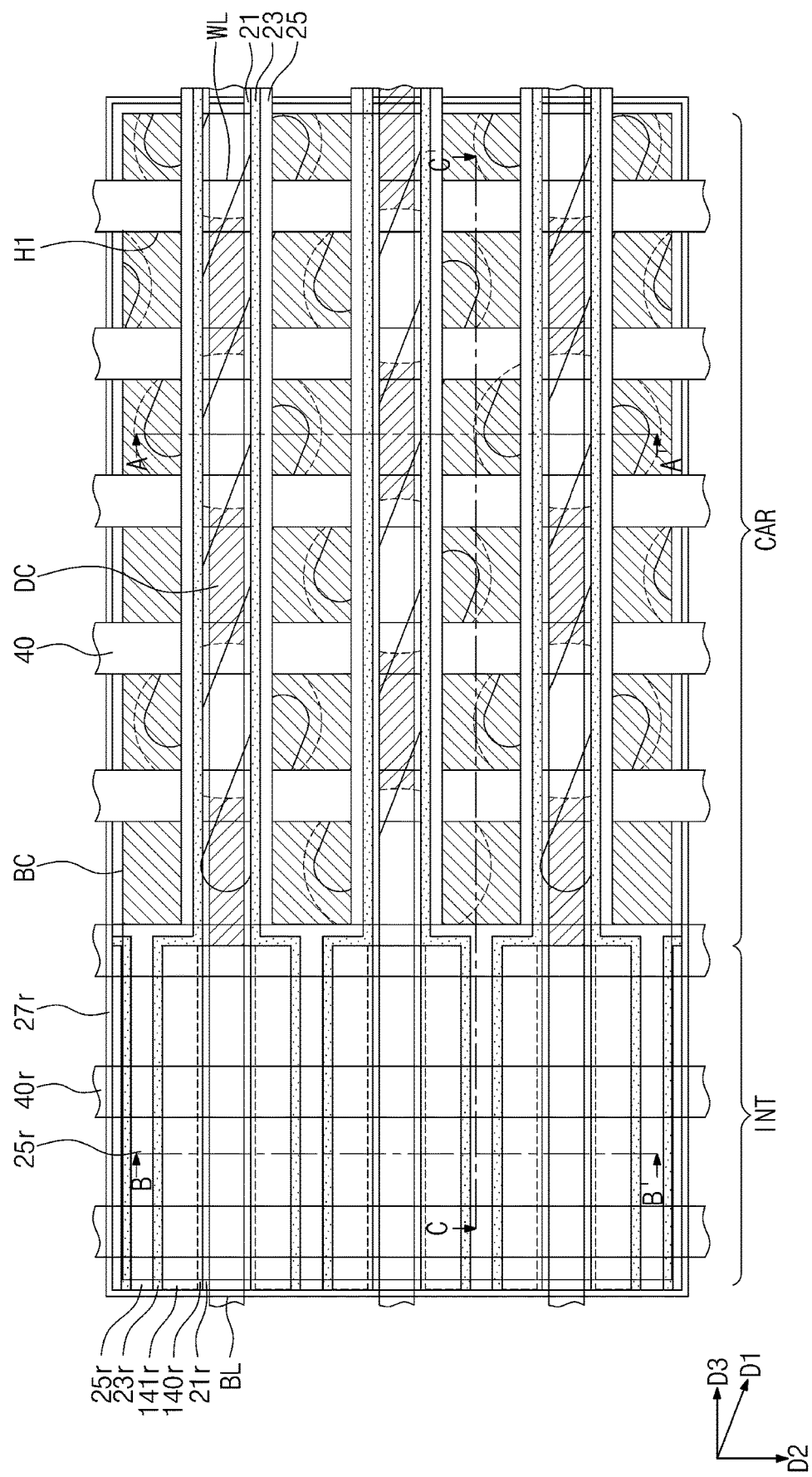
Figure 14B:
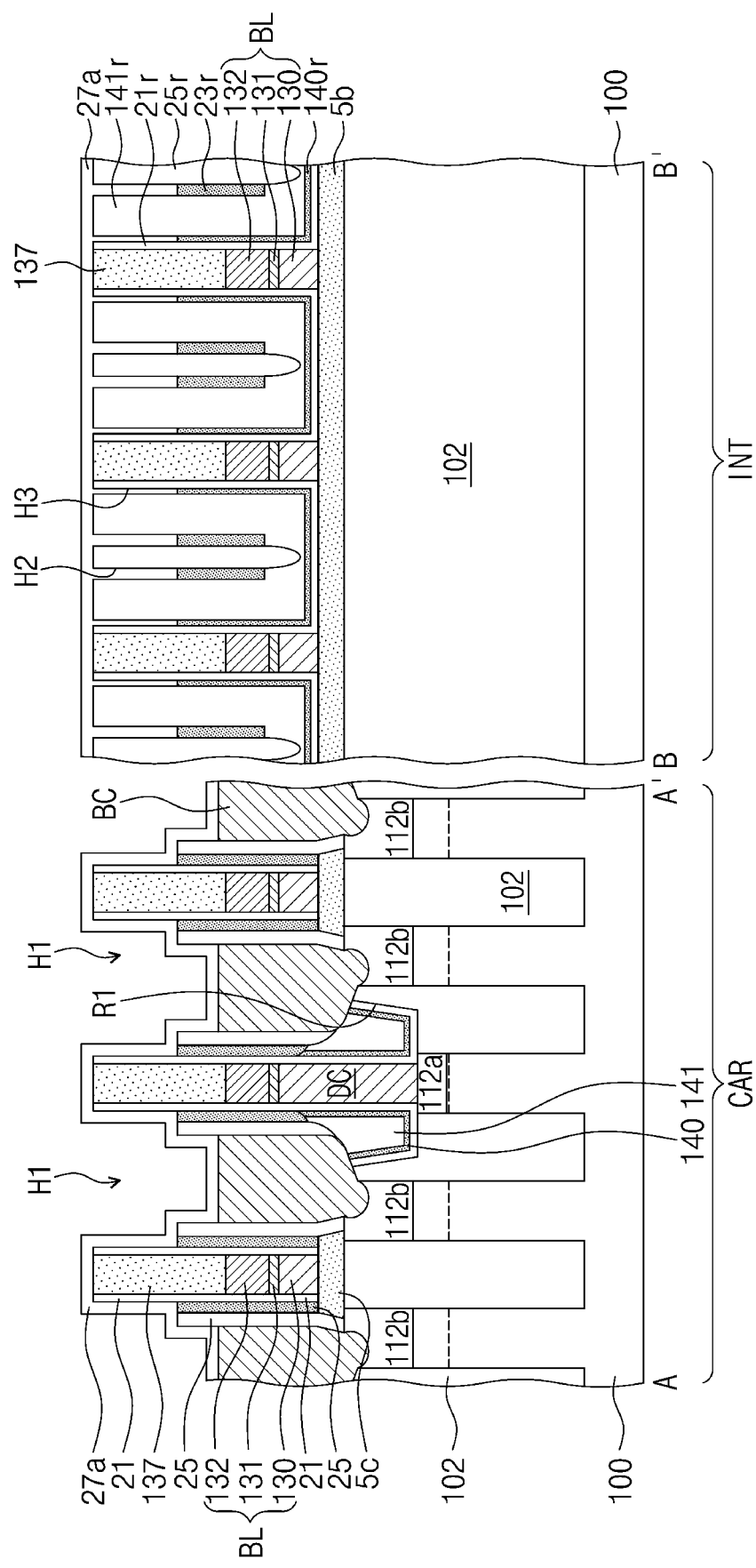
Figure 14C:
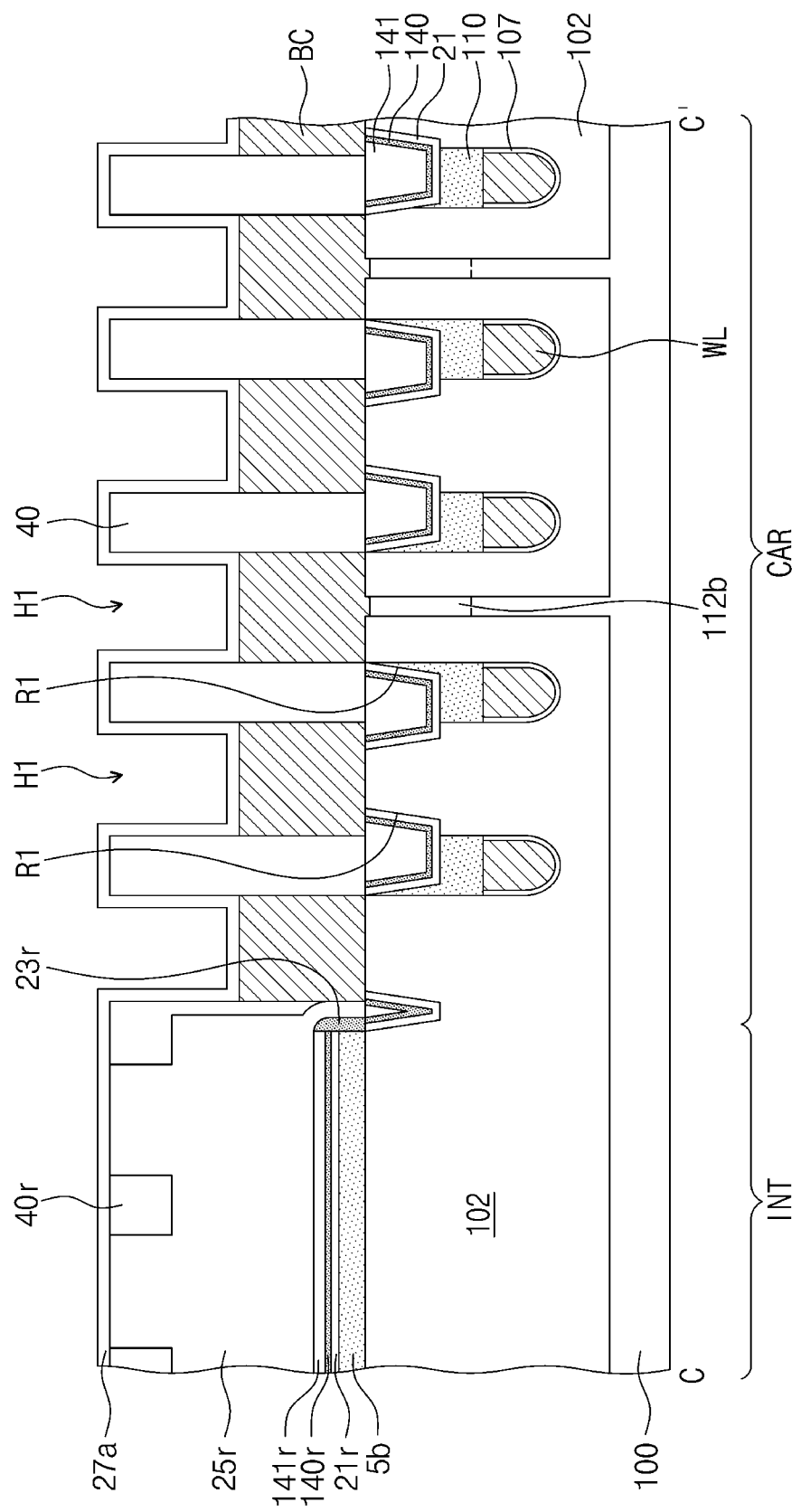

Referring to FIGS. 14A to 14C, the preliminary storage node contacts 50a may be partially removed to expose an upper sidewall of the third spacer 25 and form a storage node contact BC. A fourth spacer layer 27a may be conformally formed on the front surface of the substrate 100. The fourth spacer layer 27a may cover an upper sidewall of the first spacer 21, an upper sidewall of the third spacer 25, and a top surface of the storage node contact BC while filling the second hole H2 and the third hole H3. The fourth spacer layer 27a may be formed of, e.g., a silicon nitride layer.

Figure 15A:
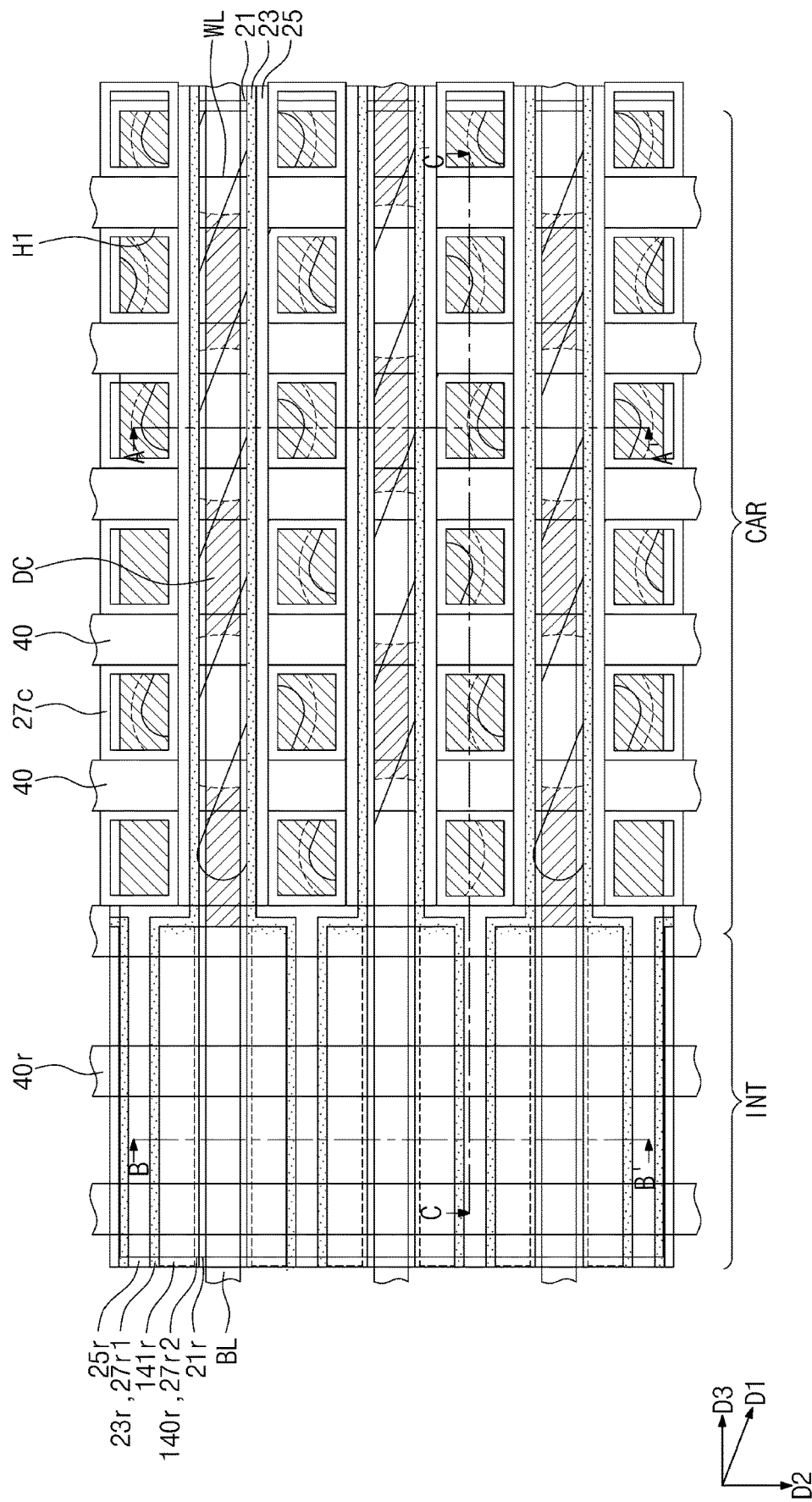
Figure 15B:
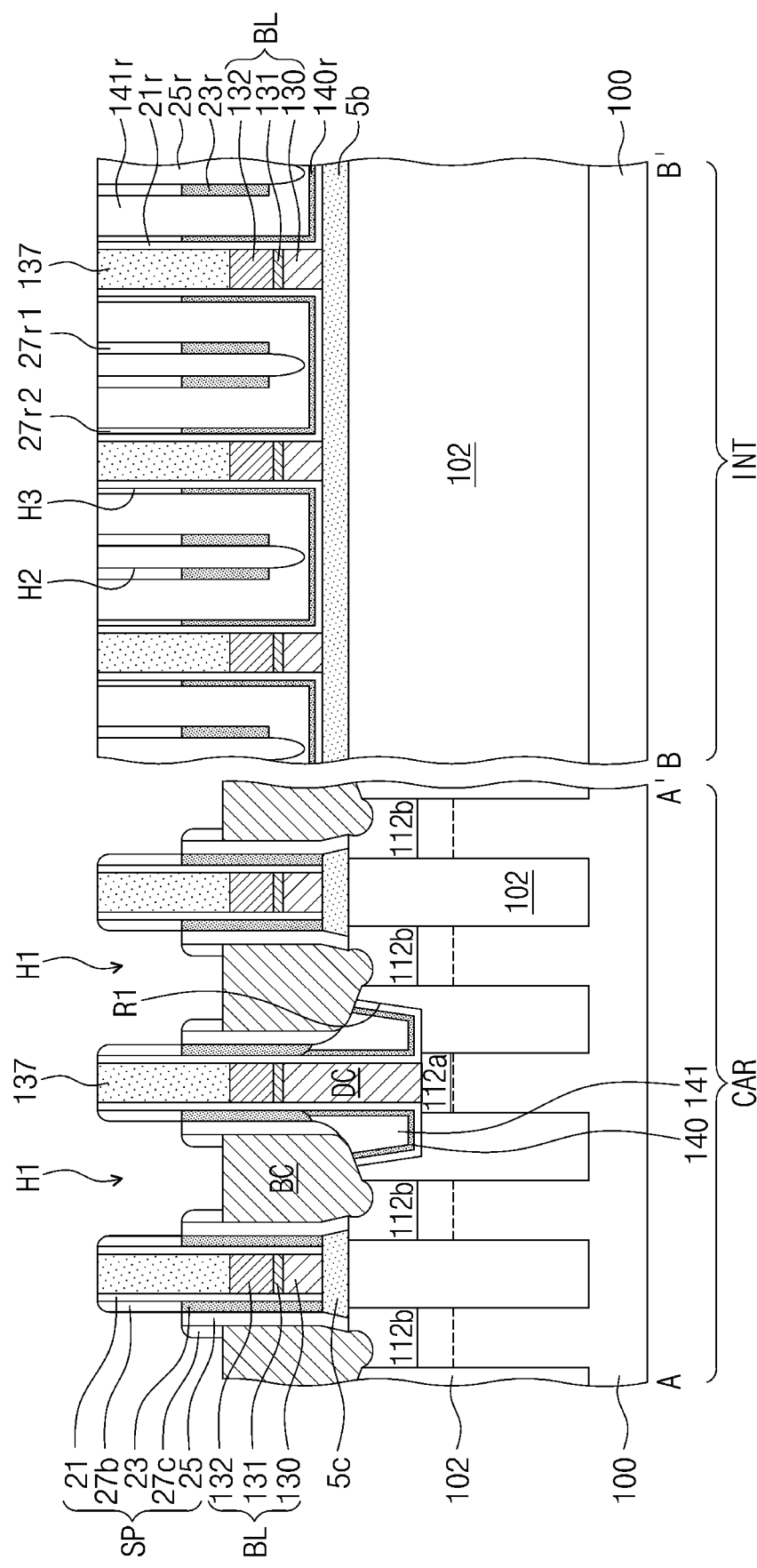
Figure 15C:
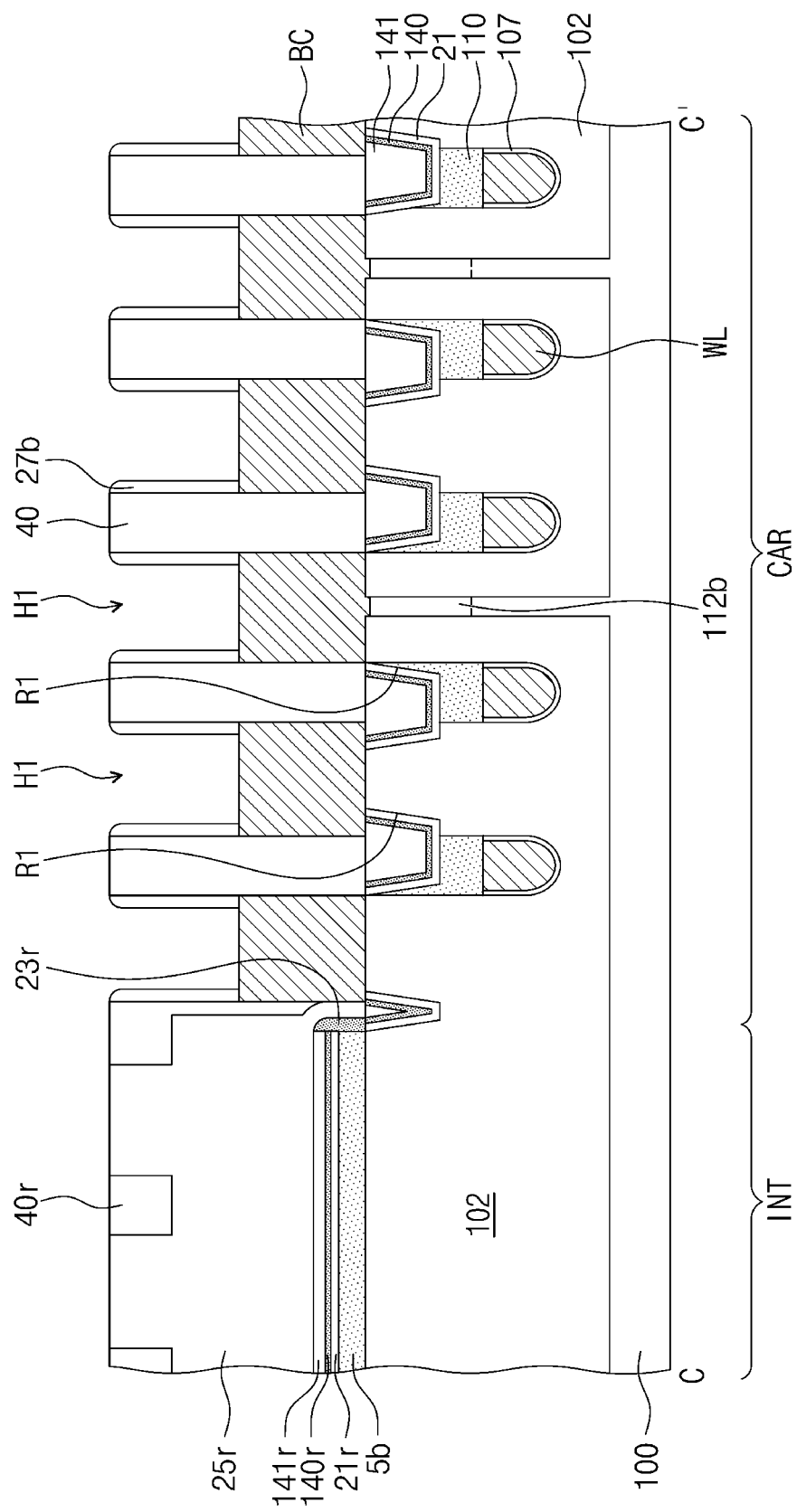

Referring to FIGS. 15A to 15C, a fourth spacer 27b covering the upper sidewall of the first spacer 21 and a fifth spacer 27c covering the upper sidewall of the third spacer 25 may be formed by performing an anisotropic etching process on the fourth spacer layer 27a. The fourth spacer 27b may be disposed above the fifth spacer 27c. Here, a fourth residual spacer pattern 27r1 may be formed in the second hole H2, and a fifth residual spacer pattern 27r2 may be formed in the third hole H3. In addition, a top surface of the storage node contacts BC may be exposed. All of the fourth spacer 27b, the fifth spacer 27c, the fourth residual spacer pattern 27r1, and the fifth residual spacer pattern 27r2 may be formed as a portion of the fourth spacer layer 27a. Through the above-described processes, the space between the bit lines BL the boundary region INT may be buried by the boundary buried insulation pattern 141r, the boundary insulation liner 140r, and the first to fifth residual spacer patterns 21r, 23r, 25r, 27r1, and 27r2.

Referring to FIGS. 1A to 1C again, a cleaning process may be performed to remove etching by-products on the top surface of the storage node contact BC. In addition, an ohmic layer may be formed on the top surface of the storage node contacts BC. For example, the ohmic layer may be formed of a metal suicide layer such as cobalt silicide. After the ohmic layer is formed, a diffusion prevention layer may be conformally formed on the front surface of the substrate 100. The diffusion prevention layer may be formed of, e.g., a titanium nitride layer, a tantalum nitride layer, or a tungsten nitride layer. Landing pads LP may be formed by forming a metal containing layer on the front surface of the substrate 100 to fill a space between the bit line capping patterns 137 and then patterning the same. The metal containing layer may be, e.g., tungsten. When the landing pads LP are formed, boundary lines 150 may be formed in the boundary region INT. In addition, a landing pad separation pattern 148 may be formed between the landing pads LP. In addition, an upper interlayer insulation pattern 152 may be formed between the boundary lines 150.

In an exemplary embodiment of the inventive concept, the space between the bit lines BL may be buried by the boundary buried insulation pattern 141r, the first to fifth residual spacer patterns 21r, 23r, 25r, 27r1, and 27r2, and the like. If the space between the bit lines BL in the boundary region INT is not filled, when a conductive layer for forming the landing pad LP and the boundary line 150 is formed, the conductive layer may be inserted and remain between the bit lines BL to generate a bridge in which the boundary line 150 is electrically connected to the storage node contact BC or the bit line contact DC adjacent thereto. However, in an exemplary embodiment of the inventive concept, the bridge between the bit line boundary line and the storage node contact or the bit line contact adjacent thereto may be prevented from being generated by filling the space between the bit lines in the boundary region with a portion of layers forming the insulation patterns (e.g., the cell buried insulation pattern, the cell insulation liner, and the bit line spacer) adjacent to the bit line in the cell region. Thus, the semiconductor memory device may be prevented from malfunctioning and improve in reliability.

Figure 16A:
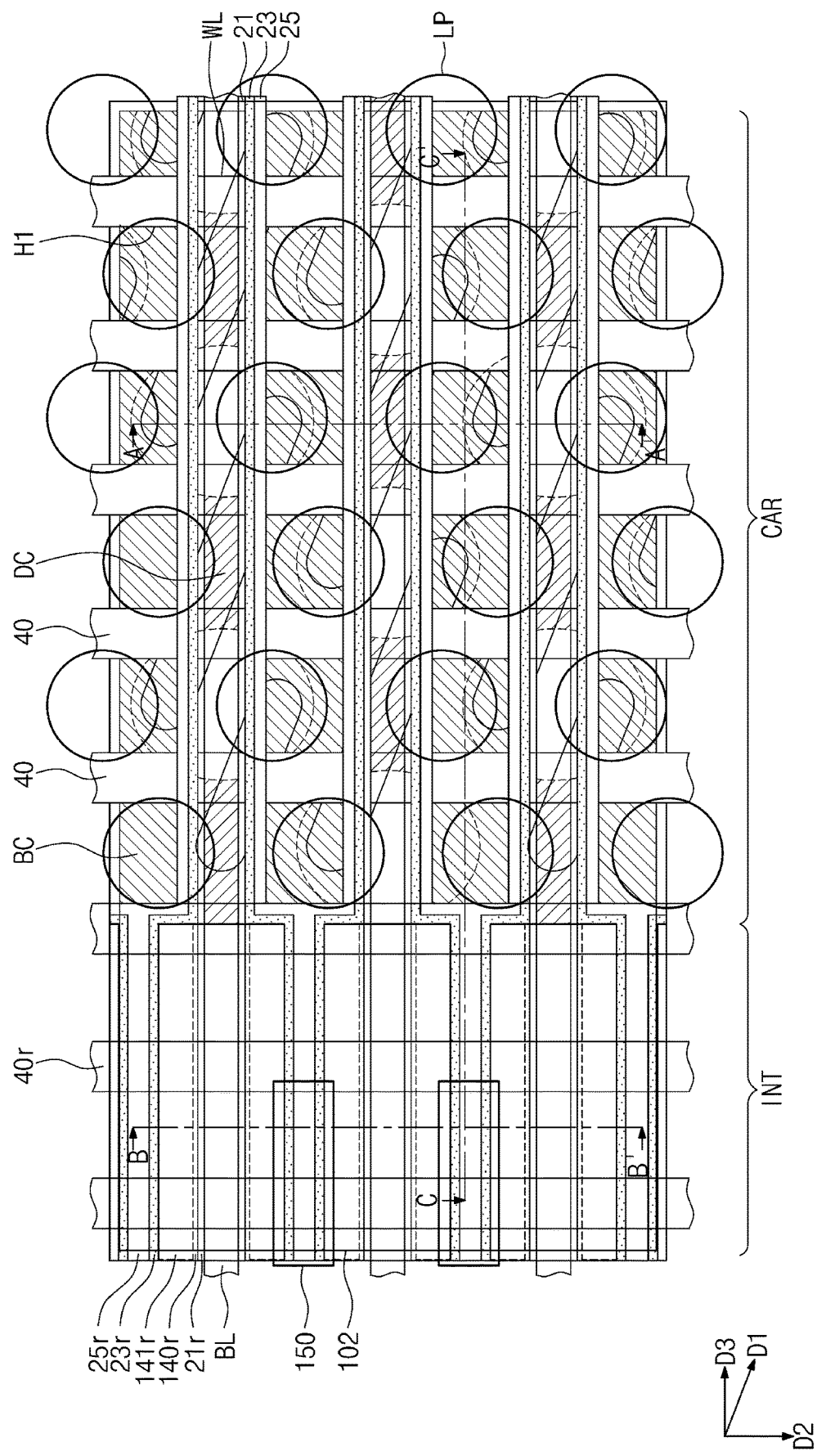
FIG. 16A is a plan view illustrating a semiconductor memory device according to exemplary embodiments of the inventive concept.
Figure 16B:
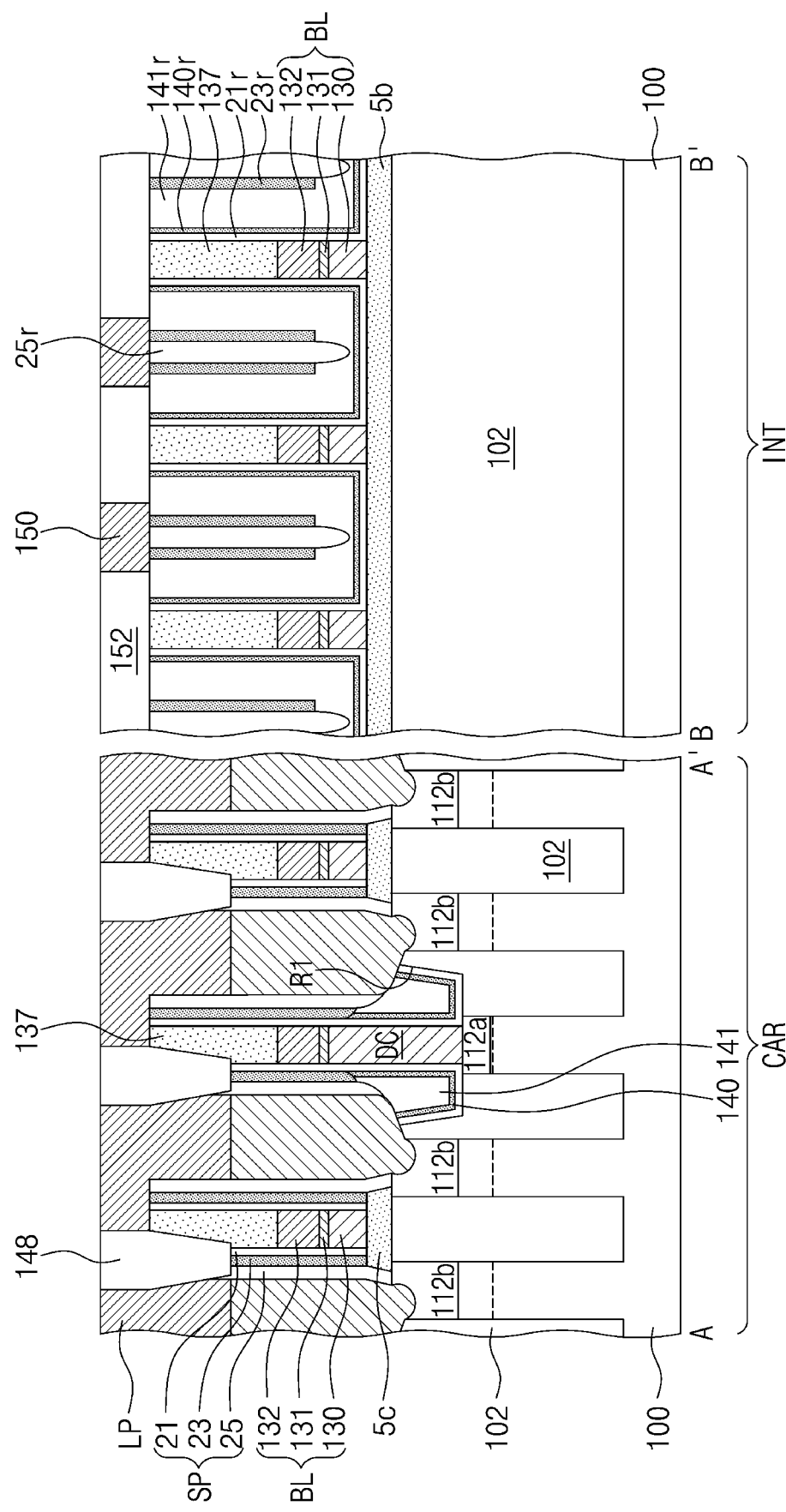
FIG. 16B is a cross-sectional view taken along line A-A' and line B-B' of FIG. 16A according to exemplary embodiments of the inventive concept.
Figure 16C:
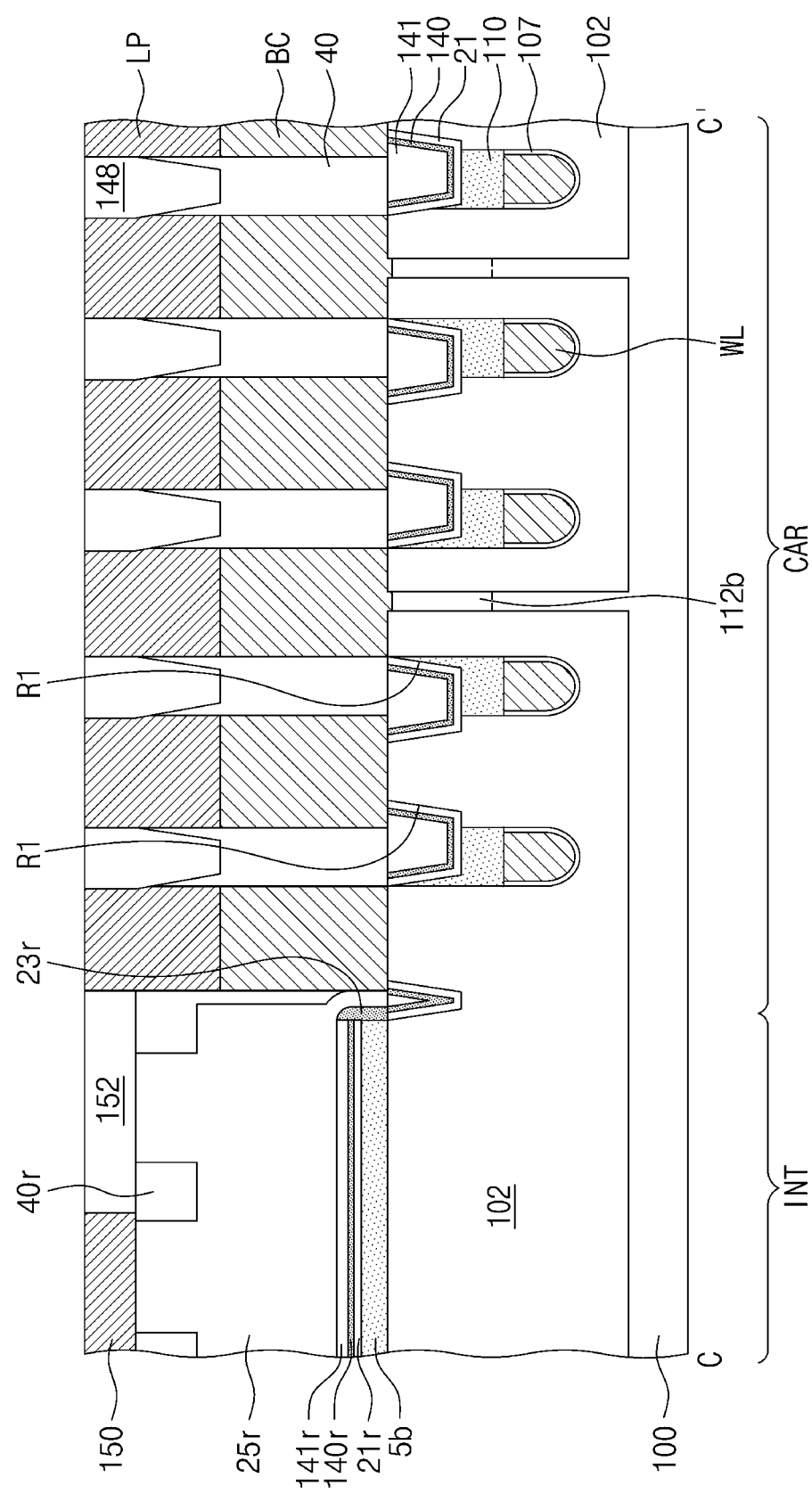
FIG. 16C is a cross-sectional view taken along line C-C' of FIG. 1A according to exemplary embodiments of the inventive concept.

FIG. 16A is a plan view illustrating a semiconductor memory device according to exemplary embodiments of the inventive concept. FIG. 16B is a cross-sectional view taken along line A-A' and line B-B' of FIG. 16A according to exemplary embodiments of the inventive concept. FIG. 16C is a cross-sectional view taken along line C-C' of FIG. 16A according to exemplar embodiments of the inventive concept.

Referring to FIGS. 16A to 16C, a semiconductor memory device according to an exemplary embodiment of the inventive concept does not include the fourth spacer 27b, the fifth spacer 27c, the fourth residual spacer pattern 27r1, and the fifth residual spacer pattern 27r2 of FIGS. 1A to 1C. First to third spacers 21, 23, and 25 may constitute a bit line spacer SP in a cell array region CAR. The first to third spacers 21, 23, and 25 may have top surfaces having the same height as each other. In other words, top surfaces of the first to third spacers 21, 23, and 25 may be coplanar. Top surfaces of first to third residual spacer patterns 21r, 23r, and 25r, a boundary buried insulation pattern 141r, and a boundary in liner 140r may be positioned at the same height as a top surface of a bit line capping, pattern 137 in a boundary region INT. The rest of the structures may be the same as or similar to those described with reference to FIGS. 1A to 1C.

Figure 17A:
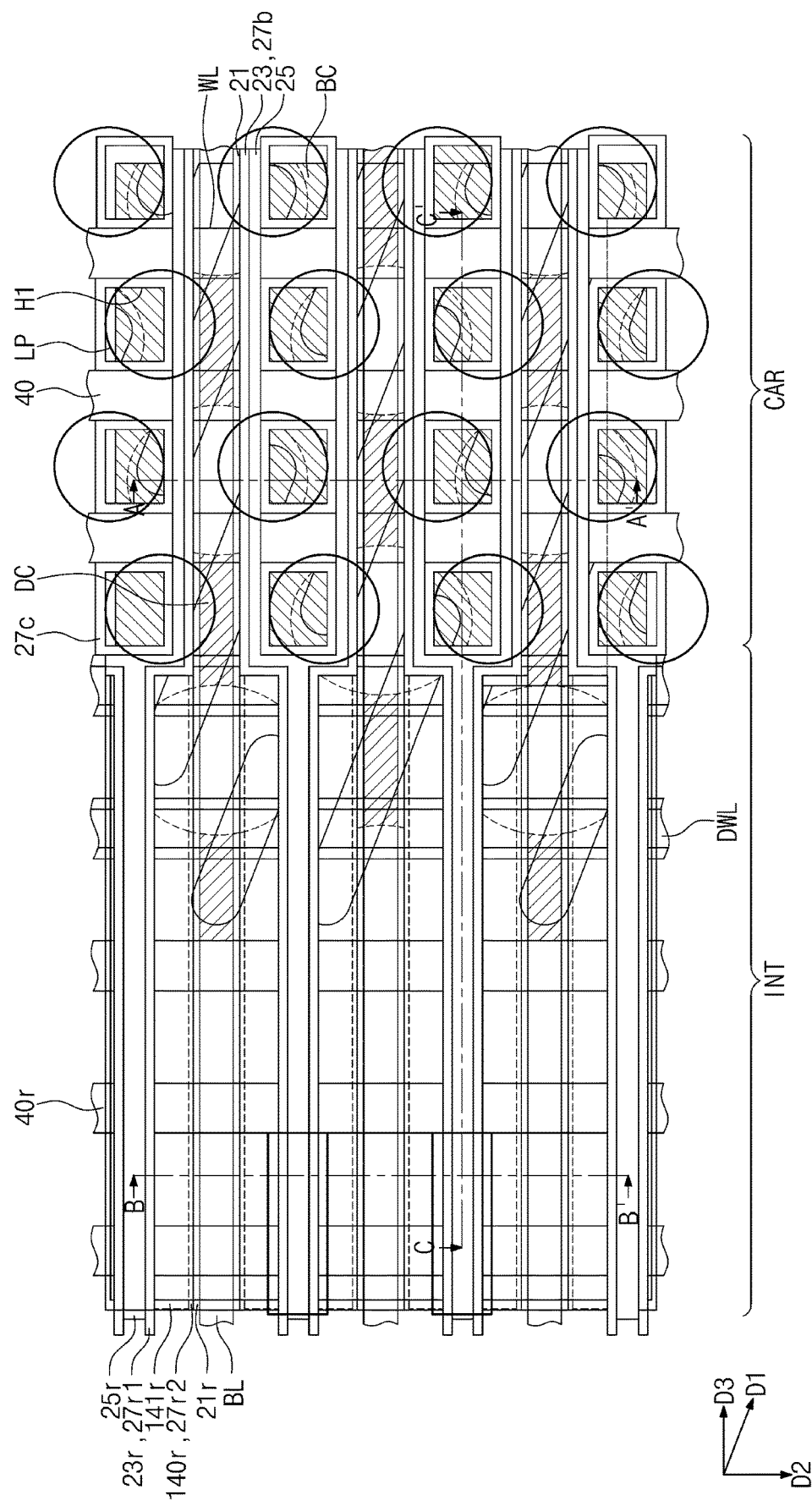
FIG. 17A is a plan view illustrating a semiconductor memory device according to exemplary embodiments of the inventive concept.
Figure 17B:
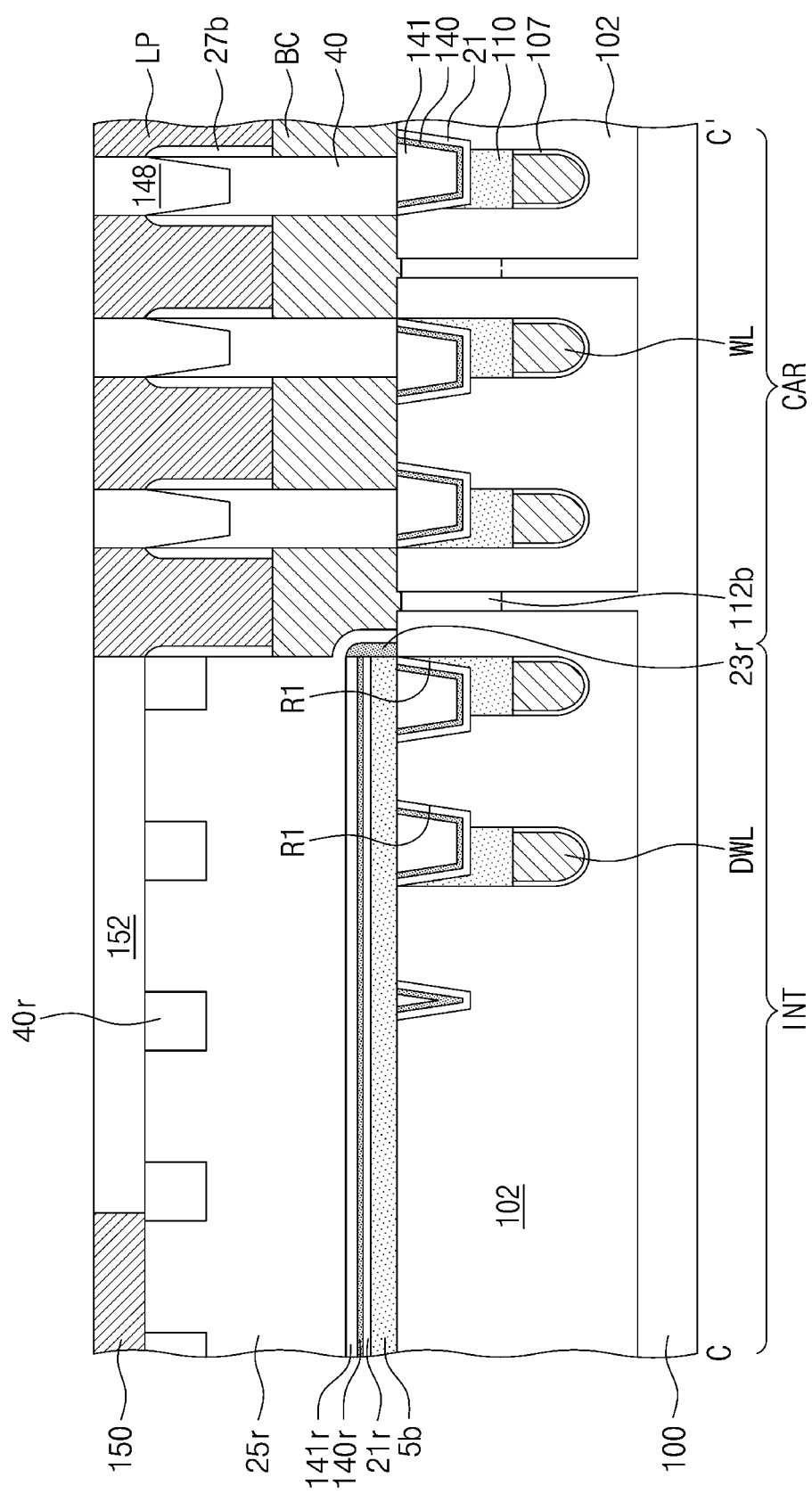
FIG. 17B is a cross-sectional view taken along line C-C of FIG. 17A according to exemplary embodiments of the inventive concept.

FIG. 17A is a plan view illustrating a semiconductor memory device according to exemplary embodiments of the inventive concept. FIG. 17B is a cross-sectional view taken along line C-C' of FIG. 17A according to exemplary embodiments of the inventive concept. The cross-sections taken along lines A-A' and B-B' of FIG. 17A may be the same as or similar to those of FIG. 1B. Referring to FIGS. 17A and 17B, a portion of dummy word lines DWL may be disposed in a boundary region INT adjacent to a cell array region CAR. The dummy word lines DWL may not operate. On the cross-section of FIG. 17B, a third residual spacer pattern 25r may overlap the dummy word lines DWL. In addition, a word line capping pattern 110, a first recess region R1, a first spacer 21, a cell insulation liner 140, and a cell buried insulation pattern 141 may be disposed on the dummy word lines DWL. The rest of the structures may be the same as or similar to those described with reference to FIGS. 1A to 1C. The dummy word lines DWL may be formed in a pattern under the same process conditions at an edge of a cell array region CAR in etching and deposition processes. The semiconductor memory device of FIGS. 17A and 17B may be fabricated by forming the second mask pattern 142 in FIG. 6C to cover the dummy word lines DWL and then performing a follow-up process.

Figure 18A:
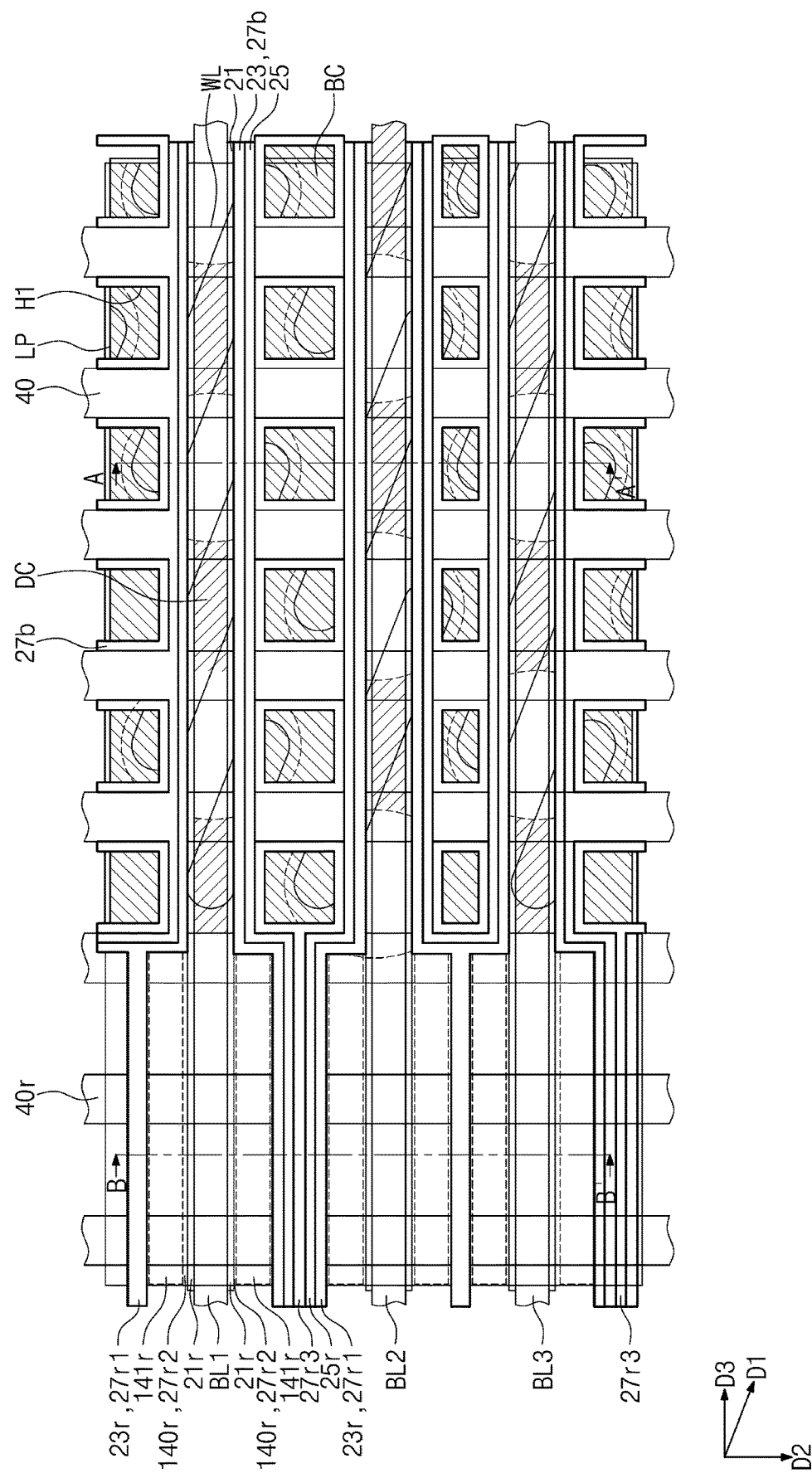
FIG. 18A is a plan view illustrating a semiconductor memory device according to exemplary embodiments of the inventive concept.
Figure 18B:
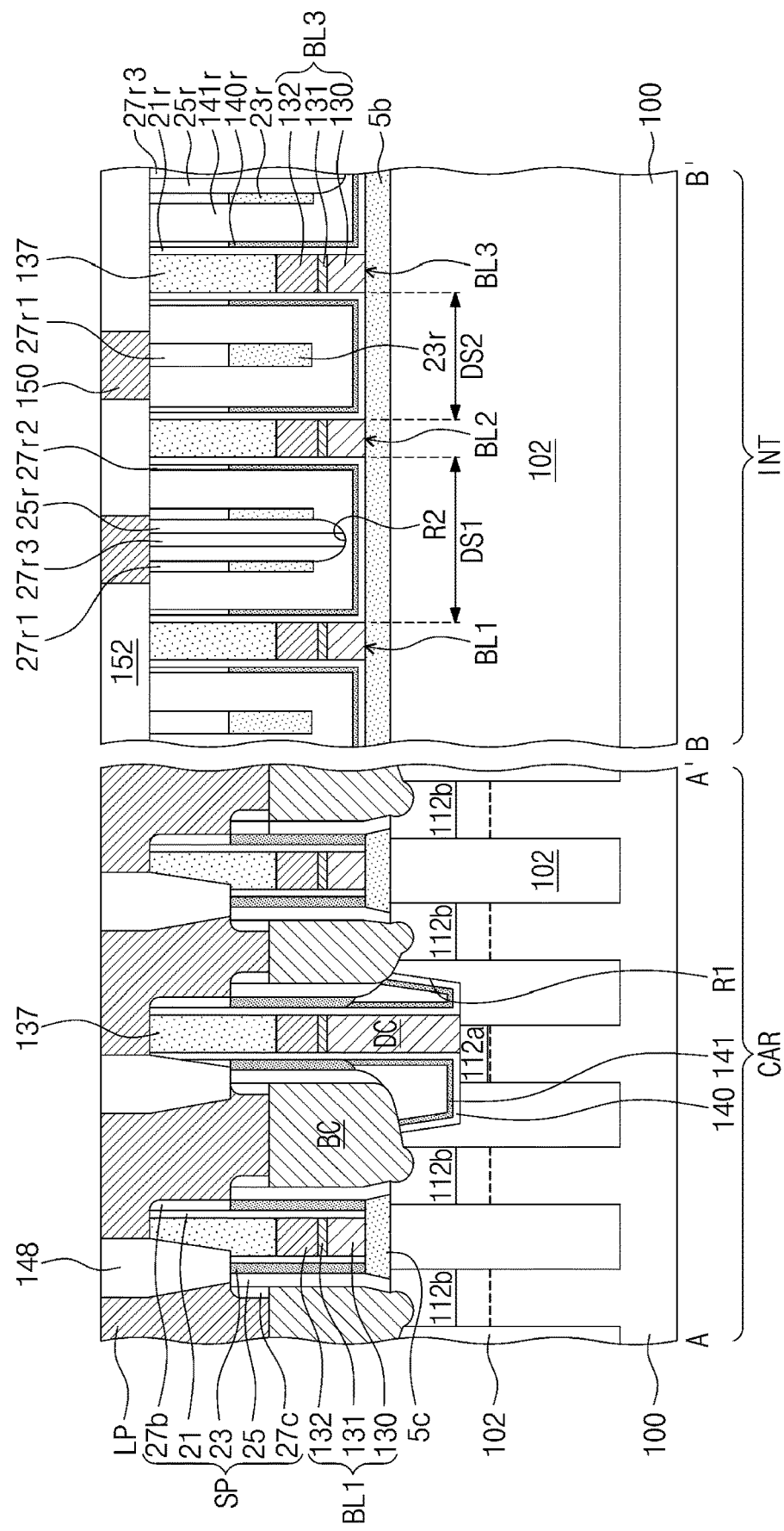
FIG. 18B is a cross-sectional view taken along line A-A' and line B-B' of FIG. 18A according to exemplary embodiments of the inventive concept.

FIG. 18A is a plan view illustrating a semiconductor memory device according to exemplary embodiments of the inventive concept. FIG. 18B is a cross-sectional view taken along line A-A' and line B-B' of FIG. 18A according to exemplary embodiments of the inventive concept.

Referring to FIGS. 18A and 18B, first to third bit lines BL1, BL2, and BL3, which are spaced apart from each other, may be disposed or the substrate 100. Each of the first to third bit lines BL1, BL2, and BL3 may include a bit line polysilicon pattern 130, a bit line ohmic pattern 131, and a bit line metal containing pattern 132, which are sequentially laminated. The second bit line BL2 may be disposed between the first and third bit lines BL1 and BL3. The second bit line BL2 may be spaced from the first bit line BL1 by a first distance DS1. The second bit line BL2 may be spaced from the third bit line BL3 by a second distance DS2. The first distance DS1 may be greater than the second distance DS2. A third residual spacer pattern 25r and a sixth residual spacer pattern 27r3 may be disposed between fourth residual patterns 27r1 between the first and second bit lines BL1 and BL2. The sixth residual spacer pattern 27r3 may include the same material as the fourth residual spacer pattern 27r1. The third residual spacer pattern 25r is not disposed between the second bit line BL2 and the third bit line BL3. This can lead to the second distance DS2 being less than the first distance DS1. The second residual spacer pattern 23r disposed between the first and second bit lines BL1 and BL2 may have a width less than that of the second residual spacer pattern 23r disposed between the second and third bit lines BL2 and BL3. The rest of the structures may be the same as or similar to those described with reference to FIGS. 1A to 1C.

Figure 19:
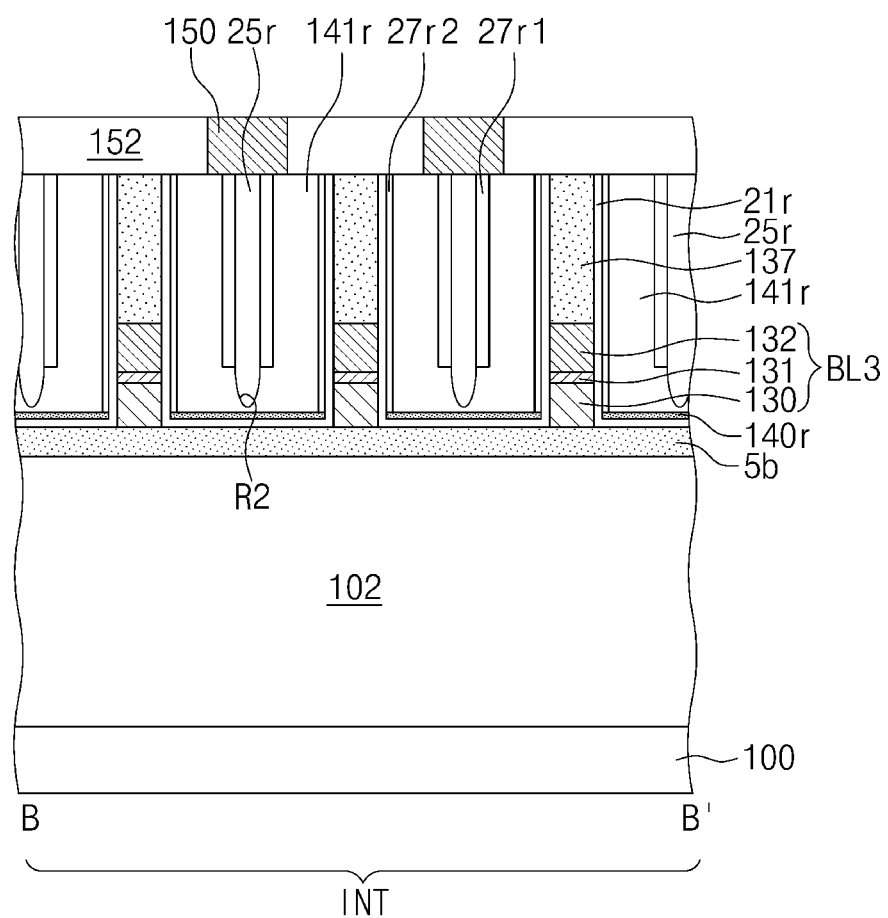
FIG. 19 is a cross-sectional view taken along line B-B' of FIG. 1A according to exemplary embodiments of the inventive concept.

FIG. 19 is a cross-sectional view taken along line B-B' of FIG. 1A according to exemplary embodiments of the inventive concept.

Referring to FIG. 19, in a semiconductor memory device according to an exemplary embodiment of the inventive concept, a second residual spacer pattern 23r and a boundary insulation liner 140r may not be disposed between upper portions of bit lines BL and between bit line capping patterns 137 in a boundary region INT. Only a fourth residual spacer pattern 27r1 may be disposed between a third residual spacer pattern 25r and a boundary buried insulation pattern 141r. The boundary insulation liner 140r may remain between a first residual spacer pattern 21r and the boundary buried insulation pattern 141r while being adjacent to lower ends of the bit lines BL. In addition, a fifth residual spacer pattern 27r2 may extend to be adjacent to the lower ends of the bit lines BL. For example, the fifth residual spacer pattern 27r2 may contact the boundary etch stop pattern 5b. The rest of the structures may be the same as or similar to those described with reference to FIGS. 1A to 1C.

The semiconductor memory device of FIG. 19 may be formed such that the second residual spacer patterns 23r are completely removed and an upper portion of the boundary insulation liner 140r is removed in the processes of FIGS. 14A to 14C. Although the second residual spacer patterns 23r are completely removed and the upper portion of the boundary insulation liner 140r is removed as described above, the fourth and fifth residual spacer patterns 27r1 and 27r2 are filled in the locations where the second residual spacer patters 23r and the upper portion of the boundary insulation liner 140r are not shown. Thus, since a metal containing layer is not inserted between the bit lines BL in the boundary region INT when the landing pad LP and the boundary line 150 are formed, a bridge between the boundary line 150 and a storage node contact BC or a bit line contact DC adjacent thereto may be prevented.

The semiconductor memo device and the method of fabricating the same according the above-described exemplary embodiments of the inventive concept may prevent the bridge between the bit line boundary line and the storage node contact or the bit line contact adjacent thereto by filling the space between the bit lines in the boundary region with a portion of the layers forming the insulation patterns (e.g., the cell buried insulation pattern, the cell insulation liner, and the bit line spacer), which are adjacent to the bit line in the cell array region. Thus the semiconductor memory device having improved reliability may be provided.

Although the inventive concept has been described with reference to exemplary embodiments thereof, it is understood that the inventive concept is not limited to these exemplary embodiments and that various changes and modifications can be made thereto by one of ordinary skill in the art.

What is claimed is:

1. A semiconductor memory device comprising:
   a substrate comprising a cell array region and a boundary region;
   a first recess region disposed at an upper portion of the substrate in the cell array region, a first bit line extending onto the boundary region and crossing the first recess region;
   a bit line contact disposed in the first recess region and contacting the first bit line;
   a bit line spacer covering a side surface of the bit line contact and extending along a bottom of the first recess region to cover an inner wall of the first recess region;
   a second bit line spaced apart from the first recess region and adjacent to the first bit line, the second bit line crossing the cell array region and the boundary region;
   a cell buried insulation pattern interposed between a first portion of the bit line spacer at the side surface of the bit line contact and a second portion of the bit line spacer opposite the first portion and disposed on the inner wall of the first recess region, and
   a boundary buried insulation pattern covering sidewalls of the first bit line and the second bit line in the boundary region and comprising a same material as the cell buried insulation pattern.

2. The semiconductor memory device of claim 1, further comprising:
   a cell insulation liner interposed between the cell buried insulation pattern and the inner wall of the first recess region and between the cell buried insulation pattern and a sidewall of the bit line contact; and
   a boundary insulation liner interposed between the boundary buried insulation pattern and the first bit line,
   wherein the cell insulation liner comprises a same material as the boundary insulation liner, and
   the cell insulation liner has an upper end positioned equal to or higher than an upper end of the cell buried insulation pattern.

3. The semiconductor memory device of claim 2, wherein the boundary insulation liner has an upper end lower than a top surface of the boundary buried insulation pattern.

4. The semiconductor memory device of claim 1, further comprising a bit line capping pattern disposed on each of the first and second bit lines,
   wherein the boundary buried insulation pattern covers a side surface of the bit line capping pattern, and
   the cell buried insulation pattern is lower than a top surface of the first bit line.

5. The semiconductor memory device of claim 4, wherein a top surface of the boundary buried insulation pattern is coplanar with a top surface of the bit line capping pattern.

6. The semiconductor memory device of claim 4, wherein the boundary buried insulation pattern comprises a second recess region, and
   the semiconductor memory device further comprises:
   a first residual spacer pattern disposed in the second recess region and forming part of the bit line spacer,
   wherein the bit line spacer covers a sidewall of the first bit line in the cell array region.

7. The semiconductor memory device of claim 6, further comprising a third bit line spaced apart from the first bit line with the second bit line therebetween,
   wherein the third bit line crosses the cell array region and the boundary region, and
   the second bit line is spaced front the first bit line by a first distance and spaced from the third bit line by a second distance,
   wherein the first distance is greater than the second distance.

8. The semiconductor memory device of claim 6, wherein the boundary insulation liner exposes an upper sidewall of the boundary buried insulation pattern,
   the semiconductor memory device comprises:
   a bit :line capping pattern disposed on the first bit line; and
   a second residual spacer pattern interposed between the bit line capping pattern and the upper sidewall of the boundary buried insulation pattern,
   the bit line spacer comprises:
   a first spacer contacting sidewalls of the first bit line and the bit line capping pattern in the cell array region; and
   a second spacer covering an upper sidewall of the first spacer, and
   the second residual spacer pattern comprises a same material as the second spacer.

9. The semiconductor memory device of claim 7, wherein the bit line spacer comprises:
   a first spacer covering a sidewall of the first bit line and protruding upward from a top surface of the first bit line in the cell array region; and
   a second spacer covering an upper sidewall of the first spacer,
   wherein the semiconductor memory device further comprises a second residual spacer pattern disposed in the second recess region to contact the first residual spacer pattern in the boundary region, and
   wherein the second residual spacer pattern comprises a same material as the second spacer.

10. The semiconductor memory device of claim 7, wherein the bit line spacer comprises:
    a first spacer covering a sidewall of the first bit line and protruding upward from a top surface of the first bit line in the cell array region; and
    a second spacer covering a sidewall of the first spacer and comprising a material different from the first spacer,
    wherein the semiconductor memory device further comprises:
    a second residual spacer pattern disposed between the boundary buried insulation pattern and the first residual spacer pattern, and between the first bit line and the second bit line in the boundary region; and
    a third residual spacer pattern disposed between the second bit line and the third bit line,
    wherein each of the second residual spacer pattern and the third residual spacer pattern comprises a same material as the second spacer, and wherein, the third residual spacer pattern has a width greater than a width of the second residual spacer pattern.

11. The semiconductor memory device of claim 10, wherein the first residual spacer pattern is disposed between the first bit line and the second bit line and is absent between the second bit line and the third bit line.

12. The semiconductor memory device of claim 6, wherein the bit line spacer comprises:
a first spacer contacting a sidewall of the first hit line in the cell array region;
a second spacer spaced apart from the first bit line and contacting a sidewall of the first spacer; and
a third spacer spaced apart from the first spacer and contacting a sidewall of the second spacer, and
the first residual spacer pattern comprises a same material as the third spacer.

13. The semiconductor memory device of claim 12, further comprising a second residual spacer pattern interposed between the first residual spacer pattern and the boundary buried insulation pattern,
wherein the second residual spacer pattern comprises a same material as the second spacer.

14. The semiconductor memory device of claim 13, wherein the second spacer and the third spacer expose an upper sidewall of the first spacer,
the second residual spacer pattern exposes an upper sidewall of the boundary buried insulation pattern,
the bit line spacer further comprises a fourth spacer covering the upper sidewall of the first spacer in the cell array region,
the semiconductor memory device further comprises a third residual spacer pattern interposed between an upper sidewall of the boundary buried insulation pattern and the first residual spacer pattern, and
the third residual pattern comprises a same material as the fourth spacer.

15. The semiconductor memory device of claim 13, wherein the first residual spacer pattern has a lower end closer to the substrate than a lower end of the second residual spacer pattern.

16. The semiconductor memory device of claim 13, Wherein the second residual spacer pattern has an upper end lower than a top surface of the boundary buried insulation pattern.

17. A semiconductor memory device comprising:
a substrate comprising a cell array region and a boundary region;
a first recess region disposed at an upper portion of the substrate in the cell array region;
a first bit line extending onto the boundary region and crossing the first recess region;
a second bit line spaced apart from the first recess region and adjacent to the first bit line, the second bit line crossing the cell array region and the boundary region;
first, second and third spacers sequentially covering a sidewall of the first bit line in the cell array region, the third spacer comprising a material different from the second spacer;
a cell buried insulation pattern interposed between a first portion of the first spacer at the sidewall of the first bit line and a second portion of the first spacer opposite the first portion and disposed on an inner wall of the first recess region and contacting a storage node contact;
a boundary buried insulation pattern covering sidewalls of the first bit line and the second bit line in the boundary region, comprising a second recess region, and comprising a same material as the cell buried insulation pattern; and
a first residual spacer pattern disposed in the second recess region and comprising a same material as the third spacer.

18. A semiconductor memory device comprising:
a substrate comprising a cell array region and a boundary region;
a first recess region disposed at an upper portion of the substrate in the cell array region;
a first bit line extending onto the boundary region and crossing the first recess region;
a bit line contact disposed in the first recess region and contacting the first bit line;
a second bit line spaced apart from the first recess region and adjacent to the first bit line, the second bit line crossing the cell array region and the boundary region;
a bit line spacer covering a side of the bit line contact and extending along a bottom of the first recess region to cover an inner wall of the first recess region;
a cell buried insulation pattern interposed between a first portion of the bit line spacer at the side of the bit line contact and a second portion of the bit line spacer opposite the first portion and disposed on an inner wall of the first recess region;
a boundary buried insulation pattern covering sidewalls of the first bit line and the second bit line in the boundary region, comprising a second recess region, and comprising a same material as the cell buried insulation pattern, and
a residual spacer pattern filling the second recess region, wherein a top surface of the residual spacer pattern is coplanar with a top surface of the boundary buried insulation pattern.

19. The semiconductor memory device of claim 18, further comprising:
a cell insulation liner interposed between the cell buried insulation pattern and an inner wall of the first recess region and between the cell buried insulation pattern and a lower side wall of the first bit line; and
a boundary insulation liner interposed between the boundary buried insulation pattern and the first bit line,
wherein the cell insulation liner comprises a same material as the boundary insulation liner, and
the cell insulation liner has an upper end positioned equal to or higher than an upper end of the cell buried insulation pattern.

20. The semiconductor memory device of claim 19, wherein the boundary insulation liner has an upper end lower than a top surface of the boundary buried insulation pattern.

* * * * *